(12) United States Patent
Lee et al.

(10) Patent No.: US 11,985,889 B2
(45) Date of Patent: May 14, 2024

(54) ORGANOMETALLIC COMPOUND AND ORGANIC LIGHT-EMITTING DEVICE INCLUDING THE SAME

(71) Applicant: Samsung Display Co., Ltd., Yongin-si (KR)

(72) Inventors: Hyunjung Lee, Yongin-si (KR); Soobyung Ko, Yongin-si (KR); Sungbum Kim, Yongin-si (KR); Eunsoo Ahn, Yongin-si (KR); Eunyoung Lee, Yongin-si (KR); Jaesung Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 605 days.

(21) Appl. No.: 17/229,766

(22) Filed: Apr. 13, 2021

(65) Prior Publication Data

US 2021/0336157 A1    Oct. 28, 2021

(30) Foreign Application Priority Data

Apr. 24, 2020  (KR) .................. 10-2020-0050349

(51) Int. Cl.
*H10K 85/30*      (2023.01)
*H10K 50/11*      (2023.01)
(Continued)

(52) U.S. Cl.
CPC ......... *H10K 85/346* (2023.02); *H10K 85/341* (2023.02); *H10K 85/342* (2023.02);
(Continued)

(58) Field of Classification Search
CPC .. H10K 85/341; H10K 85/342; H10K 85/344; H10K 85/346; H10K 85/348
See application file for complete search history.

(56) References Cited

U.S. PATENT DOCUMENTS 9,306,179 B2    4/2016  Tsai et al.
9,318,725 B2    4/2016  Li
(Continued)

FOREIGN PATENT DOCUMENTS

CN    109748937 A      5/2019
CN    112125932 A  *  12/2020
(Continued)

*Primary Examiner* — Amanda C. Walke
(74) *Attorney, Agent, or Firm* — Lewis Roca Rothgerber Christie LLP

(57) ABSTRACT

An organometallic compound and an organic light-emitting device including the same. The organometallic compound is represented by Formula 1. In Formula 1, the substituents are the same as described in the detailed description of the current disclosure.

20 Claims, 4 Drawing Sheets

Formula 1

(51) Int. Cl.
*H10K 50/15* (2023.01)
*H10K 50/16* (2023.01)
*H10K 50/17* (2023.01)
*H10K 50/18* (2023.01)
*H10K 101/10* (2023.01)
*H10K 101/30* (2023.01)

(52) U.S. Cl.
CPC ......... *H10K 85/344* (2023.02); *H10K 85/348* (2023.02); *H10K 50/11* (2023.02); *H10K 50/15* (2023.02); *H10K 50/16* (2023.02); *H10K 50/171* (2023.02); *H10K 50/18* (2023.02); *H10K 2101/10* (2023.02); *H10K 2101/30* (2023.02)

(56) References Cited

U.S. PATENT DOCUMENTS

| | | |
|---|---|---|
| 9,461,254 B2 | 10/2016 | Tsai et al. |
| 10,211,414 B2 | 2/2019 | Li et al. |
| 2013/0048963 A1 | 2/2013 | Beers et al. |
| 2014/0364605 A1 | 12/2014 | Li et al. |
| 2018/0375036 A1* | 12/2018 | Chen ........................ C09K 11/06 |
| 2019/0337974 A1* | 11/2019 | Ji ........................ H10K 85/6576 |
| 2020/0083459 A1* | 3/2020 | Ji ........................ H10K 85/6572 |
| 2020/0280003 A1* | 9/2020 | Min ........................ C07F 15/0086 |
| 2020/0295281 A1* | 9/2020 | Chen ........................ C09K 11/06 |
| 2020/0331941 A1* | 10/2020 | Ji ........................ H10K 85/622 |
| 2022/0181562 A1* | 6/2022 | Li ........................ H10K 85/361 |

FOREIGN PATENT DOCUMENTS

| | | | | |
|---|---|---|---|---|
| CN | 115448932 A | * | 12/2022 | |
| EP | 3715353 A1 | * | 9/2020 | .......... C07F 15/0086 |
| JP | 2009-267244 A | | 11/2009 | |
| JP | 6119375 B2 | * | 4/2017 | |
| KR | 10-2014-0144152 A | | 12/2014 | |
| KR | 10-2015-0053709 A | | 5/2015 | |
| WO | WO-2009046266 A1 | * | 4/2009 | .......... C07F 15/002 |
| WO | WO 2016/088354 A1 | | 6/2016 | |

* cited by examiner

| |
|---|
| 190 |
| 150 |
| 110 |

| |
|---|
| 190 |
| 150 |
| 110 |
| 210 |

| 220 |
|---|
| 190 |
| 150 |
| 110 |

| |
|---|
| 220 |
| 190 |
| 150 |
| 110 |
| 210 |

ORGANOMETALLIC COMPOUND AND ORGANIC LIGHT-EMITTING DEVICE INCLUDING THE SAME

CROSS-REFERENCE TO RELATED APPLICATION

This application claims priority to and the benefit of Korean Patent Application No. 10-2020-0050349, filed on Apr. 24, 2020, in the Korean Intellectual Property Office, the disclosure of which is incorporated herein in its entirety by reference.

BACKGROUND

1. Field

One or more embodiments relate to an organometallic compound and an organic light-emitting device including the same.

2. Description of Related Art

Organic light-emitting devices (OLEDs) are self-emission devices that produce full-color images, and also have relatively wide viewing angles, high contrast ratios, short response times, and/or excellent characteristics in terms of brightness, driving voltage, and/or response speed, compared to suitable devices in the related art.

An example of an organic light-emitting device may include a first electrode disposed on a substrate, and a hole transport region, an emission layer, an electron transport region, and a second electrode, which are sequentially disposed on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. These excitons transit from an excited state to a ground state, thereby generating light.

SUMMARY

Aspects according to one or more embodiments are directed toward a novel organometallic compound and an organic light-emitting device including the same.

Additional aspects will be set forth in part in the description which follows and, in part, will be apparent from the description, or may be learned by practice of the presented embodiments of the disclosure.

According to an embodiment of the present disclosure, an organometallic compound is represented by Formula 1.

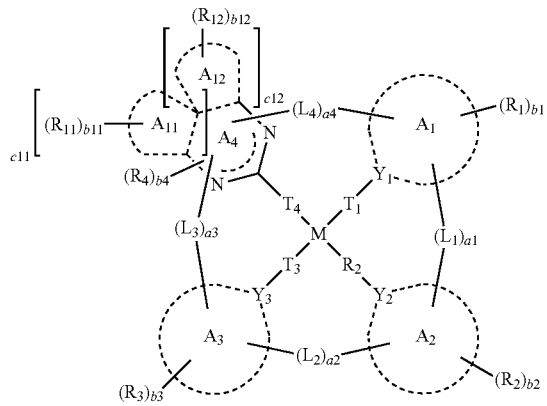

Formula 1

In Formula 1,
M is selected from platinum (Pt), palladium (Pd), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), and thulium (Tm), $Y_1$ to $Y_3$ are each independently N or C, $T_1$ to $T_4$ are each independently a chemical bond, O, S, B(R'), N(R'), P(R'), C(R')(R''), Si(R')(R''), Ge(R')(R''), C(=O), B(R')(R''), N(R')(R''), or P(R')(R''), wherein when $T_1$ is a chemical bond, $Y_1$ and M are directly bonded, when $T_2$ is a chemical bond, $Y_2$ and M are directly bonded, when $T_3$ is a chemical bond, $Y_3$ and M are directly bonded, and when $T_4$ is a chemical bond, $A_4$ and M are directly bonded, from among a bond between M and $Y_1$ or $T_1$ (i.e., a bond between $Y_1$ and M or a bond between $T_1$ and M), a bond between M and $Y_2$ or $T_2$ (i.e., a bond between $Y_2$ and M or a bond between $T_2$ and M), a bond between M and $Y_3$ or $T_3$ (i.e., a bond between $Y_3$ and M or a bond between $T_3$ and M), and a bond between M and $A_4$ or $T_4$ (i.e., a bond between the carbon atom of $A_4$ and M or a bond between $T_4$ and M), two bonds are coordinate bonds, and the other two bonds are covalent bonds, $A_1$ to $A_3$ and $A_{11}$ to $A_{12}$ are each independently selected from a $C_5$-$C_{60}$ carbocyclic group and a $C_1$-$C_{60}$ heterocyclic group, c11 is 0 or 1, and when c11 is 0, $A_{11}$ is absent, i.e., the organometallic compound represented by Formula 1 does not include $A_{11}$, c12 is 0 or 1, and when c12 is 0, $A_{12}$ is absent, i.e., the organometallic compound represented by Formula 1 does not include $A_{12}$, $L_1$ to $L_4$ are each independently selected from a single bond, a double bond, *—N($R_5$)—*', *—B($R_5$)—*', *—P($R_5$)—*', *—C($R_5$)($R_6$)—*', *—Si($R_5$)($R_6$)—*', *—Ge($R_5$)($R_6$)—*', *—Se—*', *—C(=O)—*', *—S(=O)—*', *—S(=O)$_2$—*', *—C($R_5$)=*', *=C($R_5$)—*', *—C($R_5$)=C($R_6$)—*', *—C(=S)—*', and *—C≡C—*', a1 to a4 are each independently an integer from 0 to 3, wherein when a1 is 0, $A_1$ and $A_2$ are not linked to each other, when a2 is 0, $A_2$ and $A_3$ are not linked to each other, when a3 is 0, $A_3$ and $A_4$ are not linked to each other, and when a4 is 0, $A_4$ and $A_1$ are not linked to each other, R', R'', $R_1$ to $R_6$, $R_{11}$, and $R_{12}$ are each independently selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), —P(=S)($Q_1$)($Q_2$), =O, =S, =N($Q_1$), and =C($Q_1$)($Q_2$), b1 to b3, b11, and b12 are each independently an integer from 0 to 20, b4 is an integer from 0 to 7, from among R', R'', $R_1$(s) in the number of b1, $R_2$(s) in the number of b2, $R_3$(s) in the number of b3, $R_4$(s) in the number of b4, $R_5$, $R_6$, $R_{11}$(s) in the number of b11, and $R_{12}$(s) in the number of b12, neighboring groups may each optionally be linked to each other to form a substituted or unsubstituted $C_5$-$C_{60}$ carbocyclic group or a substituted or unsubstituted $C_1$-$C_{60}$ heterocyclic group, and *' each indicate a binding site to a neighboring atom, and at least one substituent of the substituted $C_5$-$C_{60}$ carbocyclic group, the substituted $C_1$-$C_{60}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group is selected from:

deuterium, —F, —Br, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Br, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), and —P(=O)($Q_{21}$)($Q_{22}$); and —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q$ 32), wherein $Q_1$ to $Q_3$, $Q_{11}$ to $Q_{13}$, $Q_{21}$ to $Q_{23}$, and $Q_{31}$ to $Q_{33}$ are each independently selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a $C_1$-$C_{60}$ alkyl group substituted with at least one selected from deuterium, —F, and a cyano group, a $C_6$-$C_{60}$ aryl group substituted with at least one selected from deuterium, —F, and a cyano group, a biphenyl group, and a terphenyl group.

According to another embodiment of the present disclosure, an organic light-emitting device includes a first electrode, a second electrode, an organic layer between the first electrode and the second electrode, the organic layer including an emission layer, and at least one organometallic compound represented by Formula 1.

BRIEF DESCRIPTION OF THE DRAWINGS

The above and other aspects, features, and enhancements of certain embodiments of the disclosure will be more apparent from the following description taken in conjunction with the accompanying drawings, in which FIGS. 1 to 4 are each a schematic view of a structure of an organic light-emitting device according to a respective embodiment.

DETAILED DESCRIPTION

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

According to an embodiment of the present disclosure, an organometallic compound is represented by Formula 1 below:

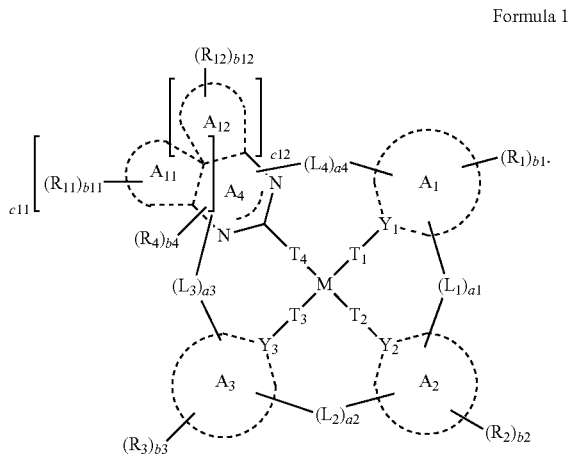

Formula 1

An energy level ($E_{3MC}$) of a triplet metal-centered ($^3$MC) state of the organometallic compound may be greater than an energy level ($E_{3MLCT}$) of a triplet metal-to-ligand charge transfer ($^3$MLCT) state of the organometallic compound.

In one or more embodiments, the energy level ($E_{3MC}$) of a triplet metal-centered ($^3$MC) state of the organometallic compound may be about 0.26 kcal/mol or more. In one or more embodiments, the $E_{3MC}$ may be about 1.0 kcal/mol or less, for example, about 0.26 kcal/mol to about 0.8 kcal/mol.

When the organometallic compound satisfies the range of the $E_{3MC}$, a probability that the organometallic compound transitions from the $^3$MLCT state to the $^3$MC state, which is a non-emission state, decreases. Therefore, the stability of the organometallic compound in an excited state may be excellent, and the efficiency and lifespan of the organic light-emitting device including the organometallic compound may increase.

In Formula 1, M is selected from platinum (Pt), palladium (Pd), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), and thulium (Tm).

In one embodiment, M may be selected from Pt, Pd, Cu, Ag, Au, Rh, Ir, Ru, and Os.

In one or more embodiments, M may be Pt, but embodiments of the present disclosure are not limited thereto.

In Formula 1, $Y_1$ to $Y_3$ are each independently N or C, $T_1$ to $T_4$ are each independently a chemical bond, O, S, B(R'), N(R'), P(R'), C(R')(R''), Si(R')(R''), Ge(R')(R''), C(=O), B(R')(R''), N(R')(R''), or P(R')(R''), wherein when $T_1$ is a chemical bond, $Y_1$ and M are directly bonded, when $T_2$ is a chemical bond, $Y_2$ and M are directly bonded, when $T_3$ is a chemical bond, $Y_3$ and M are directly bonded, and when $T_4$ is a chemical bond, $A_4$ and M are directly bonded, and From among a bond between M and $Y_1$ or $T_1$ (i.e., a bond between $Y_1$ and M or a bond between $T_1$ and M), a bond between M and $Y_2$ or $T_2$ (i.e., a bond between $Y_2$ and M or a bond between $T_2$ and M), a bond between M and $Y_3$ or $T_3$ (i.e., a bond between $Y_3$ and M or a bond between $T_3$ and M), and a bond between ring M and $A_4$ or $T_4$ (i.e., a bond between the carbon atom of $A_4$ and M or a bond between $T_4$ and M), two bonds are coordinate bonds, and the other two bonds are covalent bonds.

In one embodiment, $T_1$ to $T_4$ may be chemical bonds, at least one of a bond between $Y_1$ and M and a bond between $Y_2$ and M may be a coordinate bond, $Y_1$ may be N, and $Y_2$ may be C.

In one or more embodiments, $Y_1$ may be N, and $Y_2$ and $Y_3$ may each be C, but embodiments of the present disclosure are not limited thereto.

In Formula 1, $A_1$ to $A_3$ and $A_{11}$ to $A_{12}$ are each independently selected from a $C_5$-$C_{60}$ carbocyclic group and a $C_1$-$C_{60}$ heterocyclic group.

In one embodiment, $A_1$ to $A_3$ and $A_{11}$ to $A_{12}$ may each independently be selected from a benzene group, a naphthalene group, an anthracene group, a phenanthrene group, a triphenylene group, a pyrene group, a chrysene group, a cyclopentane group, a cyclopentadiene group, a cyclohexane group, a cyclohexene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an indenopyridine group, an indolopyridine group, a benzofuropyridine group, a benzothienopyridine group, a benzosilolopyridine group, an indenopyrimidine group, an indolopyrimidine group, a benzofuropyrimidine group, a benzothienopyrimidine group, a benzosilolopyrimidine group, a dihydropyridine group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a 2,3-dihydroimidazole group, a triazole group, a 1,2,4-triazole group, a tetrazole group, a 2,3-dihydrotriazole group, an azasilole group, a diazasilole group, a triazasilole group, an oxazole group, an isoxazole group, a thiazole group, an isothiazole group, an oxadiazole group, a thiadiazole group, a benzopyrazole group, a benzimidazole group, a 2,3-dihydrobenzimidazole group, an imidazopyridine group, a 2,3-dihydroimidazopyridine group, an imidazopyrimidine group, a 2,3-dihydroimidazopyrimidine group, an imidazopyrazine group, a 2,3-dihydroimidazopyrazine group, a benzoxazole group, a benzothiazole group, a benzoxadiazole group, a benzothiadiazole group, a 5,6,7,8-tetrahydroisoquinoline group, and a 5,6,7,8-tetrahydroquinoline group.

In one embodiment, i) $A_1$ may be selected from a pyridine group, a pyrimidine group, a pyrazine group, a pyridazine group, and a triazine group, ii) $A_2$ may be selected from an indole group, a carbazole group, an indolopyridine group, and an indolopyrimidine group, iii) $A_3$ may be selected from a benzene group, a naphthalene group, an anthracene group, and a phenanthrene group, or any combination of i), ii), and iii) may be satisfied.

In one or more embodiments, $A_1$ may be selected from a pyridine group, a pyrimidine group, a pyrazine group, a pyridazine group, and a triazine group, and $A_2$ may be selected from an indole group, a carbazole group, an indolopyridine group, and an indolopyrimidine group. In one or more embodiments, $A_1$ may be selected from a pyridine group, a pyrimidine group, a pyrazine group, a pyridazine group, and a triazine group, and $A_3$ may be selected from a benzene group, a naphthalene group, an anthracene group, and a phenanthrene group. In one or more embodiments, $A_2$ may be selected from an indole group, a carbazole group, an indolopyridine group, and an indolopyrimidine group, and $A_3$ may be selected from a benzene group, a naphthalene group, an anthracene group, and a phenanthrene group. In one or more embodiments, $A_1$ may be selected from a pyridine group, a pyrimidine group, a pyrazine group, a pyridazine group, and a triazine group, $A_2$ may be selected from an indole group, a carbazole group, an indolopyridine group, and an indolopyrimidine group, and $A_3$ may be selected from a benzene group, a naphthalene group, an anthracene group, and a phenanthrene group.

In one embodiment, ia) $A_1$ may be a group represented by any one of Formulae 2A-1 to 2A-5, iia) $A_2$ may be a group represented by any one of Formulae 2B-1 to 2B-3, iiia) $A_3$ may be a group represented by Formula 2C-1, or any combination of ia), iia), and iiia) may be satisfied:

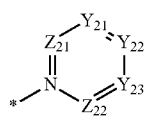

2A-1

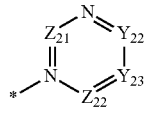

2A-2

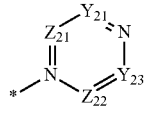

2A-3

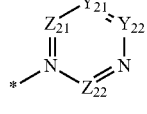

2A-4

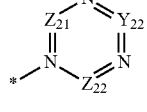

2A-5

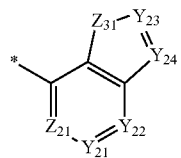

2B-1

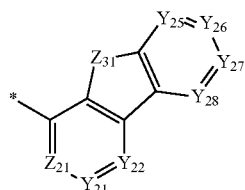

2B-2

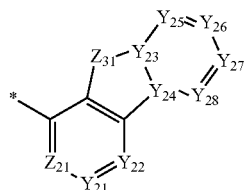

2B-3

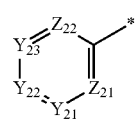

2C-1

In Formulae 2A-1 to 2A-5, Formulae 2B-1 to 2B-3, and Formula 2C-1, $Y_{21}$ is N or $C(R_{11a})$, $Y_{22}$ is N or $C(R_{12a})$, $Y_{23}$ is N or $C(R_{13a})$, $Y_{24}$ is N or $C(R_{14a})$, $Y_{25}$ is N or $C(R_{15a})$, $Y_{26}$ is N or $C(R_{16a})$, $Y_{27}$ is N or $C(R_{17a})$, and $Y_{28}$ is N or $C(R_{18a})$, $Z_{21}$ is $C(R_{21a})$, or N, and $Z_{22}$ is $C(R_{22a})$, or N, $Z_{31}$ is *'—N or $N(R_{31a})$, $R_{11a}$ to $R_{18a}$, $R_{21a}$ to $R_{22a}$, and $R_{31a}$ are each independently the same as described in connection with R', R", and $R_1$ to $R_6$ described above, e.g., $R_{11a}$ to $R_{18a}$, $R_{21a}$ to $R_{22a}$, and $R_{31a}$ may each independently be the same as described in connection with $R_1$ described above, and indicates a binding site to neighboring $T_1$, $T_2$, or $T_3$, and

*' indicates a binding site to neighboring $L_1$, $L_2$, $L_3$, or $L_4$.

In one or more embodiments, in Formulae 2A-1 to 2A-5 and 2C-1, $Y_{22}$ may be $C(R_{12a})$, and $R_{12a}$ may not be hydrogen.

In one or more embodiments, $R_{12a}$ may be a $C_1$-$C_{20}$ alkyl group or a $C_1$-$C_{20}$ alkyl group substituted with at least one $C_1$-$C_{20}$ alkyl group.

In one or more embodiments, in Formulae 2A-1 to 2A-5, $Y_{21}$ may be $C(R_{11a})$, and $Y_{23}$ may be $C(R_{13a})$. In one or more embodiments, $R_{11a}$ and $R_{13a}$ may each be hydrogen.

In one or more embodiments, in Formulae 2A-1 to 2A-5, $Z_{21}$ may be $C(R_{21a})$, and $Z_{22}$ may be *'—C. In one or more embodiments, $R_{21a}$ may be hydrogen.

In one or more embodiments, in Formulae 2B-1 to 2B-3, $Y_{21}$ may be $C(R_{11a})$, $Y_{22}$ may be $C(R_{12a})$, $Y_{23}$ may be $C(R_{13a})$, $Y_{24}$ may be $C(R_{14a})$, $Y_{25}$ may be $C(R_{15a})$, $Y_{26}$ may be $C(R_{16a})$, $Y_{27}$ may be $C(R_{17a})$, and $Y_{28}$ may be $C(R_{18a})$. In one or more embodiments, $R_{11a}$ to $R_{18a}$ may be hydrogen.

In one or more embodiments, in Formulae 2B-1 to 2B-3, $Z_{21}$ may be *'—C, and $Z_{31}$ may be *'—N.

In one or more embodiments, in Formula 2C-1, $Y_{21}$ may be $C(R_{11a})$, and $Y_{23}$ may be $C(R_{13a})$. In one or more embodiments, $R_{11a}$ and $R_{13a}$ may each be hydrogen.

In one or more embodiments, in Formula 2C-1, $Z_{21}$ may be *'—C, and $Z_{22}$ may be *'—C.

In one or more embodiments, $A_1$ may be a group represented by any one of Formulae 2A-1 to 2A-5, and $A_2$ may be a group represented by any one of Formulae 2B-1 to 2B-3. In one or more embodiments, $A_1$ may be a group represented by any one of Formulae 2A-1 to 2A-5, and $A_3$ may be a group represented by Formula 2C-1. In one or more embodiments, $A_2$ may be a group represented by any one of Formulae 2B-1 to 2B-3, and $A_3$ may be a group represented by Formula 2C-1. In one or more embodiments, $A_1$ may be a group represented by any one of Formulae 2A-1 to 2A-5, $A_2$ may be a group represented by any one of Formulae 2B-1 to 2B-3, and $A_3$ may be a group represented by Formula 2C-1.

In one embodiment, the sum of c11 and c12 may be 1 or 2.

In one or more embodiments, c11 may be 1.

In Formula 1, $L_1$ to $L_4$ are each independently selected from a single bond, a double bond, *—N($R_5$)—*', *—B($R_5$)—*', *—P($R_5$)—*', *—C($R_5$)($R_6$)—*', *—Si($R_5$)($R_6$)—*', *—Ge($R_5$)($R_6$)—*', *—S—*', *—Se—*', *—C(=O)—*', *—S(=O)—*', *—S(=O)$_2$—*', *—C($R_5$)=*', *=C($R_5$)—*', *—C($R_5$)=C($R_6$)—*', *—C(=S)—*', and *—C≡C—*', and * and *' each indicate a binding site to a neighboring atom.

In one embodiment, $L_1$ to $L_4$ may each independently be a single bond or *—O—*'.

In Formula 1, a1 to a4 are each independently an integer from 0 to 3, wherein when a1 is 0, $A_1$ and $A_2$ are not linked to each other, when a2 is 0, $A_2$ and $A_3$ are not linked to each other, when a3 is 0, $A_3$ and $A_4$ are not linked to each other, and when a4 is 0, $A_4$ and $A_1$ are not linked to each other.

In one embodiment, a1 to a3 may each be 1, a4 may be 0, $L_1$ and $L_3$ may each be a single bond, and $L_2$ may be *—O—*'.

In Formula 1, R', R", $R_1$ to $R_6$, $R_{11}$, and $R_{12}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —B($Q_1$)($Q_2$), —N($Q_1$)($Q_2$), —P($Q_1$)($Q_2$), —C(=O)($Q_1$), —S(=O)(Qi), —S(=O)$_2$($Q_1$), —P(=O)($Q_1$)($Q_2$), and —P(=S)($Q_1$)($Q_2$), b1 to b3, b11, and b12 may each independently be an integer from 0 to 20, b4 may be an integer from 0 to 7, and from among R', R", $R_1$(s) in the number of b1, $R_2$(s) in the number of b2, $R_3$(s) in the number of b3, $R_4$(s) in the number of b4, $R_5$, $R_6$, $R_{11}$(s) in the number of b11, and $R_{12}$(s) in the number of b12, neighboring groups may each optionally be linked to each other to form a substituted or unsubstituted $C_5$-$C_{60}$ carbocyclic group or a substituted or unsubstituted $C_1$-$C_{60}$ heterocyclic group.

In one embodiment, R', R", $R_1$ to $R_6$, $R_{11}$, and $R_{12}$ may each independently be selected from: hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, and a $C_1$-$C_{20}$ alkoxy group;

a cyclopentyl group, a cyclohexyl group, a phenyl group, a naphthyl group, a pyridinyl group, a pyrimidinyl group, a pyrazinyl group, a pyridazinyl group, a pyrrolyl group, an indolyl group, an isoindolyl group, an indazolyl group, a quinolinyl group, an isoquinolinyl group, a quinoxalinyl group, a quinazolinyl group, a cinnolinyl group, and a triazinyl group;

a cyclopentyl group, a cyclohexyl group, a phenyl group, a naphthyl group, a pyridinyl group, a pyrimidinyl group, a pyrazinyl group, a pyridazinyl group, an indolyl group, an isoindolyl group, an indazolyl group, a quinolinyl group, an isoquinolinyl group, a quinoxalinyl group, a quinazolinyl group, a cinnolinyl group, and a triazinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a phenyl group, a naphthyl group, a pyridinyl group, a pyrimidinyl group, a pyrazinyl group, a pyridazinyl group, an indolyl group, an isoindolyl group, an indazolyl group, a quinolinyl group, an isoquinolinyl group, a quinoxalinyl group, a quinazolinyl group, a cinnolinyl group, a triazinyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$);

a cyclopentyl group, a cyclohexyl group, a phenyl group, a naphthyl group, a pyridinyl group, a pyrimidinyl group, a pyrazinyl group, a pyridazinyl group, an indolyl group, an isoindolyl group, an indazolyl group, a quinolinyl group, an isoquinolinyl group, a quinoxalinyl group, a quinazolinyl group, a cinnolinyl group, and a triazinyl group, each substituted with at least one selected from a $C_1$-$C_{20}$ alkyl group, a $C_1$-$C_{20}$ alkoxy group, a cyclopentyl group, a cyclohexyl group, a phenyl group, a naphthyl group, a pyridinyl group, a pyrimidinyl group, a pyrazinyl group, a pyridazinyl group, an indolyl group, an isoindolyl group, an indazolyl group, a quinolinyl group, an isoquinolinyl group, a quinoxalinyl group, a quinazolinyl group, a cinnolinyl group, and a triazinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a phenyl group, a naphthyl group, a pyridinyl group, a pyrimidinyl group, a pyrazinyl group, a pyridazinyl group, an indolyl group, an isoindolyl group, an indazolyl group, a quinolinyl group, an isoquinolinyl group, a quinoxalinyl group, a quinazolinyl group, a cinnolinyl group, a triazinyl group, $-Si(Q_{31})(Q_{32})(Q_{33})$, $-N(Q_{31})(Q_{32})$, $-B(Q_{31})(Q_{32})$, $-C(=O)(Q_{31})$, $-S(=O)_2(Q_{31})$, and $-P(=O)(Q_{31})(Q_{32})$; and $-Si(Q_1)(Q_2)(Q_3)$, $-N(Q_1)(Q_2)$, $-B(Q_1)(Q_2)$, $-C(=O)(Q_1)$, $-S(=O)_2(Q_1)$, $-P(=O)(Q_1)(Q_2)$, $-P(=S)(Q_1)(Q_2)$, $=O$, $=S$, $=N(Q_1)$, and $=C(Q_1)(Q_2)$, wherein $Q_1$ to $Q_3$ and $Q_{31}$ to $Q_{33}$ may each independently be selected from hydrogen, deuterium, $-F$, $-Cl$, $-Br$, $-I$, a cyano group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{20}$ aryl group, a $C_1$-$C_{20}$ heteroaryl group, a monovalent non-aromatic condensed polycyclic group, and a monovalent non-aromatic condensed heteropolycyclic group.

In one embodiment, the organometallic compound represented by Formula 1 may be an organometallic compound represented by one selected from Formulae 1-1 to 1-10:

Formula 1-1

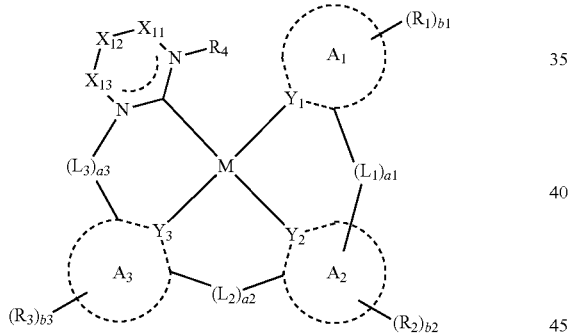

Formula 1-2

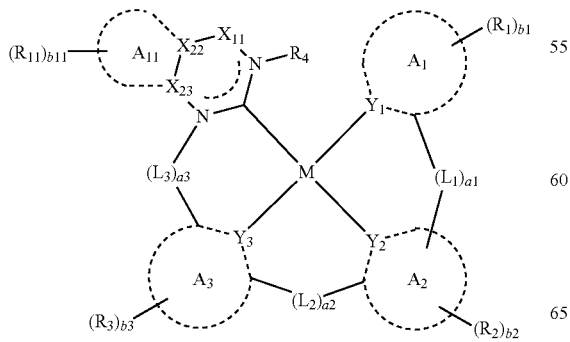

Formula 1-3

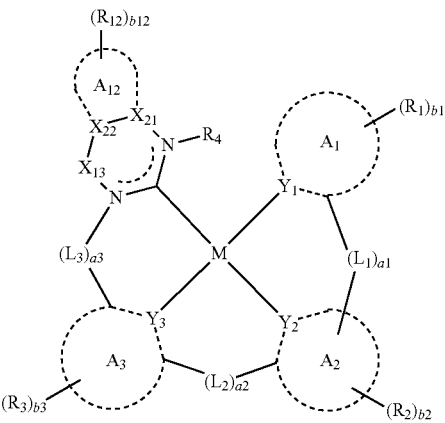

Formula 1-4

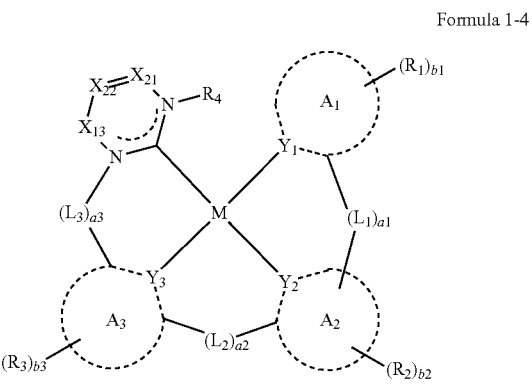

Formula 1-5

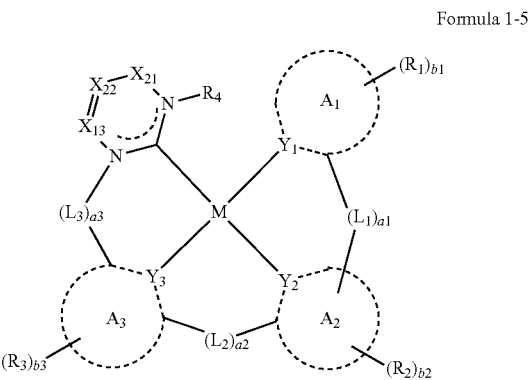

Formula 1-6

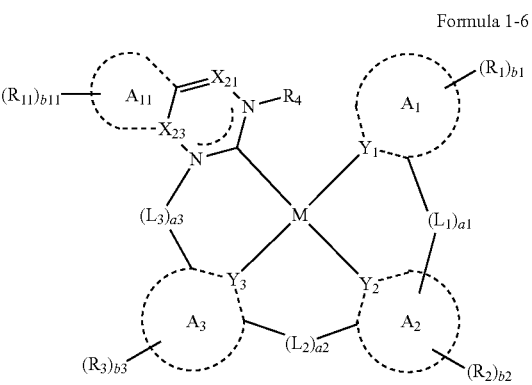

Formula 1-7

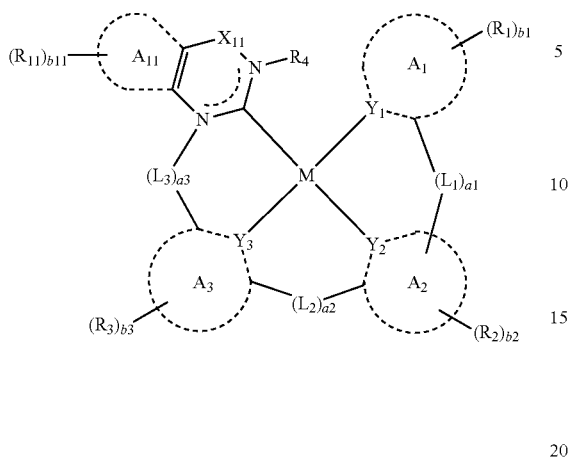

Formula 1-8

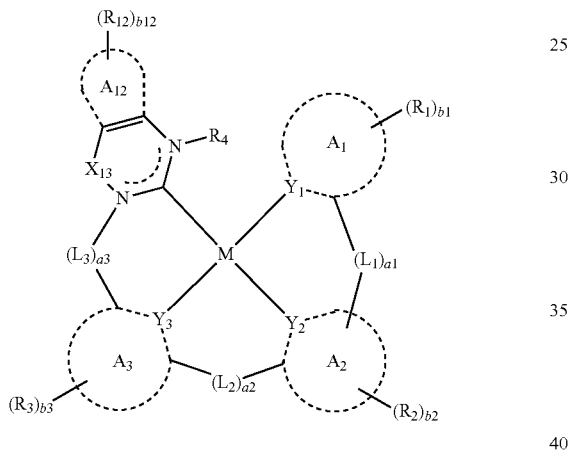

Formula 1-9

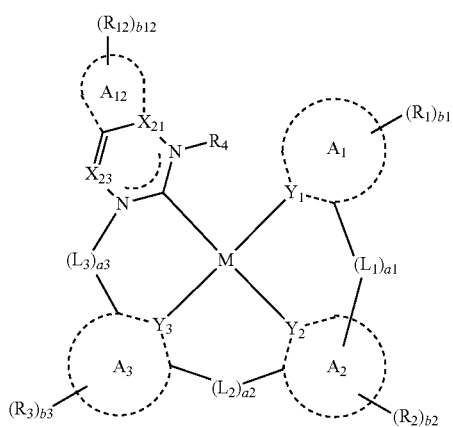

Formula 1-10

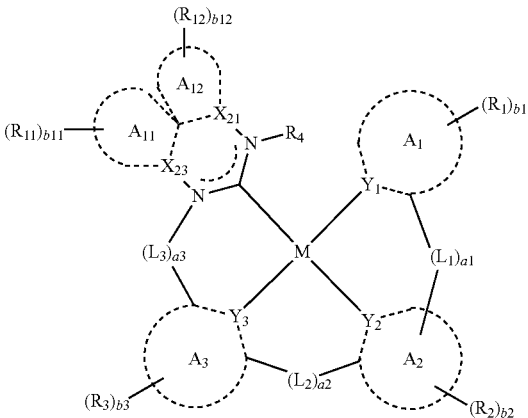

In Formulae 1-1 to 1-10,

M, $A_1$ to $A_3$, $A_{11}$ to $A_{12}$, $Y_1$ to $Y_3$, $L_1$ to $L_3$, a1 to a3, $R_1$ to $R_4$, $R_{11}$, and $R_{12}$, b1 to b3, b11, and b12 are each independently the same as respectively described above, $X_{11}$ to $X_{13}$ are each independently selected from O, S, $N(R_{21})$, $C(R_{21})(R_{22})$, C(=O), C(=S), C(=NR$_{21}$), and C(=C(R$_{21}$)(R$_{22}$)), $X_{21}$ to $X_{23}$ are each independently N or $C(R_{21})$, and $R_{21}$ and $R_{22}$ are each independently the same as described in connection with R', R", $R_1$ to $R_6$, $R_{11}$, and $R_{12}$ described above, e.g., $R_{21}$ and $R_{22}$ may each independently be the same as described in connection with $R_1$ described above.

In one or more embodiments, in Formula 1-7, $X_{11}$ may be $C(R_{21})(R_{22})$ or C(=O). In one or more embodiments, $R_{21}$ and $R_{22}$ may each independently be selected from hydrogen, a $C_1$-$C_{20}$ alkyl group, and a $C_6$-$C_{20}$ aryl group.

In one or more embodiments, in Formula 1-10, $X_{21}$ and $X_{23}$ may each be $C(R_{21})$, and $A_{11}$ and $A_{12}$ may each be a cyclopentane group.

In one or more embodiments, $R_4$ may be a $C_1$-$C_{20}$ alkyl group or a $C_6$-$C_{20}$ aryl group, or a $C_1$-$C_{20}$ alkyl group or a $C_6$-$C_{20}$ aryl group, each substituted with at least one selected from a $C_1$-$C_{20}$ alkyl group substituted with at least one deuterium and a $C_6$-$C_{20}$ aryl group substituted with at least one deuterium.

In one embodiment, the organometallic compound represented by Formula 1 may be an organometallic compound represented by Formula 1A:

Formula 1A

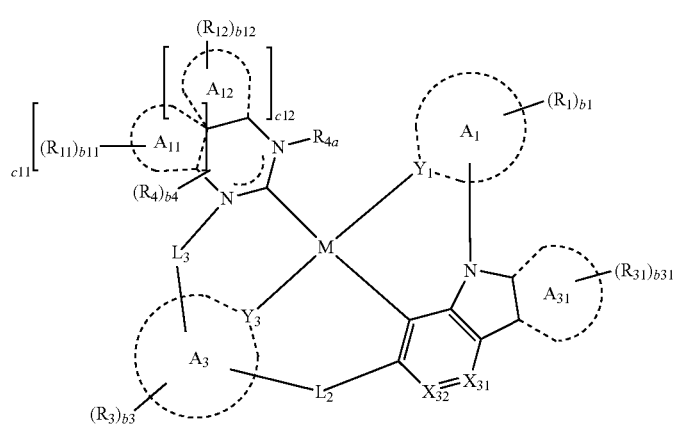

In Formula 1A,

M, $A_1$, $A_3$, $A_{11}$ to $A_{12}$, $Y_1$, $Y_3$, $L_2$ to $L_3$, $R_1$, $R_3$, $R_4$, $R_{11}$, $R_{12}$, b1, b3, b4, b11, b12, c11, and c12 are each independently the same as respectively described above, $X_{31}$ to $X_{32}$ are each independently N or $C(R_{32})$, $A_{31}$ is the same as described in connection with $A_1$ to $A_3$ and $A_{11}$ to $A_{12}$, e.g., $A_{31}$ may be the same as described in connection with $A_1$, b31 is the same as described in connection with b2, and $R_{4a}$, $R_{31}$, and $R_{32}$ are each independently the same as described in connection with R', R", $R_1$ to $R_6$, $R_{11}$, and $R_{12}$, e.g., $R_{4a}$, $R_{31}$, and $R_{32}$ may be each independently the same as described in connection with In one embodiment, the organometallic compound represented by Formula 1 may be selected from Compounds 1 to 12, but embodiments of the present disclosure are not limited thereto:

1

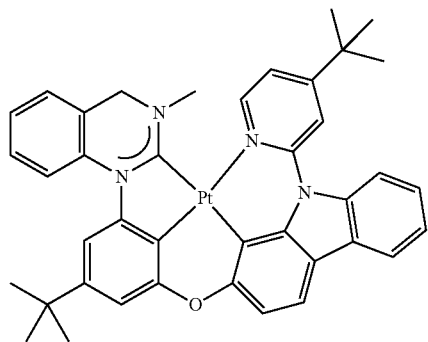

2

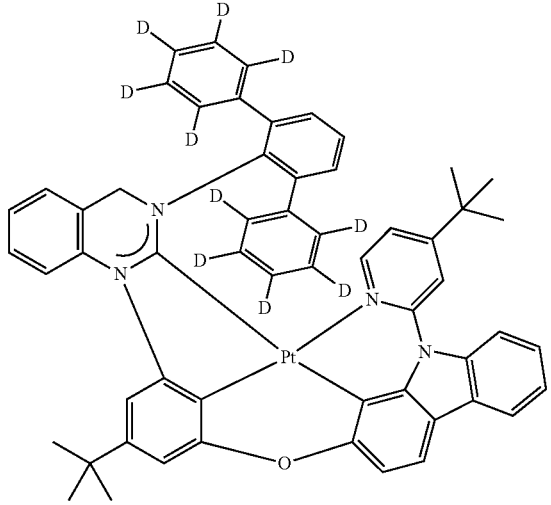

3

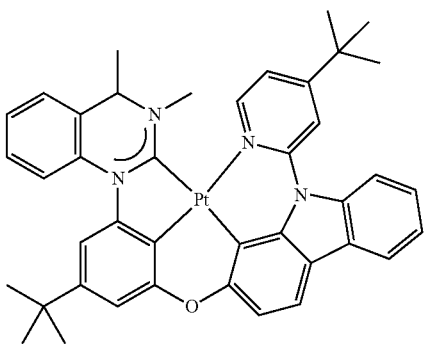

17
-continued
4
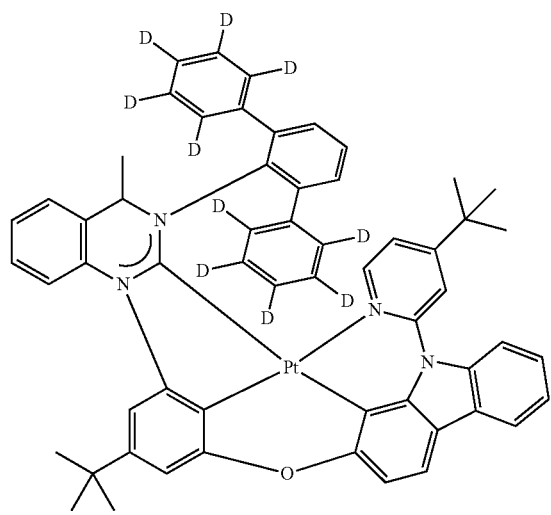
5
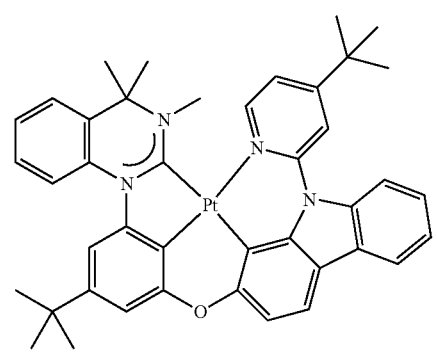
6
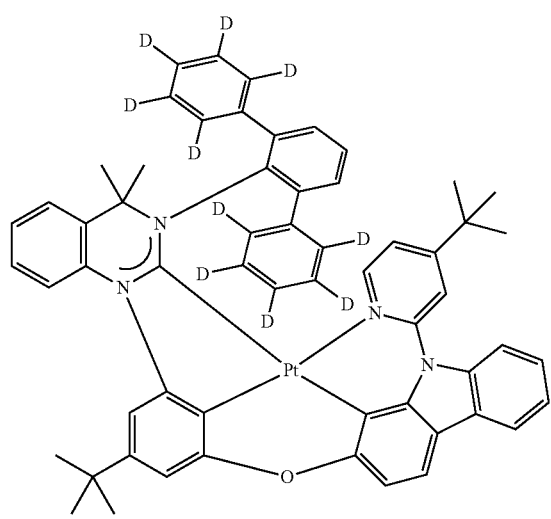
18
-continued
7
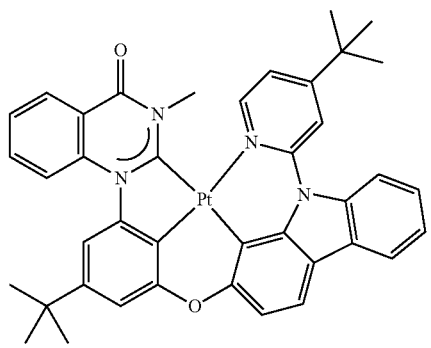
8
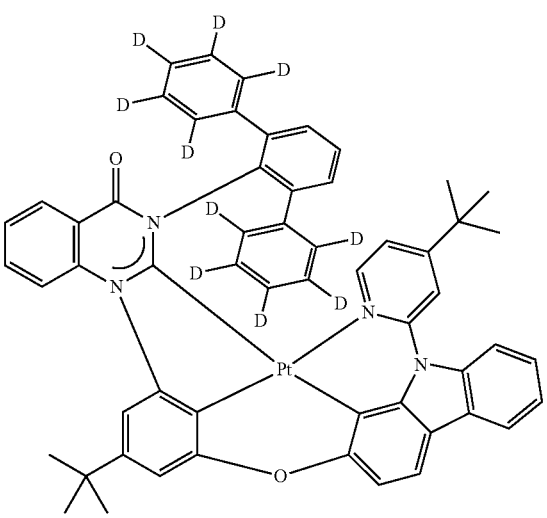
9
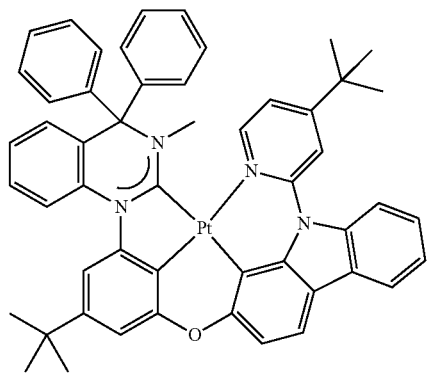

-continued

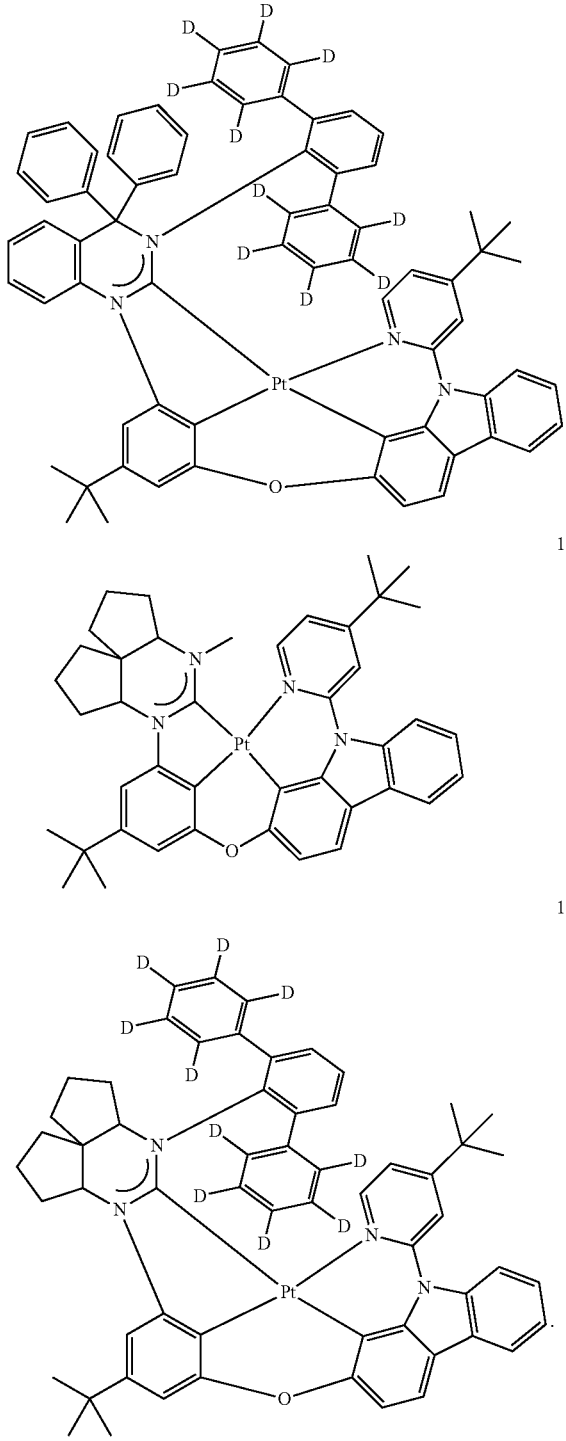

Because the organometallic compound represented by Formula 1 includes six forming atoms of a carbene ligand that is bonded with a central metal (M in Formula 1), a binding force between the central metal and the carbene ligand may be strengthened such that rigidity may be improved. Accordingly, lifespan characteristics of an organic light-emitting device including the organometallic compound may be improved.

In detail, because the organometallic compound represented by Formula 1 includes the carbene ligand having a condensed cyclic structure, stability of a device including the organometallic compound may be improved due to a principle in which MLCT increases as sigma binding force increases.

In addition, in the organometallic compound represented by Formula 1, an atom that is linked to the central metal of a condensed cyclic ligand of a 5-membered ring and a 6-membered ring is carbon, which is not coordinately bonded but covalently bonded to the central metal, resulting in an increase in binding force. Thus, a device including the organometallic compound may have long lifespan.

As a result, when the organometallic compound is applied to (or utilized in) an organic light-emitting device, it is possible to prevent or reduce the transition of triplet excitons to the $^3$MC state, which is a non-luminescent state, due to ligand rupture. Accordingly, stability in an excited state, lifespan and efficiency may each be excellent in the organic light-emitting device including the organometallic compound represented by Formula 1.

In addition, in one embodiment, the organometallic compound represented by Formula 1 may satisfy the range of the $E_{3MC}$ described above. In this case, a probability that the organometallic compound represented by Formula 1 transitions from a $^3$MCLC state to a $^3$MC state, which is a non-emission state, decreases, such that stability in an excited state may be excellent, and efficiency and lifespan of an organic light-emitting device including the organometallic compound may increase.

The organometallic compound may emit blue light. In one or more embodiments, the organometallic compound may emit blue light (bottom emission $CIE_{x,y}$ color coordinates X=0.13, Y=0.05 to 0.20) having a maximum emission wavelength of about 450 nm or more and about 510 nm or less, but embodiments of the present disclosure are not limited thereto. Accordingly, the organometallic compound represented by Formula 1 may be useful for manufacturing of an organic light-emitting device that emits blue light.

Synthesis methods of the organometallic compound represented by Formula 1 may be recognizable by one of ordinary skill in the art by referring to Examples provided below.

At least one of such organometallic compounds represented by Formula 1 may be utilized between a pair of electrodes of an organic light-emitting device. In one or more embodiments, the organometallic compound may be included in an emission layer. The organometallic compound included in the emission layer may act as a dopant. In one or more embodiments, the organometallic compound represented by Formula 1 may be utilized as a material for a capping layer located outside of a pair of electrodes of an organic light-emitting device.

Accordingly, provided is an organic light-emitting device including: a first electrode; a second electrode facing the first electrode; an organic layer between the first electrode and the second electrode, the organic layer including an emission layer; and at least one organometallic compound represented by Formula 1.

The expression "(an organic layer) includes at least one organometallic compound" as used herein may include a case in which "(an organic layer) includes identical organometallic compounds represented by Formula 1" and a case in which "(an organic layer) includes two or more different organometallic compounds each represented by Formula 1".

In one or more embodiments, the organic layer may include, as the organometallic compound, only Compound 1. In this regard, Compound 1 may exist in the emission layer of the organic light-emitting device. In one or more embodiments, the organic layer may include, as the organometallic compound, Compound 1 and Compound 2. In this regard, Compound 1 and Compound 2 may exist in an identical layer (for example, Compound 1 and Compound 2 may both exist in an emission layer), or different layers (for example, Compound 1 may exist in an emission layer and Compound 2 may exist in an electron transport region).

In one embodiment,
the first electrode of the organic light-emitting device may be an anode,
the second electrode of the organic light-emitting device may be a cathode,
the organic layer may further include a hole transport region between the first electrode and the emission layer and an electron transport region between the emission layer and the second electrode,
the hole transport region may include a hole injection layer, a hole transport layer, an emission auxiliary layer, an electron blocking layer, or any combination thereof, and
the electron transport region may include a hole blocking layer, an electron transport layer, an electron injection layer, or any combination thereof.

The term "an organic layer" as used herein refers to a single layer and/or a plurality of layers between the first electrode and the second electrode of the organic light-emitting device. A material included in the "organic layer" is not limited to an organic material.

In one embodiment, the emission layer includes the organometallic compound represented by Formula 1, and the emission layer further includes a host. An amount of the host in the emission layer may be greater than an amount of the organometallic compound in the emission layer.

In one or more embodiments, the emission layer further includes a host, and an amount of the organometallic compound may be about 0.1 parts by weight to about 50 parts by weight based on 100 parts by weight of the emission layer.

In one embodiment, the hole transport region may include a p-dopant having a lowest unoccupied molecular orbital (LUMO) energy level of less than about −3.5 eV.

[Description of FIG. 1]

Figure 1:
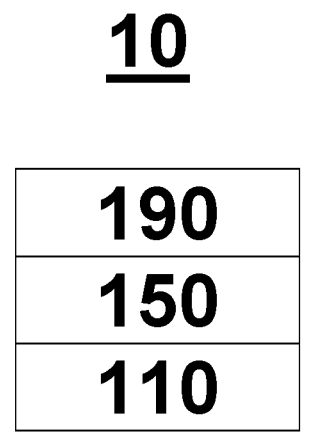

FIG. 1 is a schematic cross-sectional view of an organic light-emitting device 10 according to an embodiment of the present disclosure. The organic light-emitting device 10 includes a first electrode 110, an organic layer 150, and a second electrode 190.

Hereinafter, a structure of the organic light-emitting device 10 according to an embodiment and a method of manufacturing the organic light-emitting device 10 will be described in connection with FIG. 1.

[First Electrode 110]

In FIG. 1, a substrate may be additionally disposed under the first electrode 110 or above the second electrode 190. The substrate may be a glass substrate or a plastic substrate, each having excellent mechanical strength, thermal stability, transparency, surface smoothness, ease of handling, and water resistance.

The first electrode 110 may be formed by, for example, depositing or sputtering a material for forming the first electrode 110 on the substrate. When the first electrode 110 is an anode, the material for forming the first electrode 110 may be selected from materials with a high work function to facilitate hole injection.

The first electrode 110 may be a reflective electrode, a semi-transmissive electrode, or a transmissive electrode. When the first electrode 110 is a transmissive electrode, a material for forming the first electrode 110 may be selected from indium tin oxide (ITO), indium zinc oxide (IZO), tin oxide ($SnO_2$), zinc oxide (ZnO), and any combination thereof, but embodiments of the present disclosure are not limited thereto. In one or more embodiments, when the first electrode 110 is a semi-transmissive electrode or a reflective electrode, a material for forming the first electrode 110 may be selected from magnesium (Mg), silver (Ag), aluminum (Al), aluminum-lithium (Al—Li), calcium (Ca), magnesium-indium (Mg—In), magnesium-silver (Mg—Ag), and any combination thereof, but embodiments of the present disclosure are not limited thereto.

The first electrode 110 may have a single-layered structure or a multi-layered structure including two or more layers. For example, the first electrode 110 may have a three-layered structure of ITO/Ag/ITO, but the structure of the first electrode 110 is not limited thereto.

[Organic Layer 150]

The organic layer 150 is located on the first electrode 110. The organic layer 150 includes an emission layer.

The organic layer 150 may further include a hole transport region between the first electrode 110 and the emission layer and an electron transport region between the emission layer and the second electrode 190.

[Hole transport region in organic layer 150]

The hole transport region may have i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure having a plurality of layers including (e.g., consisting of) a plurality of different materials.

The hole transport region may include at least one layer selected from a hole injection layer, a hole transport layer, an emission auxiliary layer, and an electron blocking layer.

In one or more embodiments, the hole transport region may have a single-layered structure including (e.g., consisting of) a single layer including (e.g., consisting of) a plurality of different materials, or a multi-layered structure having a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein for each structure, constituting layers are sequentially stacked from the first electrode 110 in the respective stated order, but embodiments of the present disclosure are not limited thereto.

The hole transport region may include at least one selected from m-MTDATA, TDATA, 2-TNATA, NPB (NPD), β-NPB, TPD, spiro-TPD, spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201, and a compound represented by Formula 202:

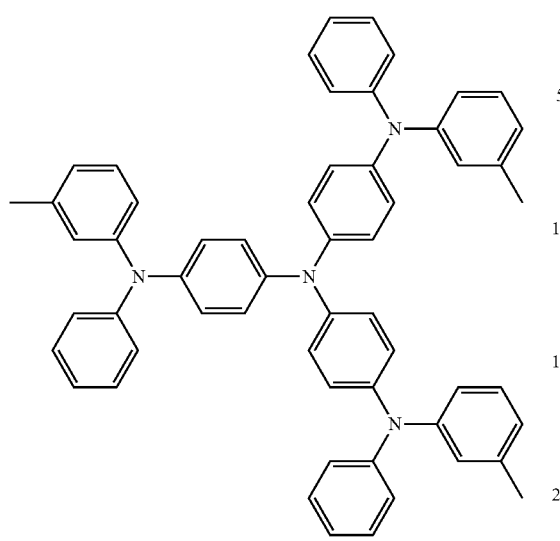
m-MTDATA
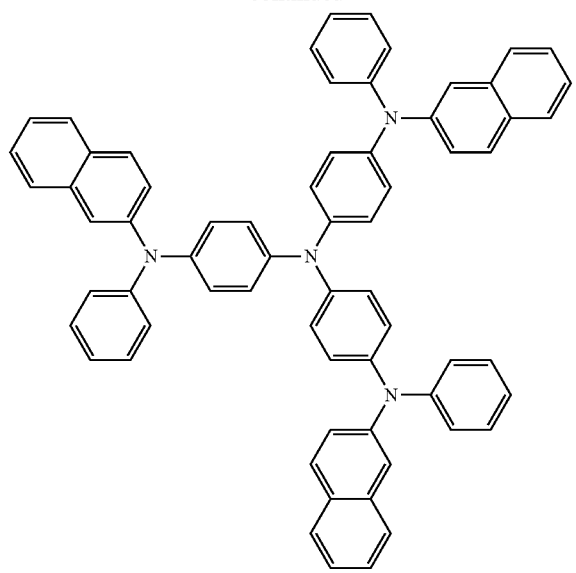
2-TNATA
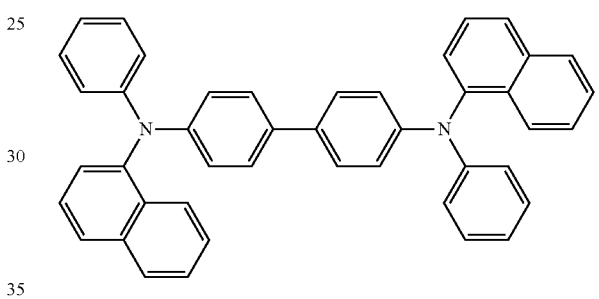
NPB
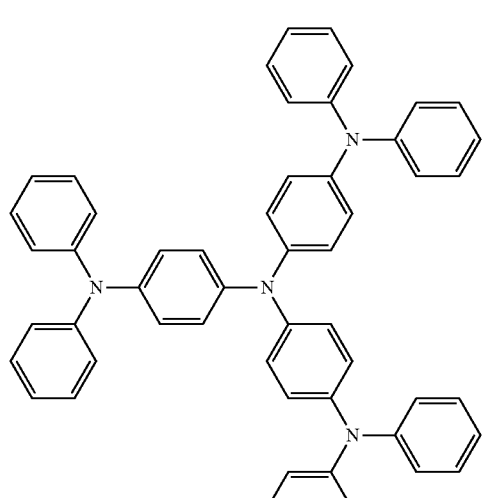
TDATA
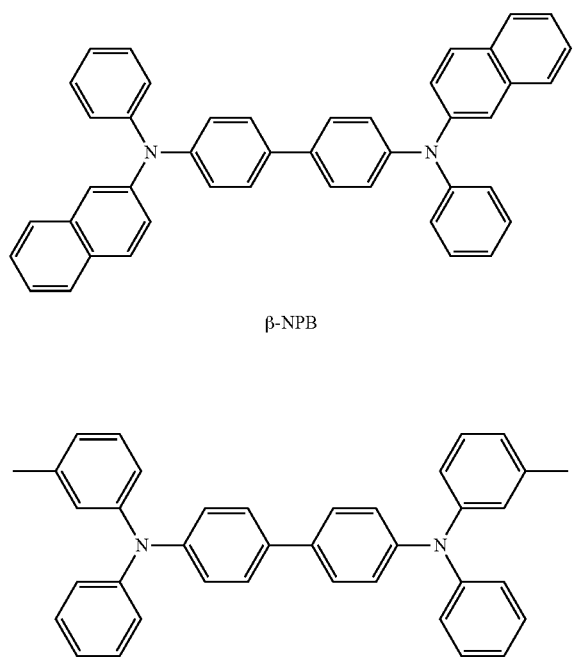
β-NPB
TPD

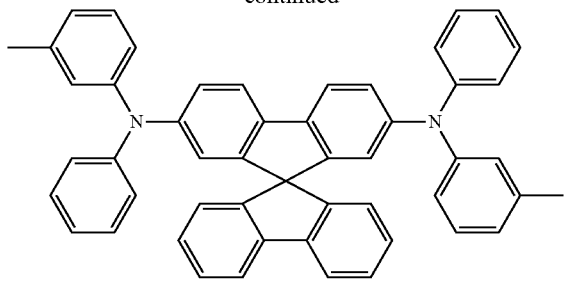

Spiro-TPD

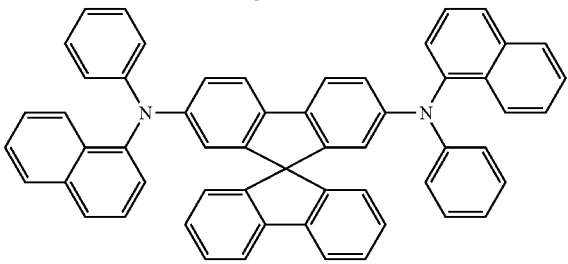

Spiro-NPB

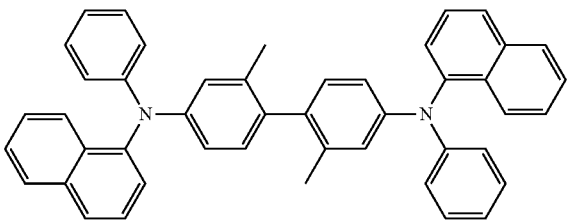

methylated NPB

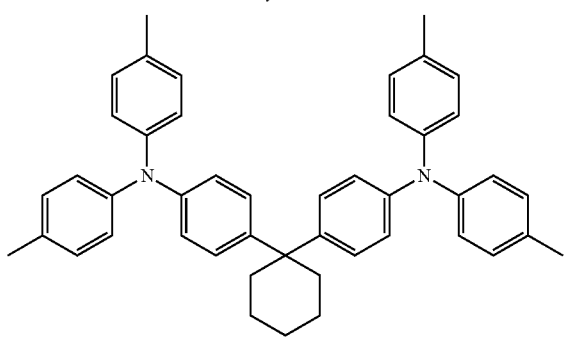

TAPC

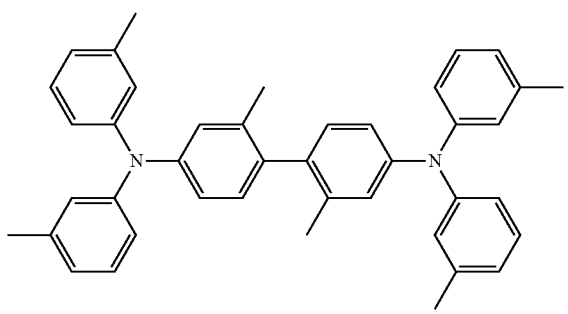

HMTPD

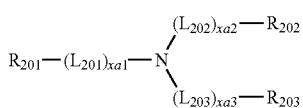

Formula 201

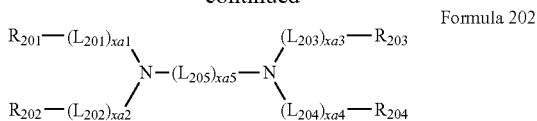

Formula 202

In Formulae 201 and 202, $L_{201}$ to $L_{204}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $L_{205}$ may be selected from *—O—*', *—S—*I, *—N($Q_{201}$)—*', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xa1 to xa4 may each independently be an integer from 0 to 3, xa5 may be an integer from 1 to 10, and $R_{201}$ to $R_{204}$ and $Q_{201}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

In one or more embodiments, in Formula 202, $R_{201}$ and $R_{202}$ may optionally be linked to each other via a single bond, a dimethyl-methylene group, or a diphenyl-methylene group, and $R_{203}$ and $R_{204}$ may optionally be linked to each other via a single bond, a dimethyl-methylene group, or a diphenyl-methylene group.

In one embodiment, in Formulae 201 and 202, $L_{201}$ to $L_{205}$ may each independently be selected from:
a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), and —N($Q_{31}$)($Q_{32}$), wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In one or more embodiments, xa1 to xa4 may each independently be 0, 1, or 2.

In one or more embodiments, xa5 may be 1, 2, 3, or 4.

In one or more embodiments, $R_{201}$ to $R_{204}$ and $Q_{201}$ may each independently be selected from: a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), and —N($Q_{31}$)($Q_{32}$), wherein $Q_{31}$ to $Q_{33}$ may each independently be the same as described above.

In one or more embodiments, at least one selected from $R_{201}$ to $R_{203}$ in Formula 201 may each independently be selected from:

a fluorenyl group, a spiro-bifluorenyl group, a carbazolyl group, a dibenzofuranyl group, and a dibenzothiophenyl group; and a fluorenyl group, a spiro-bifluorenyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments of the present disclosure are not limited thereto.

In one or more embodiments, in Formula 202, i) $R_{201}$ and $R_{202}$ may be linked to each other via a single bond, and/or ii) $R_{203}$ and $R_{204}$ may be linked to each other via a single bond.

In one or more embodiments, at least one of $R_{201}$ to $R_{204}$ in Formula 202 may be selected from:

a carbazolyl group; and a carbazolyl group substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments of the present disclosure are not limited thereto.

In one or more embodiments, the compound represented by Formula 201 may be represented by Formula 201A below:

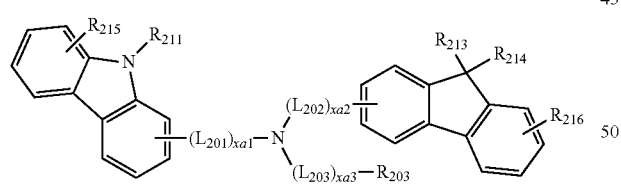

Formula 201A

In one or more embodiments, the compound represented by Formula 201 may be represented by Formula 201A(1) below, but embodiments of the present disclosure are not limited thereto:

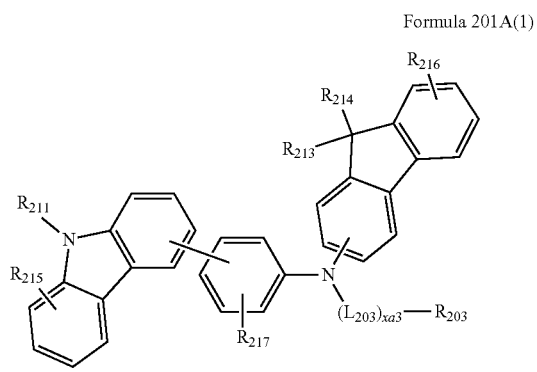

Formula 201A(1)

In one or more embodiments, the compound represented by Formula 201 may be represented by Formula 201A-1 below, but embodiments of the present disclosure are not limited thereto:

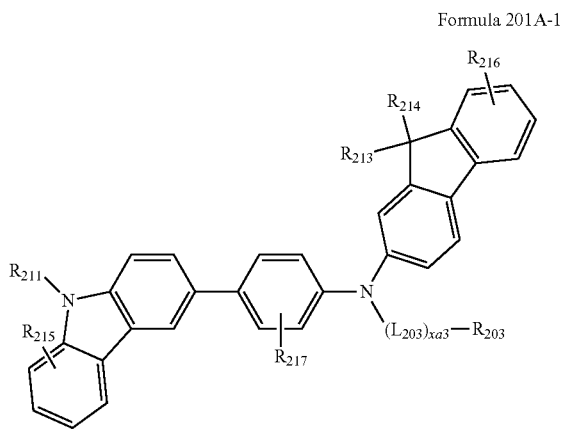

Formula 201A-1

In one or more embodiments, the compound represented by Formula 202 may be represented by Formula 202A below:

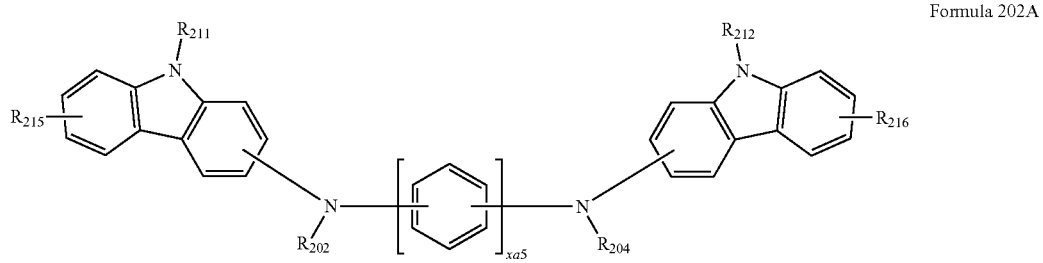

Formula 202A

In one or more embodiments, the compound represented by Formula 202 may be represented by Formula 202A-1 below:

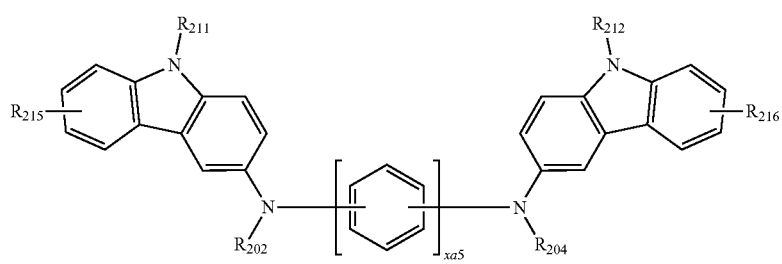

Formula 202A-1

In Formulae 201A, 201A(1), 201A-1, 202A, and 202A-1, $L_{201}$ to $L_{203}$, xa1 to xa3, xa5, and $R_{202}$ to $R_{204}$ may be the same as respectively described above, $R_{211}$ and $R_{212}$ may each independently be the same as described in connection with $R_{203}$, and $R_{213}$ to $R_{217}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

The hole transport region may include at least one compound selected from Compounds HT1 to HT39, but compounds to be included in the hole transport region are not limited thereto:

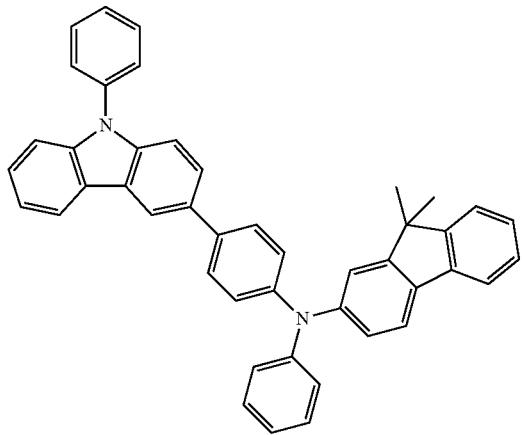

HT1

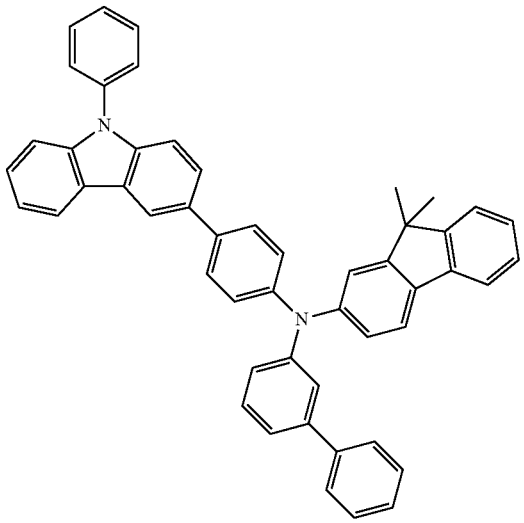

HT2

-continued
HT3
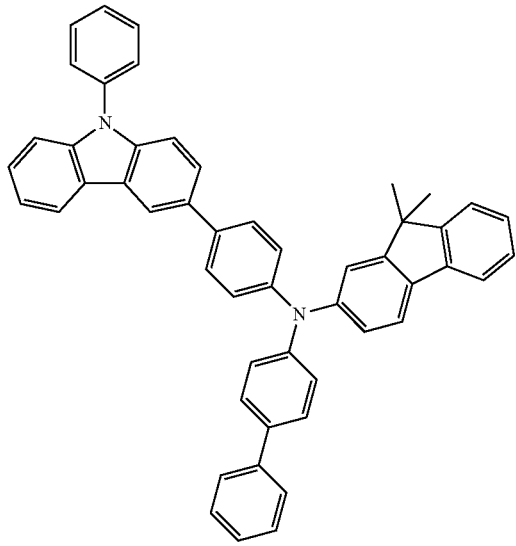
HT4
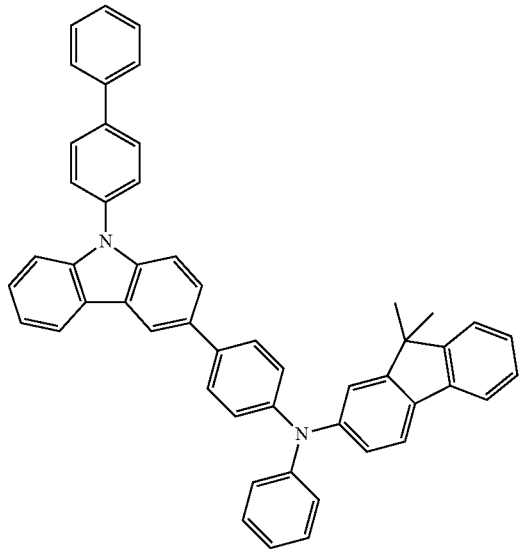
HT5
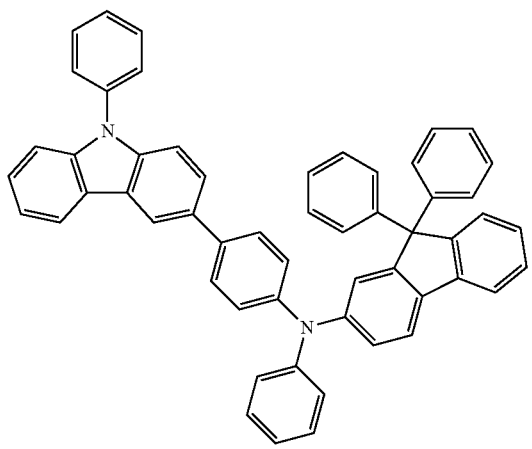
HT6
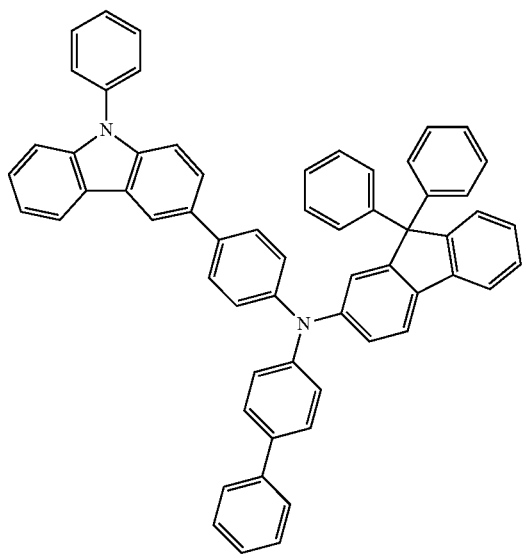

-continued
HT7
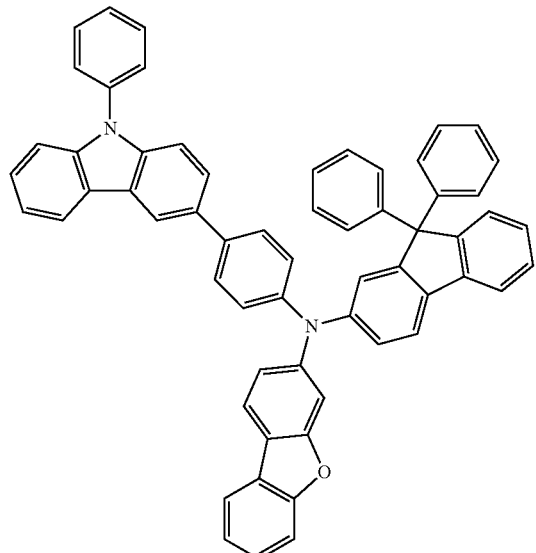
HT8
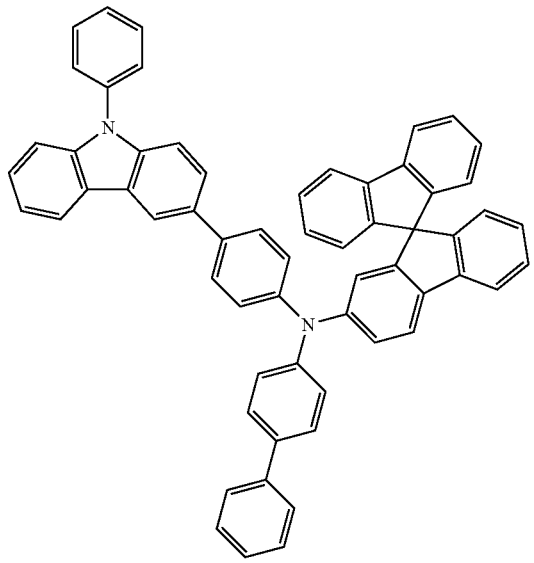
HT9
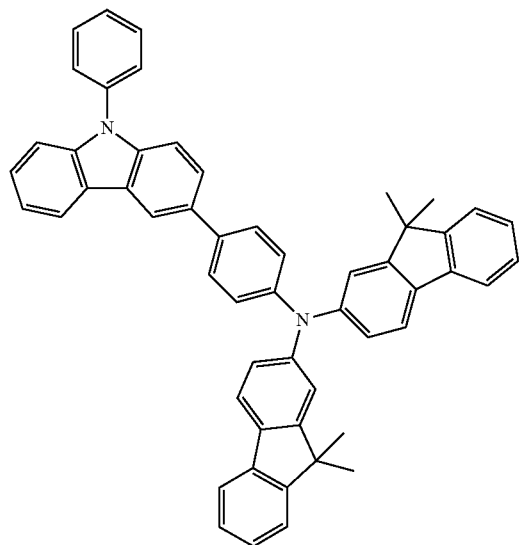
HT10
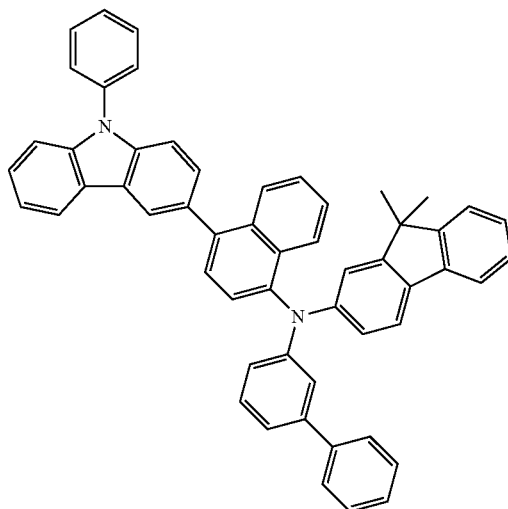
HT11
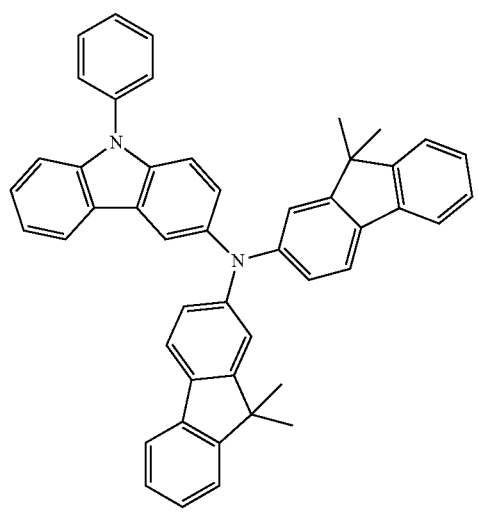
HT12
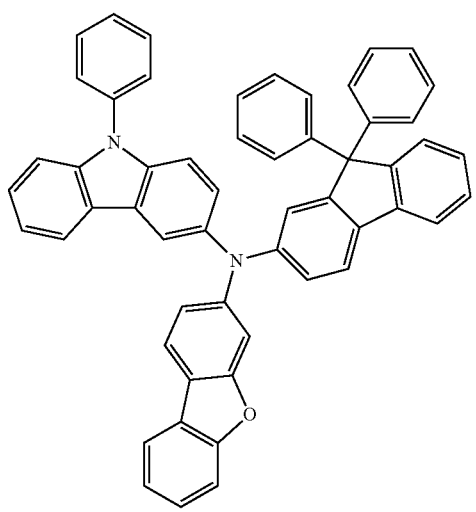

-continued
HT13
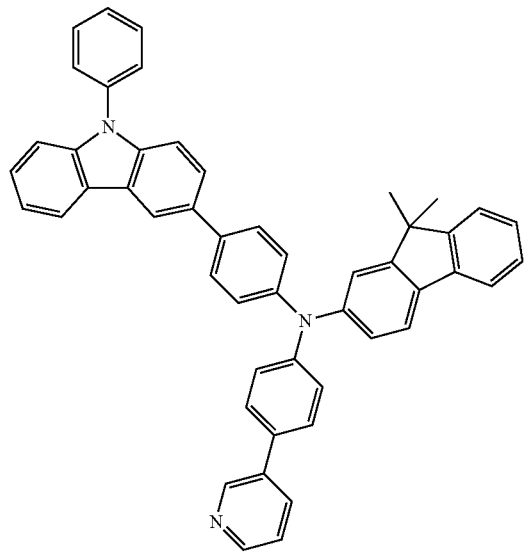
HT14
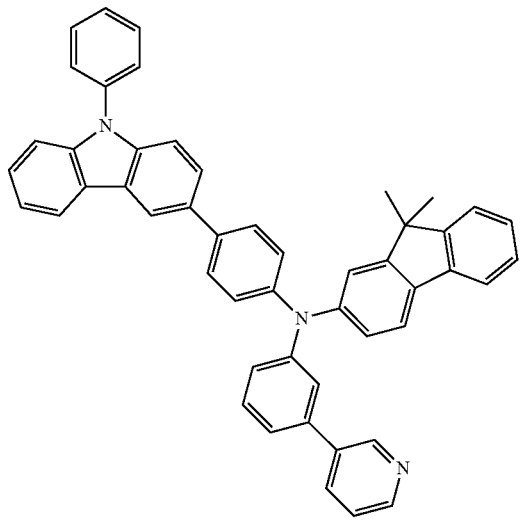
HT15
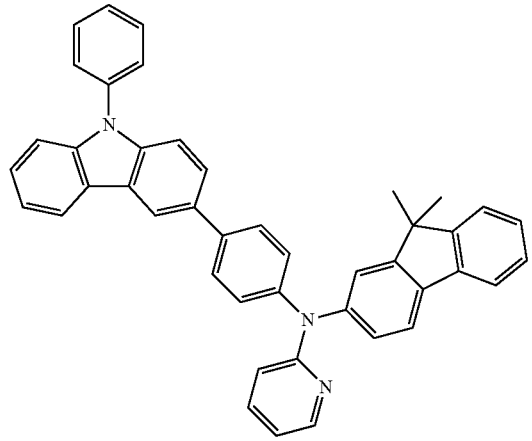
HT16
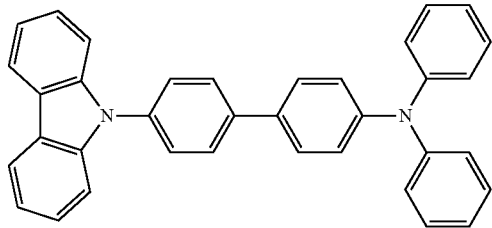
HT17
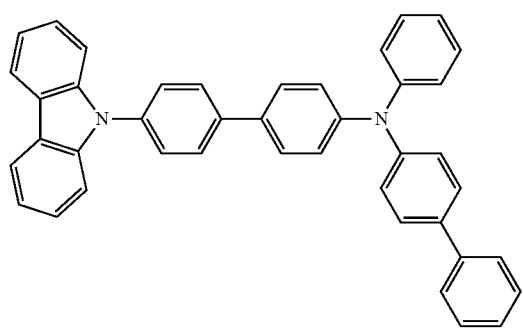
HT18
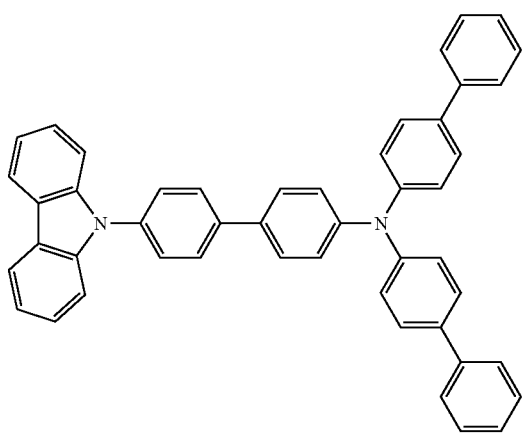

-continued
HT19
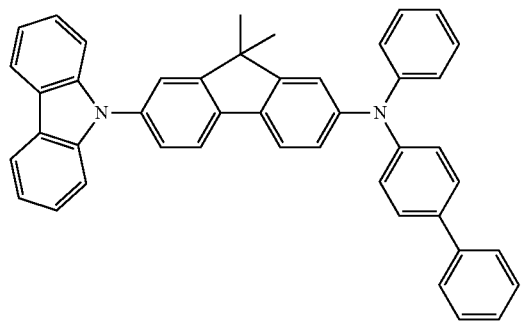
HT20
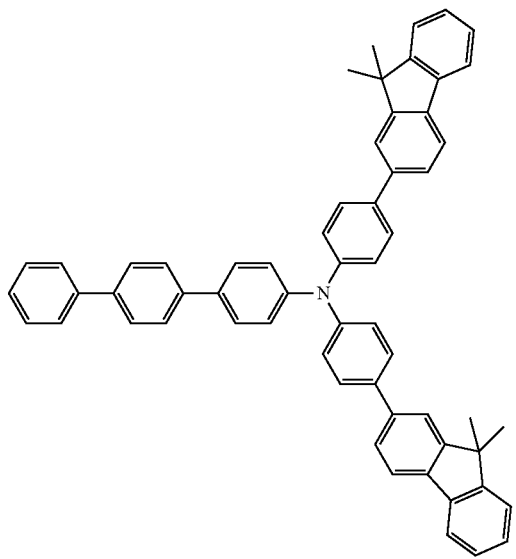
HT21
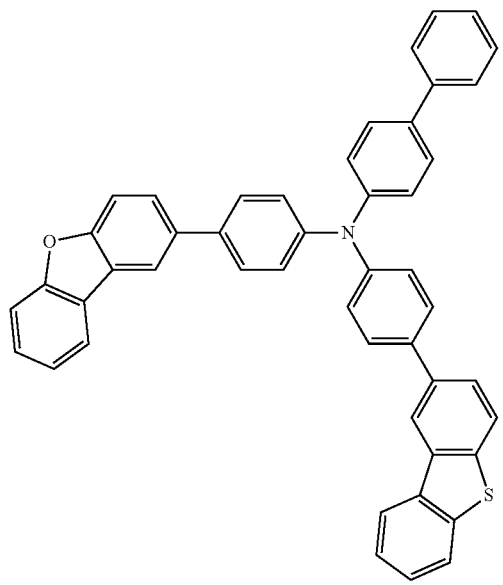
HT22
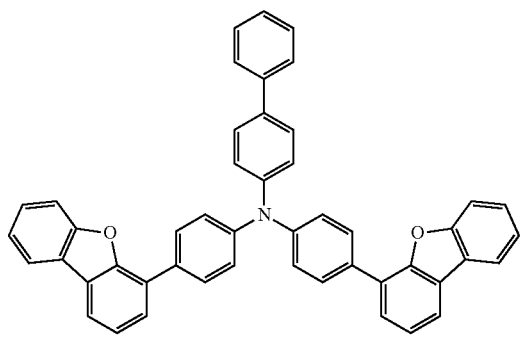
HT23
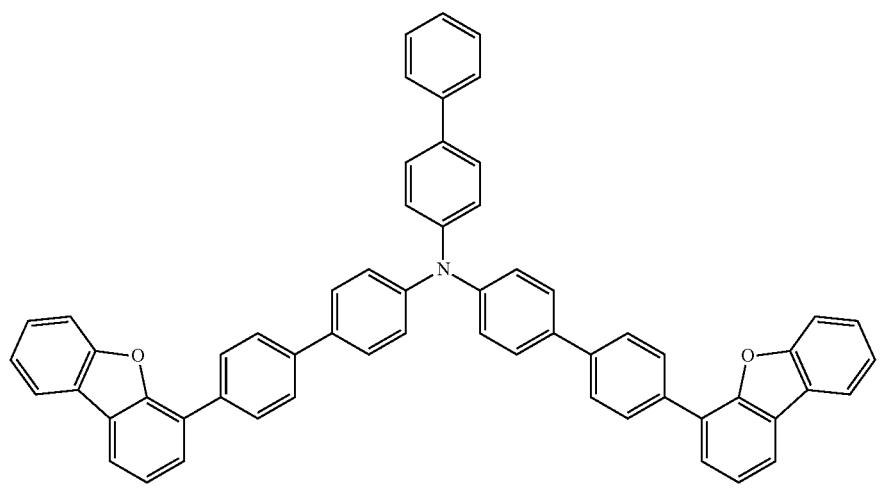

-continued
HT24
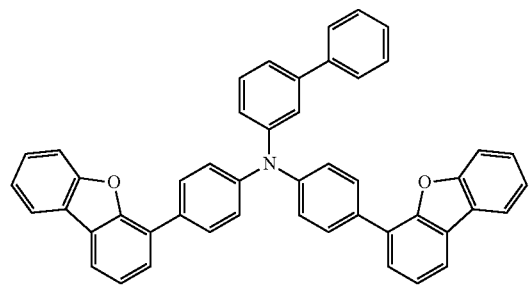
HT25
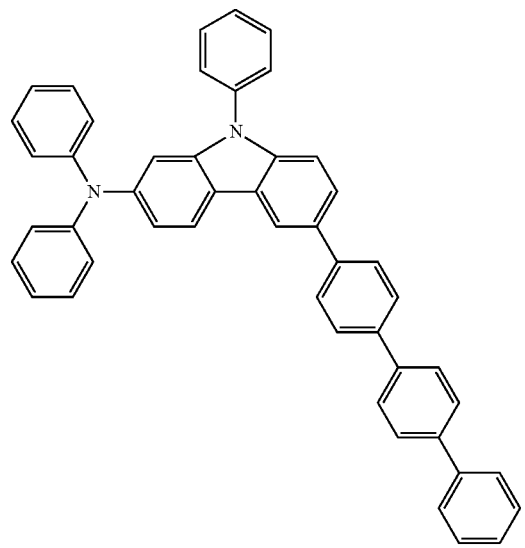
HT26
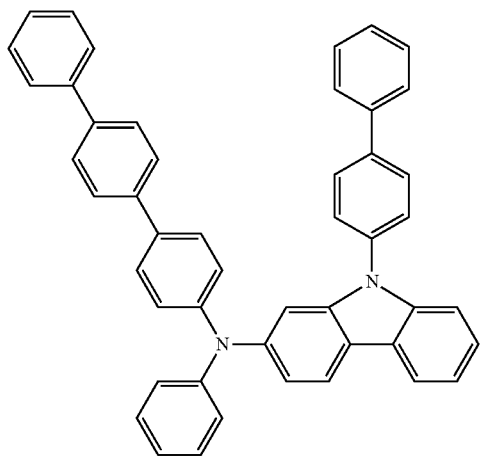
HT27
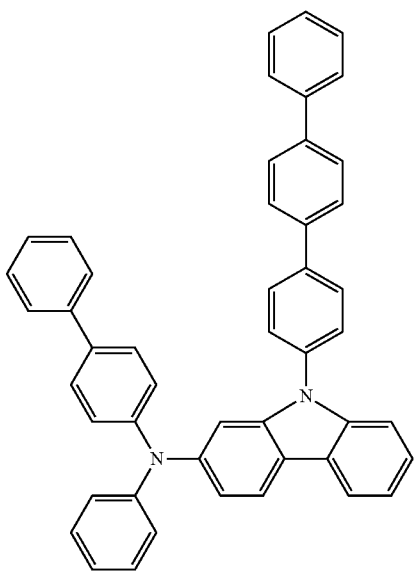
HT28
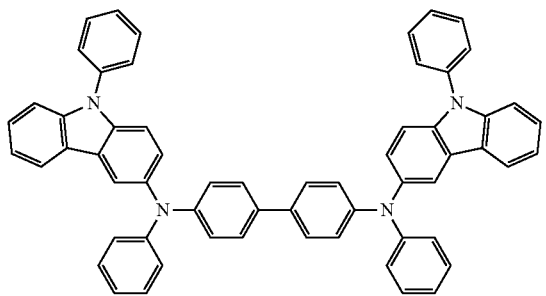
HT29
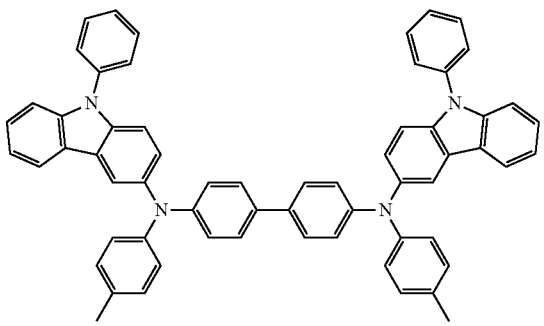

-continued
HT30
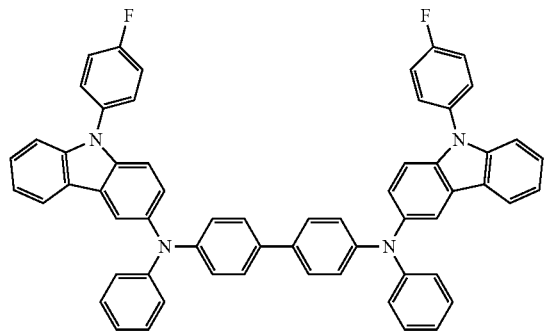
HT31
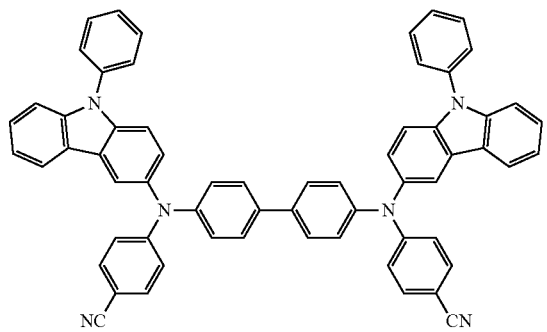
HT32
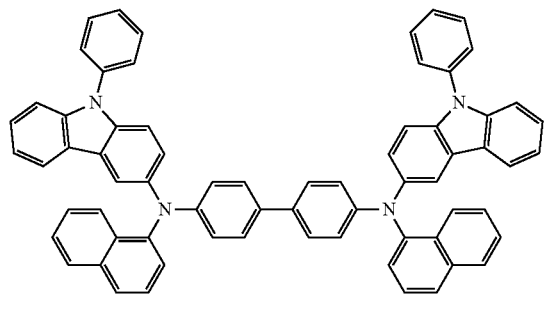
HT33
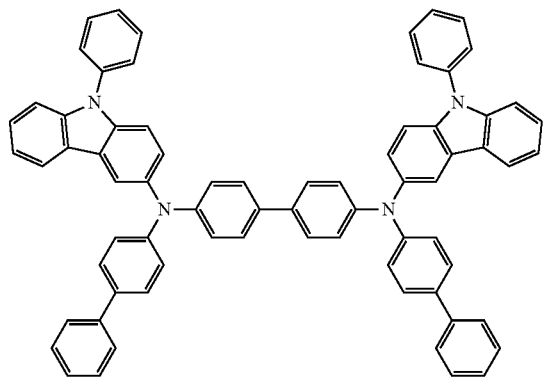
HT34
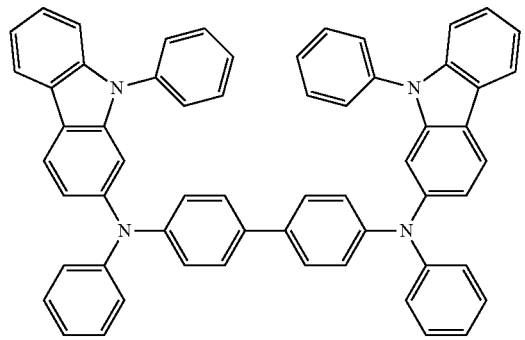
HT35
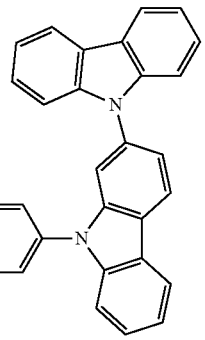
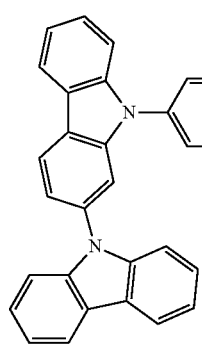

-continued

HT36
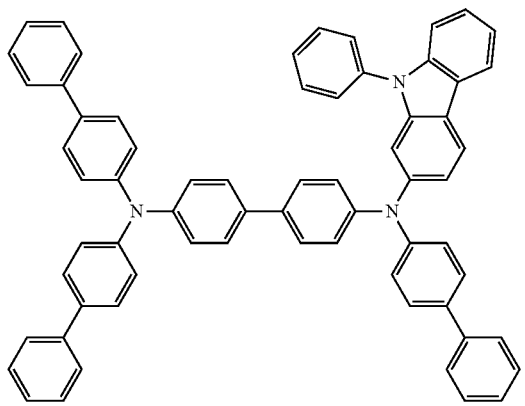

HT37
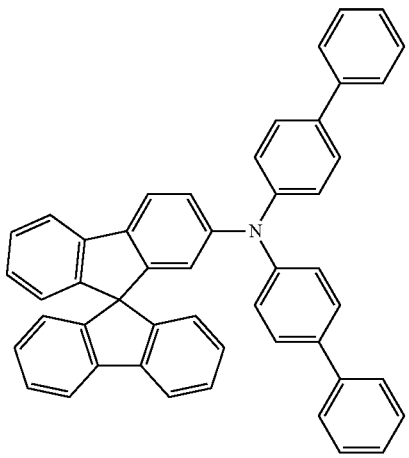

HT38
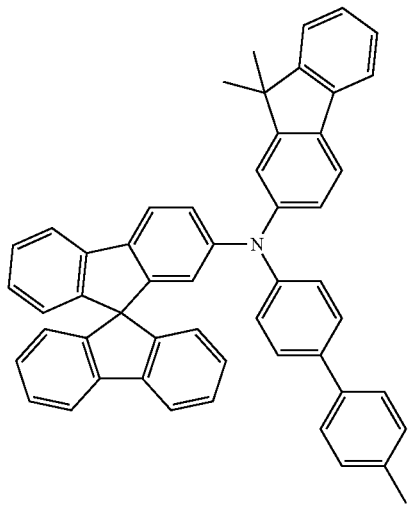

HT39
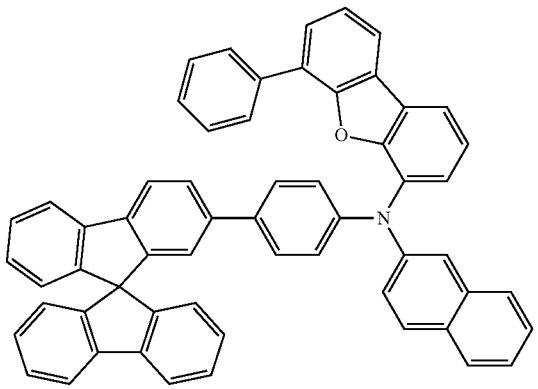

A thickness of the hole transport region may be in a range of about 100 Å to about 10,000 Å, for example, about 100 Å to about 1,000 Å. When the hole transport region includes at least one of a hole injection layer and a hole transport layer, the thickness of the hole injection layer may be in a range of about 100 Å to about 9,000 Å, for example, about 100 Å to about 1,000 Å, and the thickness of the hole transport layer may be in a range of about 50 Å to about 2,000 Å, for example, about 100 Å to about 1,500 Å. When the thicknesses of the hole transport region, the hole injection layer, and the hole transport layer are within these ranges, satisfactory hole transporting characteristics may be obtained without a substantial increase in driving voltage.

The emission auxiliary layer may increase light-emission efficiency by compensating for an optical resonance distance according to the wavelength of light emitted by an emission layer, and the electron blocking layer may block the flow of electrons from an electron transport region. The emission auxiliary layer and the electron blocking layer may include the materials as described above.

[p-dopant]

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant.

In one embodiment, the p-dopant may have a LUMO energy level of −3.5 eV or less.

The p-dopant may include at least one selected from a quinone derivative, a metal oxide, and a cyano group-containing compound, but embodiments of the present disclosure are not limited thereto.

In one embodiment, the p-dopant may include at least one selected from:

a quinone derivative, such as tetracyanoquinodimethane (TCNQ) and/or 2,3,5,6-tetrafluoro-7,7,8,8-tetracyano-quinodimethane (F4-TCNQ);

a metal oxide, such as tungsten oxide and/or molybdenum oxide;

1,4,5,8,9,12-hexaazatriphenylene-hexacarbonitrile (HAT-CN); and a compound represented by Formula 221 below, but embodiments of the present disclosure are not limited thereto:

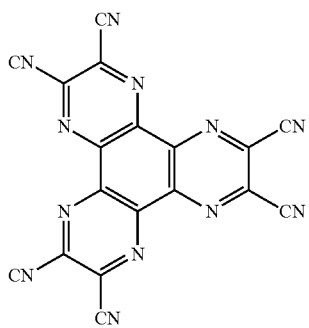

HAT-CN

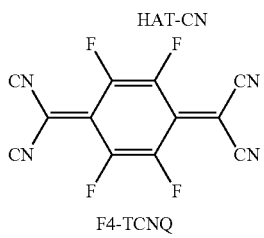

F4-TCNQ

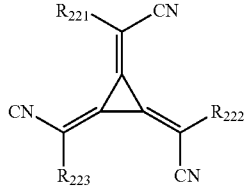

Formula 221

In Formula 221, $R_{221}$ to $R_{223}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, and at least one selected from $R_{221}$ to $R_{223}$ may have at least one substituent selected from a cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with —Br, and a $C_1$-$C_{20}$ alkyl group substituted with —I.

[Emission Layer in Organic Layer 150]

When the organic light-emitting device 10 is a full-color organic light-emitting device, the emission layer may be patterned into a red emission layer, a green emission layer, or a blue emission layer, according to a sub-pixel. In one or more embodiments, the emission layer may have a stacked structure of two or more layers selected from a red emission layer, a green emission layer, and a blue emission layer, in which the two or more layers may contact each other or may be separated from each other. In one or more embodiments, the emission layer may include two or more materials selected from a red light-emitting material, a green light-emitting material, and a blue light-emitting material, in which the two or more materials are mixed with each other in a single layer to emit white light.

The emission layer may include a host and a dopant. The dopant may include at least one of a phosphorescent dopant and a fluorescent dopant. The phosphorescent dopant may include the organometallic compound represented by Formula 1.

An amount of a dopant in the emission layer may be, based on about 100 parts by weight of the host, in the range of about 0.01 parts by weight to about 15 parts by weight, but embodiments of the present disclosure are not limited thereto.

A thickness of the emission layer may be in a range of about 100 Å to about 1,000 Å, for example, about 200 Å to about 600 Å. When the thickness of the emission layer is within these ranges, excellent light-emission characteristics may be obtained without a substantial increase in driving voltage. [Host in emission layer]

In one or more embodiments, the host may include a compound represented by Formula 301 below.

$$[Ar_{301}]_{xb11}\text{—}[(L_{301})_{xb1}\text{-}R_{301}]_{xb21} \qquad \text{Formula 301}$$

In Formula 301, $Ar_{301}$ may be a substituted or unsubstituted $C_5$-$C_{60}$ carbocyclic group or a substituted or unsubstituted $C_1$-$C_{60}$ heterocyclic group, xb11 may be 1, 2, or 3, $L_{301}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xb1 may be an integer from 0 to 5, $R_{301}$ may be selected from deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), and —P(=O)($Q_{301}$)($Q_{302}$), and xb21 may be an integer from 1 to 5, wherein $Q_{301}$ to $Q_{303}$ may each independently be selected from a $C_1$-$C_{10}$ alkyl group, a $C_1$-$C_{10}$ alkoxy group, a phenyl group, a biphenyl group, a terphenyl group, and a naphthyl group, but embodiments of the present disclosure are not limited thereto.

In one embodiment, $Ar_{301}$ in Formula 301 may be selected from:

a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, and a dibenzothiophene group; and a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, and a dibenzothiophene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group, but embodiments of the present disclosure are not limited thereto.

When xb11 in Formula 301 is 2 or more, two or more of $Ar_{301}$(s) may be linked to each other via a single bond.

In one or more embodiments, the compound represented by Formula 301 may be represented by Formula 301-1 or Formula 301-2:

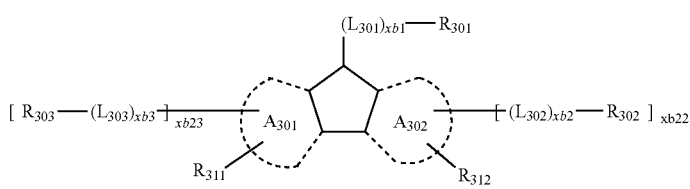

Formula 301-1

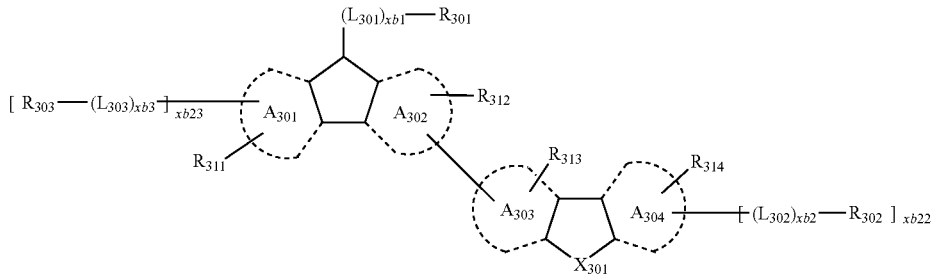

Formula 301-2

In Formulae 301-1 and 301-2, $A_{301}$ to $A_{304}$ may each independently be selected from a benzene ring, a naphthalene ring, a phenanthrene ring, a fluoranthene ring, a triphenylene ring, a pyrene ring, a chrysene ring, a pyridine ring, a pyrimidine ring, an indene ring, a fluorene ring, a spiro-bifluorene ring, a benzofluorene ring, a dibenzofluorene ring, an indole ring, a carbazole ring, a benzocarbazole ring, a dibenzocarbazole ring, a furan ring, a benzofuran ring, a dibenzofuran ring, a naphthofuran ring, a benzonaphthofuran ring, a dinaphthofuran ring, a thiophene ring, a benzothiophene ring, a dibenzothiophene ring, a naphthothiophene ring, a benzonaphthothiophene ring, and a dinaphthothiophene ring, $X_{301}$ may be O, S, or N—[($L_{304}$)$_{xb4}$-$R_{304}$], $R_{311}$ to $R_{314}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), xb22 and xb23 may each independently be 0, 1, or 2, $L_{301}$, xb1, $R_{301}$ and $Q_{31}$ to $Q_{33}$ may each independently be the same as respectively described above, $L_{302}$ to $L_{304}$ may each independently be the same as described in connection with $L_{301}$, xb2 to xb4 may each independently be the same as described in connection with xb1, and $R_{302}$ to $R_{304}$ may each independently be the same as described in connection with $R_{301}$.

In one or more embodiments, $L_{301}$ to $L_{304}$ in Formulae 301, 301-1, and 301-2 may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$);

wherein $Q_{31}$ to $Q_{33}$ may each independently be the same as described above.

In one embodiment, $R_{301}$ to $R_{304}$ in Formulae 301, 301-1, and 301-2 may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{31}$ to $Q_{33}$ may each independently be the same as described above.

In one or more embodiments, the host may include an alkaline earth-metal complex. For example, the host may be selected from a Be complex (for example, Compound H55), an Mg complex, and a Zn complex.

The host may include at least one selected from 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), and at least one selected from Compounds H1 to H55, but embodiments of the present disclosure are not limited thereto:

H1

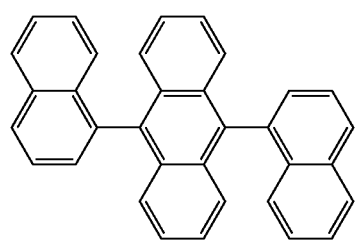

H2

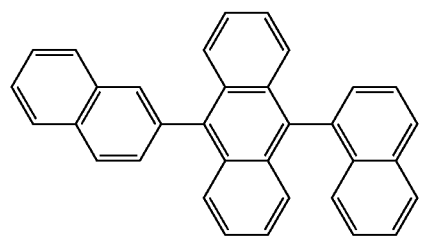

-continued

H3

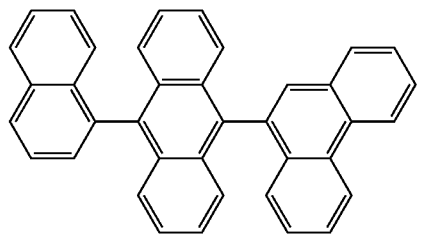

H4

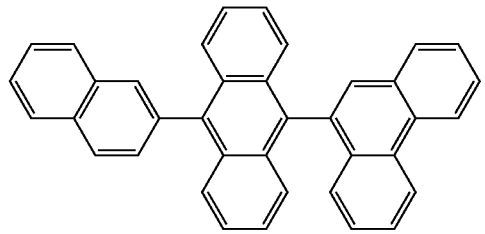

H5

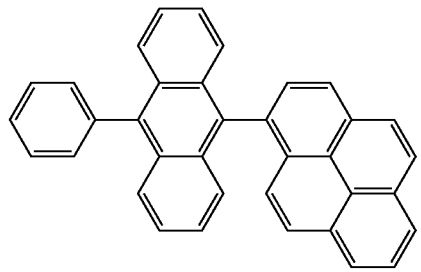

H6

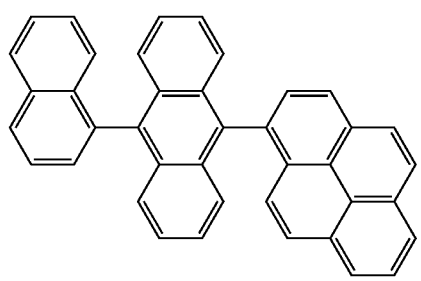

H7

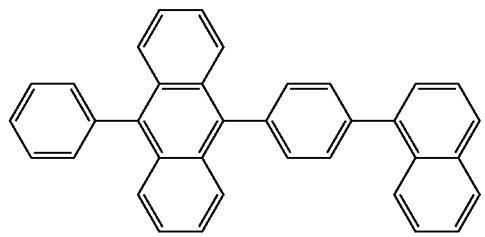

H8

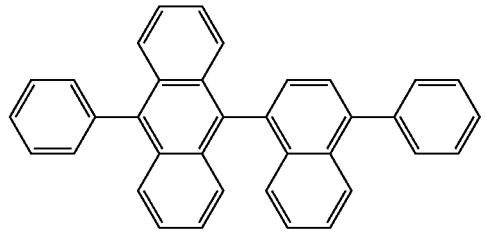

H9
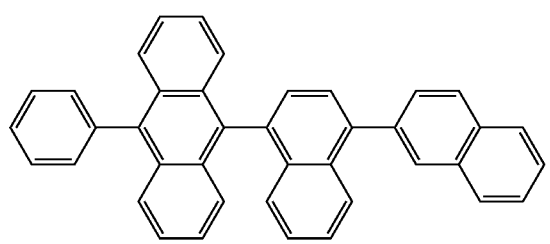
H10
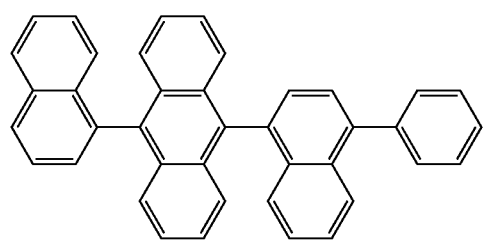
H11
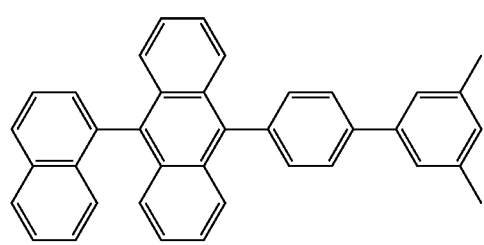
H12
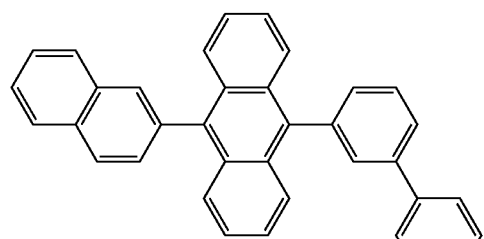
H13
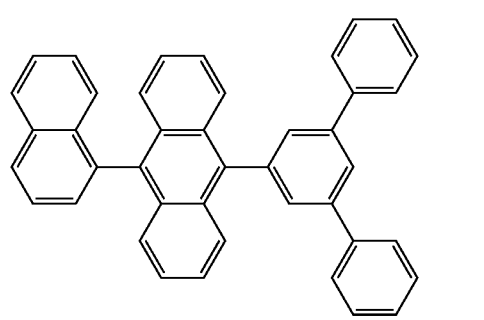
H14
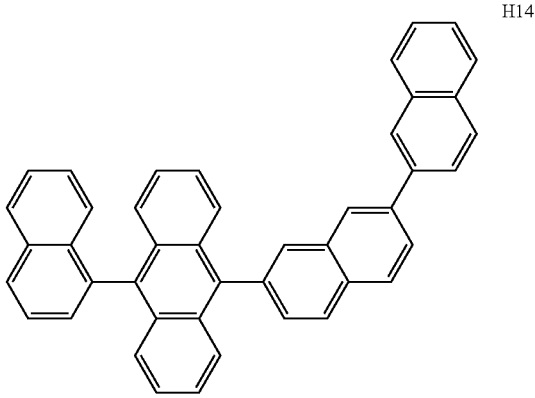
H15
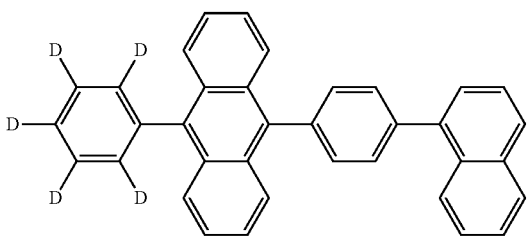
H16
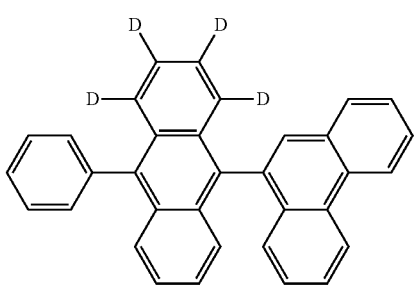
H17
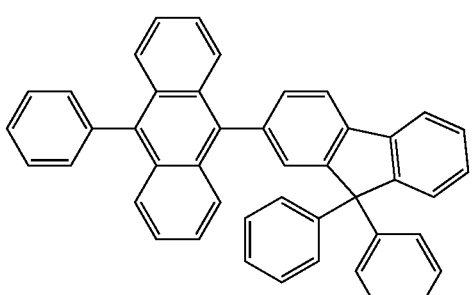
H18
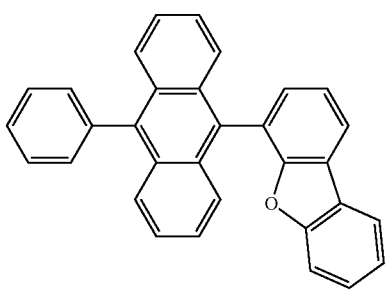

H19
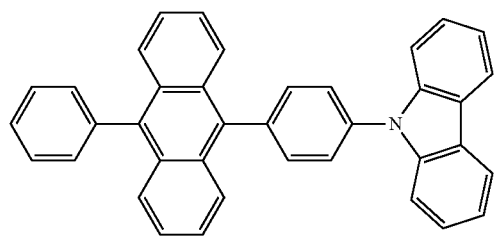
H20
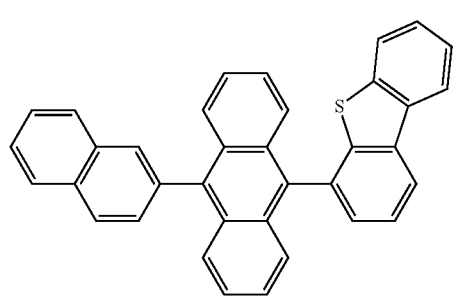
H21
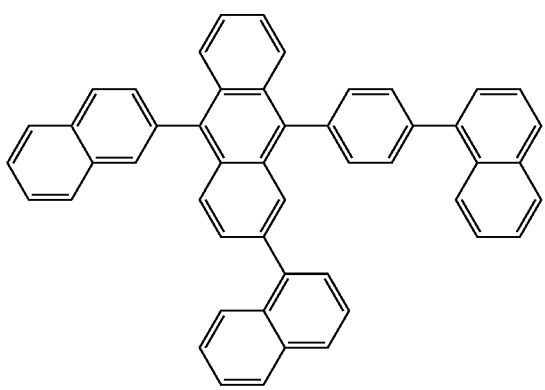
H22
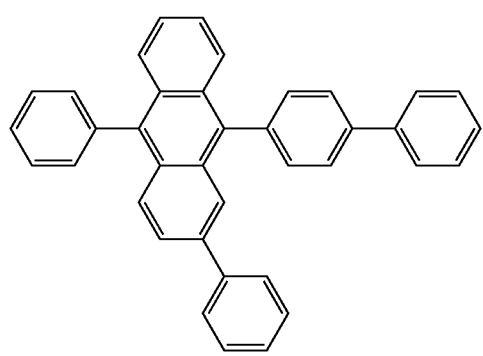
H23
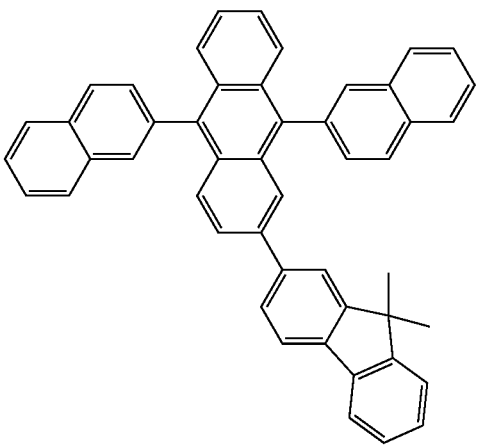
H24
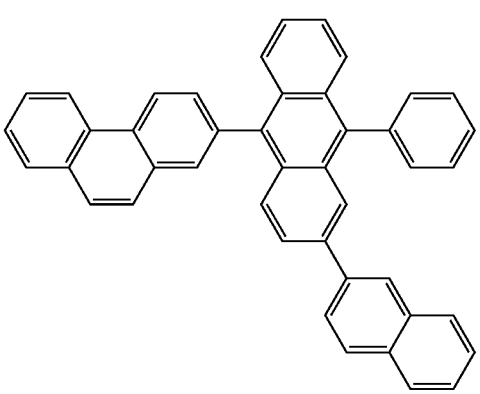
H25
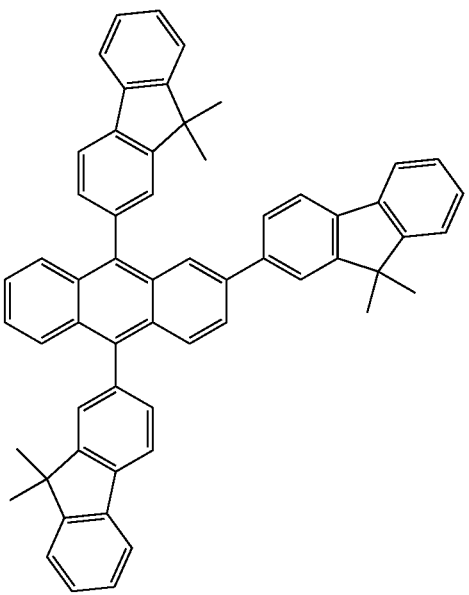

H26
H27
H28
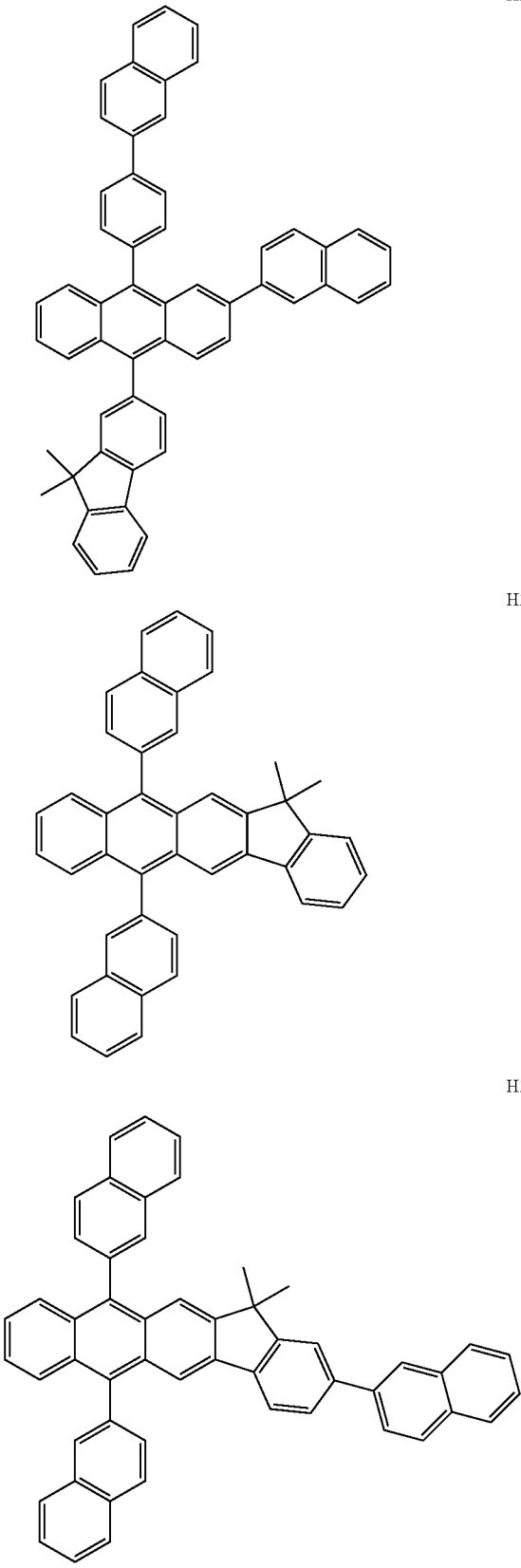
H29
H30
H31
H32
H33
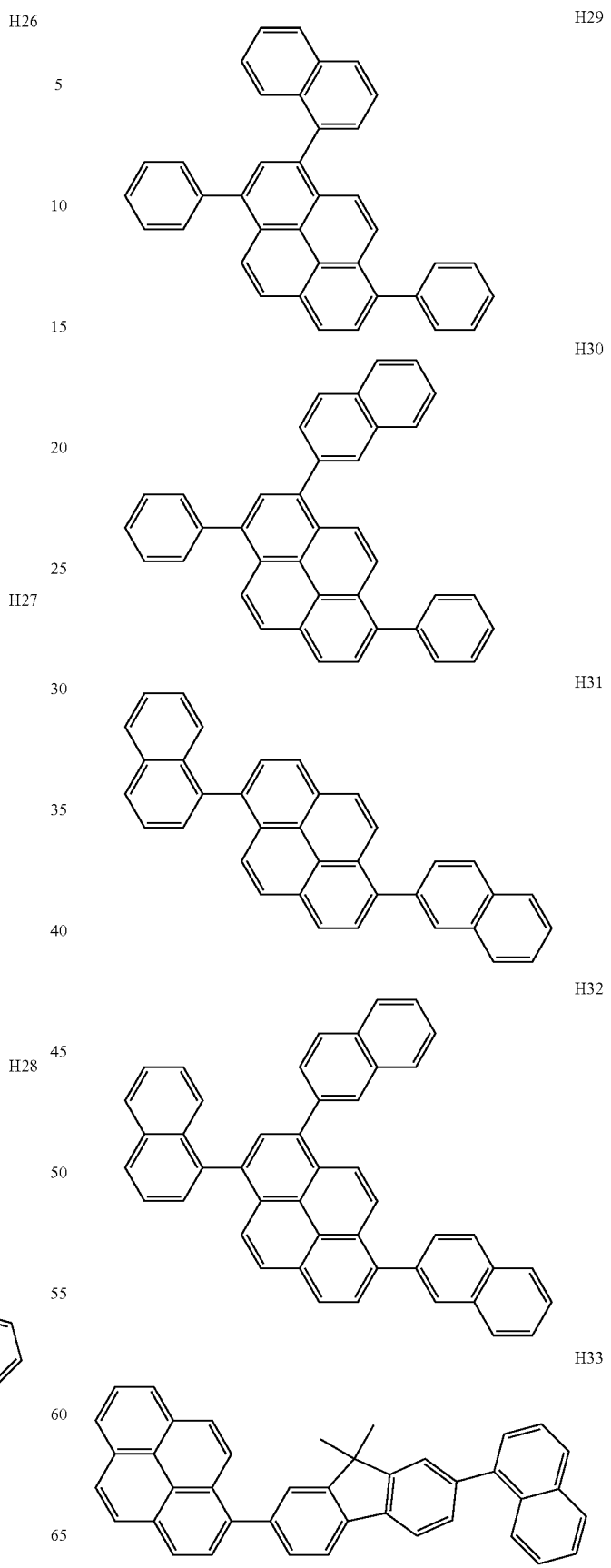

61
-continued
H34
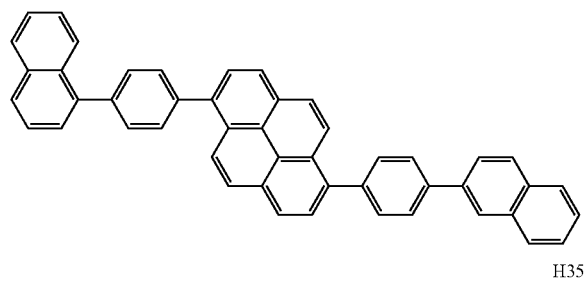
H35
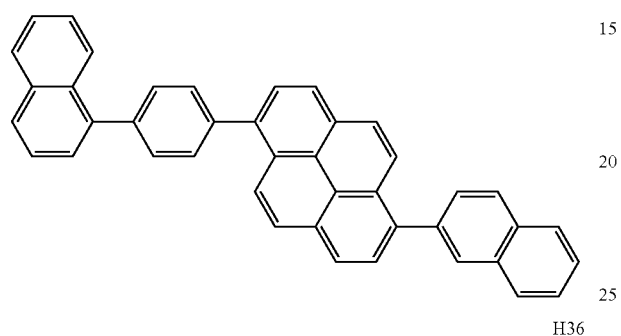
H36
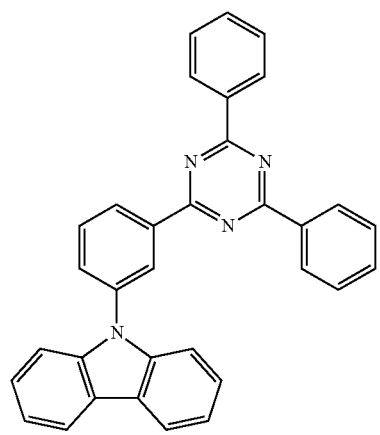
H37
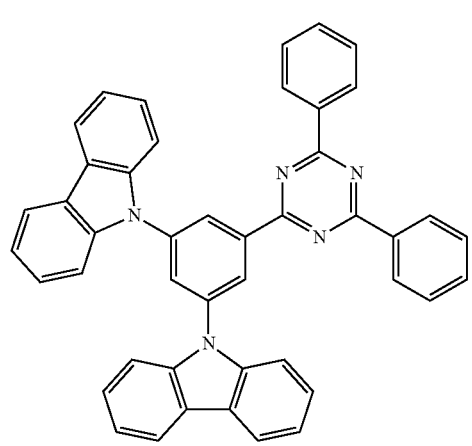
62
-continued
H38
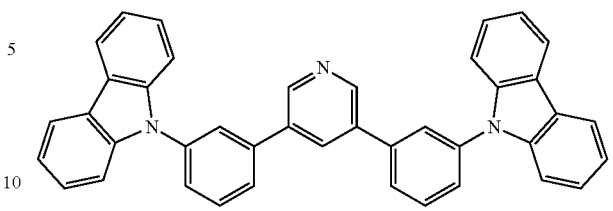
H39
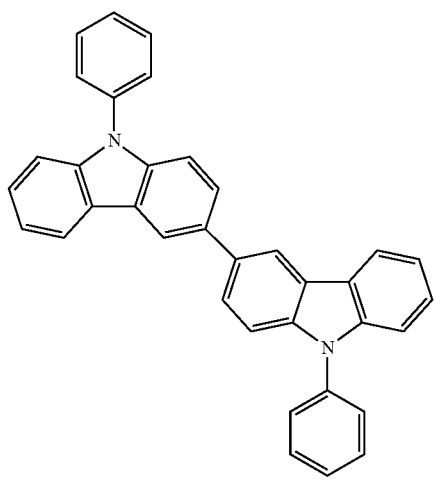
H40
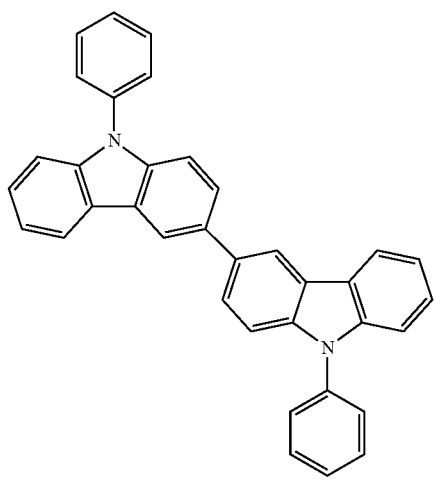

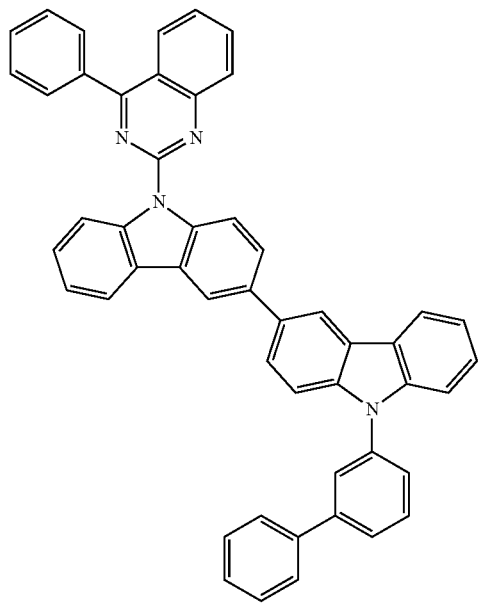
H41
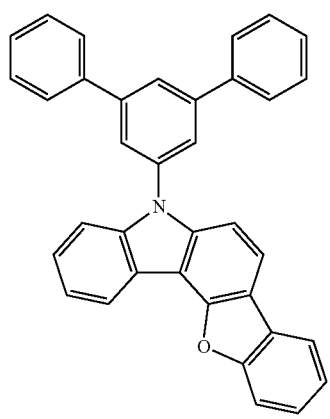
H42
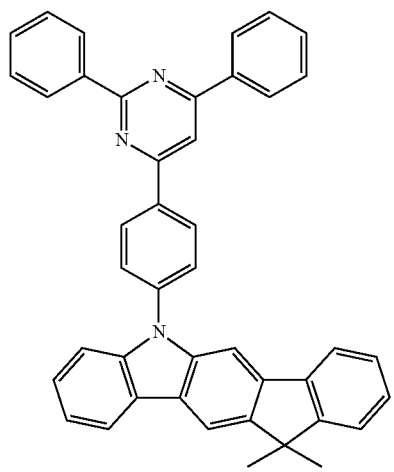
H43
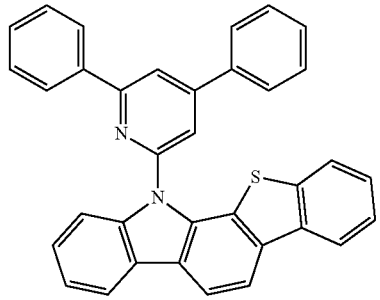
H44
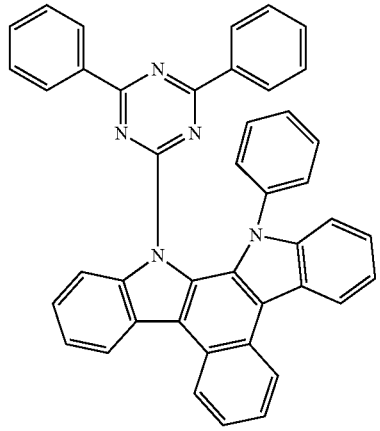
H45
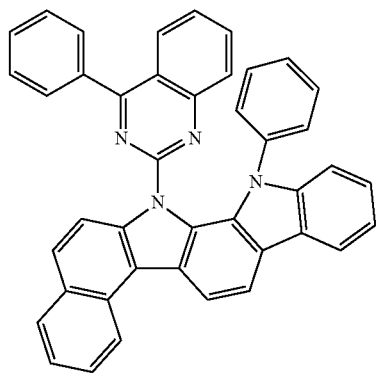
H46
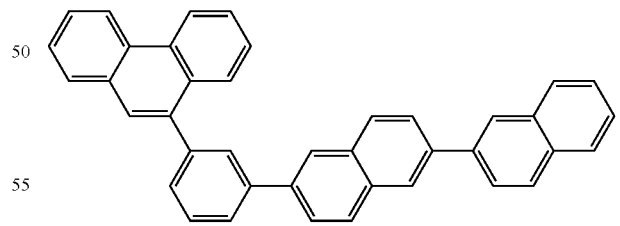
H47
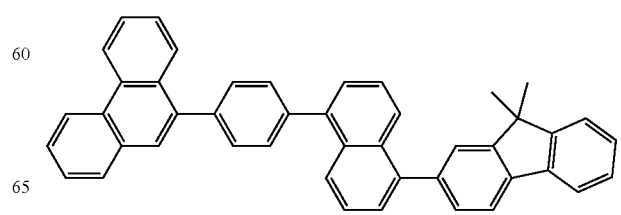
H48

H49
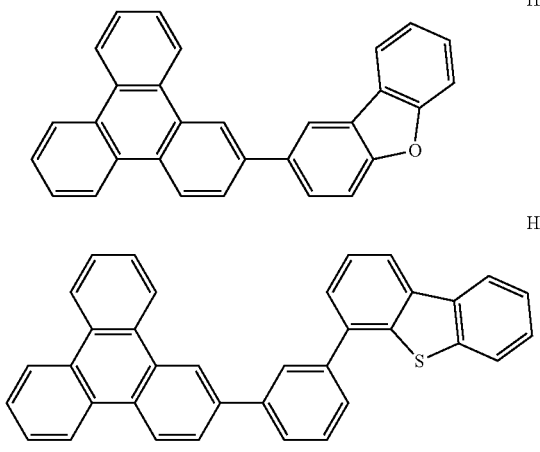

H50
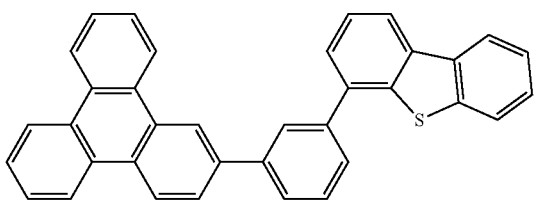

H51
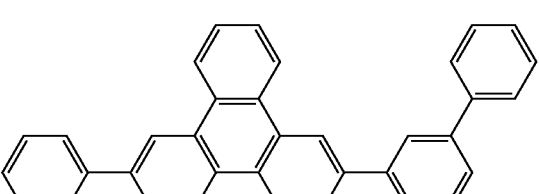

H52
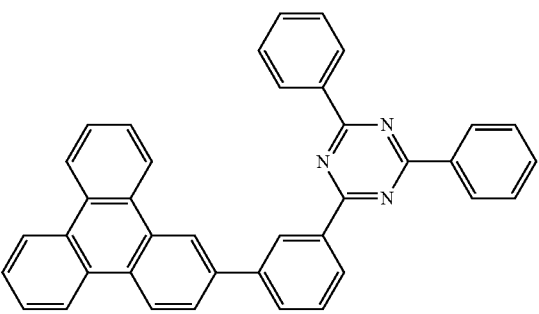

H53
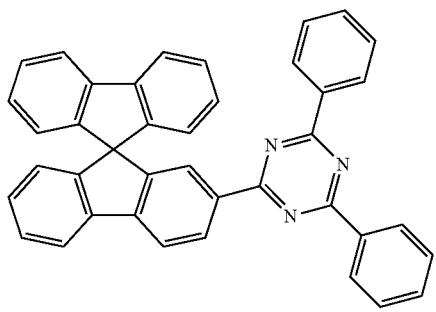

H54
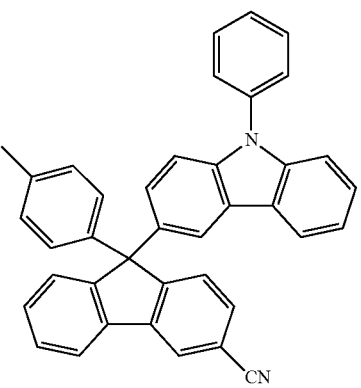

H55
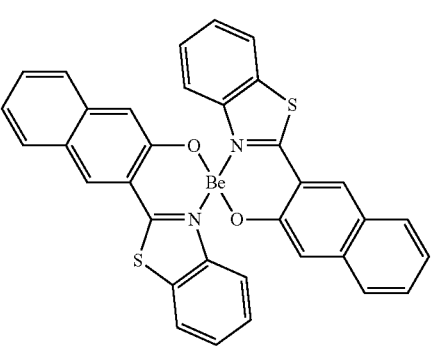

In one embodiment, the host may include at least one selected from a silicon-containing compound (for example, bis(4-(9H-carbazol-9-yl)phenyl)diphenylsilane (BCPDS) utilized in the following examples and/or the like) and a phosphine oxide-containing compound (for example, (4-(1-(4-(diphenylamino)phenyl)cyclohexyl)phenyl)diphenylphosphine oxide (POPCPA) utilized in the following examples and/or the like).

The host may include only one compound or may include two or more compounds that are different from each other (for example, the host of the following examples includes BCPDS and POPCPA). In one or more embodiment, the host may instead have various other modifications.

[Phosphorescent Dopant Included in Emission Layer in Organic Layer 150]

The phosphorescent dopant may include the organometallic compound represented by Formula 1.

In addition, the phosphorescent dopant may include an organometallic complex represented by Formula 401 below:

$$M(L_{401})_{xc1}(L_{402})_{xc2}$$

Formula 401

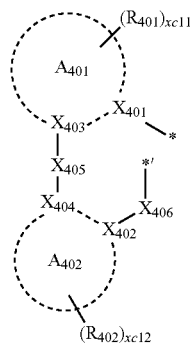

Formula 402

In Formulae 401 and 402,

M may be selected from iridium (Ir), platinum (Pt), palladium (Pd), osmium (Os), titanium (Ti), zirconium (Zr), hafnium (Hf), europium (Eu), terbium (Tb), rhodium (Rh), and thulium (Tm), $L_{401}$ may be a ligand represented by Formula 402, and xc1 may be 1, 2, or 3, wherein when xc1 is 2 or more, two or more of $L_{401}$(s) may be identical to or different from each other, $L_{402}$ may be an organic ligand, and xc2 may be an integer from 0 to 4, wherein when xc2 may be 2 or more, two or more of $L_{402}$(s) may be identical to or different from each other, $X_{401}$ to $X_{404}$ may each independently be nitrogen or carbon, $X_{401}$ and $X_{403}$ may be linked via a single bond or a double bond, and $X_{402}$ and $X_{404}$ may be linked via a single bond or a double bond, $A_{401}$ and $A_{402}$ may each independently be a $C_5$-$C_{60}$ carbocyclic group or a $C_1$-$C_{60}$ heterocyclic group, $X_{405}$ may be a single bond, *—O—*', *—S—*', *—C(=O)—*', *—N($Q_{411}$)—*', *—C($Q_{411}$)($Q_{412}$)—*', *—C($Q_{411}$)=C($Q_{412}$)—*', *—C($Q_{411}$)=*', or *=C=*', wherein $Q_{411}$ and $Q_{412}$ may each independently be hydrogen, deuterium, a $C_1$-$C_{20}$ alkyl group, a $C_1$-$C_{20}$ alkoxy group, a phenyl group, a biphenyl group, a terphenyl group, or a naphthyl group, $X_{406}$ may be a single bond, O, or S, $R_{401}$ and $R_{402}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{20}$ alkyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), and —P(=O)($Q_{401}$)($Q_{402}$), and $Q_{401}$ to $Q_{403}$ may each independently be selected from a $C_1$-$C_{10}$ alkyl group, a $C_1$-$C_{10}$ alkoxy group, a $C_6$-$C_{20}$ aryl group, and a $C_1$-$C_{20}$ heteroaryl group, xc11 and xc12 may each independently be an integer from 0 to 10, and and *' in Formula 402 each indicate a binding site to M in Formula 401.

In one embodiment, $A_{401}$ and $A_{402}$ in Formula 402 may each independently be selected from a benzene group, a naphthalene group, a fluorene group, a spiro-bifluorene group, an indene group, a pyrrole group, a thiophene group, a furan group, an imidazole group, a pyrazole group, a thiazole group, an isothiazole group, an oxazole group, an isoxazole group, a pyridine group, a pyrazine group, a pyrimidine group, a pyridazine group, a quinoline group, an isoquinoline group, a benzoquinoline group, a quinoxaline group, a quinazoline group, a carbazole group, a benzimidazole group, a benzofuran group, a benzothiophene group, an isobenzothiophene group, a benzoxazole group, an isobenzoxazole group, a triazole group, a tetrazole group, an oxadiazole group, a triazine group, a dibenzofuran group, and a dibenzothiophene group.

In one or more embodiments, in Formula 402, i) $X_{401}$ may be nitrogen and $X_{402}$ may be carbon, or ii) both $X_{401}$ and $X_{402}$ may be nitrogen.

In one or more embodiments, $R_{401}$ and $R_{402}$ in Formula 402 may each independently be selected from:

hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amidino group, a hydrazino group, a hydrazono group, a phenyl group, a naphthyl group, a cyclopentyl group, a cyclohexyl group, an adamantanyl group, a norbornanyl group, and a norbornenyl group;

a cyclopentyl group, a cyclohexyl group, an adamantanyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group;

a cyclopentyl group, a cyclohexyl group, an adamantanyl group, a norbornanyl group, a norbornenyl group a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, an adamantanyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group; and —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), and —P(=O)($Q_{401}$)($Q_{402}$), wherein $Q_{401}$ to $Q_{403}$ may each independently be selected from a $C_1$-$C_{10}$ alkyl group, a $C_1$-$C_{10}$ alkoxy group, a phenyl group, a biphenyl group, and a naphthyl group, but embodiments of the present disclosure are not limited thereto.

In one or more embodiments, when xc1 in Formula 401 is 2 or more, two $A_{401}$(s) in two or more of $L_{401}$(s) may optionally be linked to each other via $X_{407}$, which is a linking group, two $A_{402}$(s) may optionally be linked to each other via $X_{408}$, which is a linking group (see Compounds PD1 to PD4 and PD7). $X_{407}$ and $X_{408}$ may each independently be a single bond, *—C(=O)—*', *—N($Q_{413}$)—*', *—C($Q_{413}$)($Q_{414}$)—*', or *—C($Q_{413}$)=C($Q_{414}$)—*' (where $Q_{413}$ and $Q_{414}$ may each independently be hydrogen, deuterium, a $C_1$-$C_{20}$ alkyl group, a $C_1$-$C_{20}$ alkoxy group, a phenyl group, a biphenyl group, a terphenyl group, or a naphthyl group), but embodiments of the present disclosure are not limited thereto.

$L_{402}$ in Formula 401 may be a monovalent, divalent, or trivalent organic ligand. In one or more embodiments, $L_{402}$ may be selected from halogen, diketone (for example, acetylacetonate), carboxylic acid (for example, picolinate), —C(=O), isonitrile, —CN, and a phosphorus-containing material (for example, phosphine or phosphite), but embodiments of the present disclosure are not limited thereto.

In one or more embodiments, the phosphorescent dopant may be selected from, for example, Compounds PD1 to PD25, but embodiments of the present disclosure are not limited thereto:

PD1

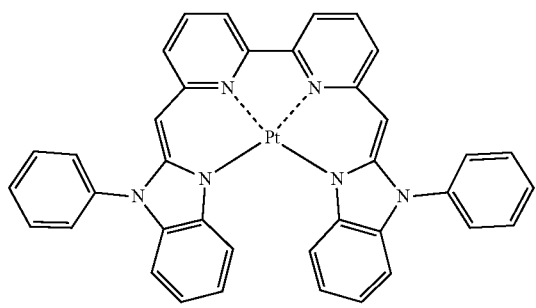

PD2

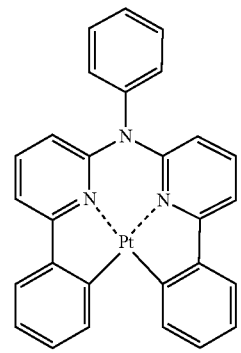

PD3

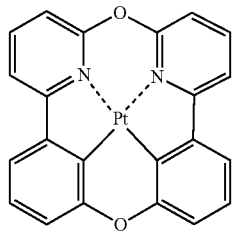

PD4

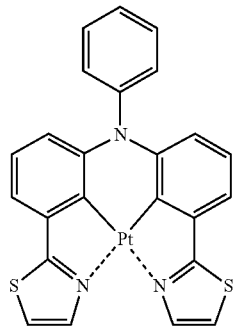

PD5

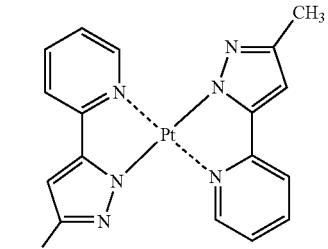

PD6

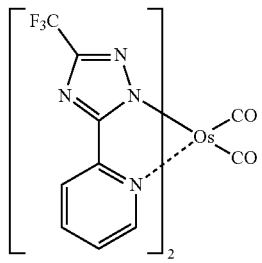

PD7

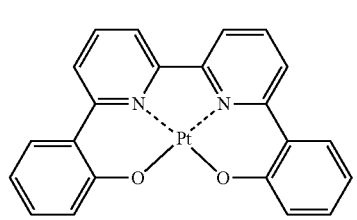

PD8

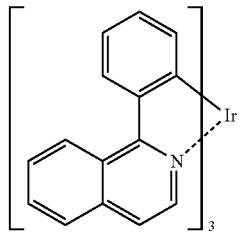

PD9 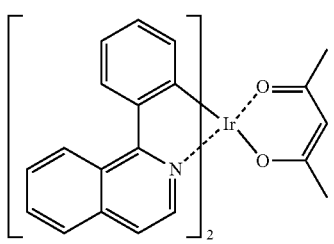
PD10 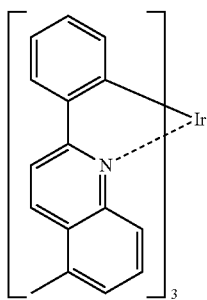
PD11 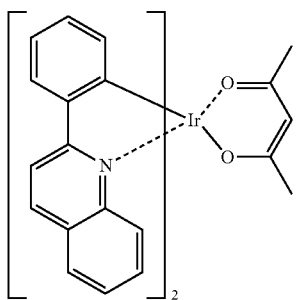
PD12 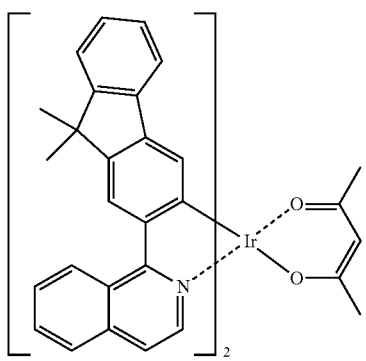
PD13 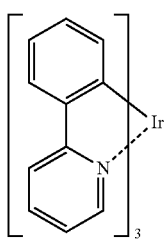
PD14 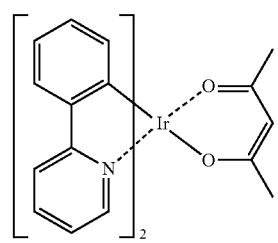
PD15 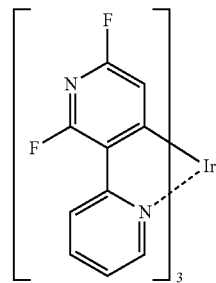
PD16 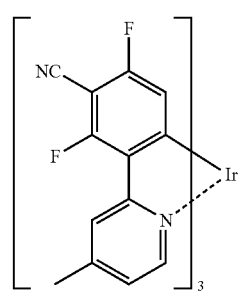
PD17 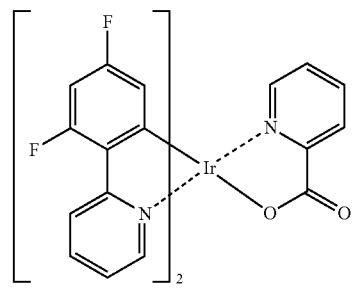
PD18 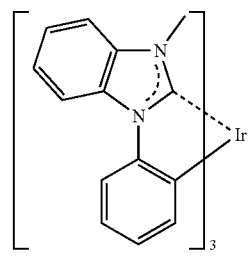

-continued

PD19
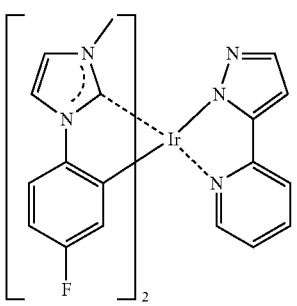

PD20
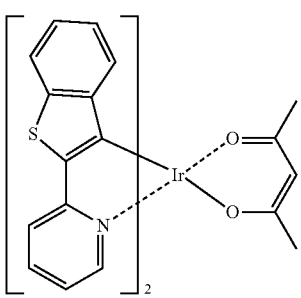

PD21
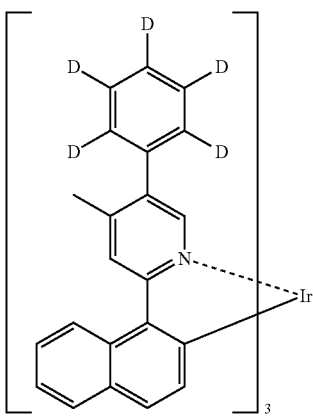

PD22
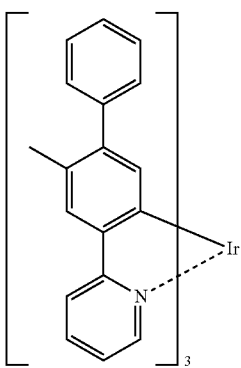

PD23
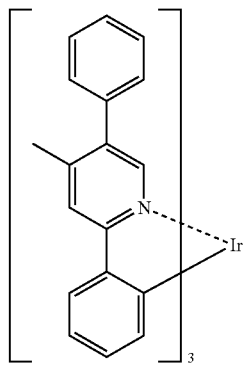

PD24
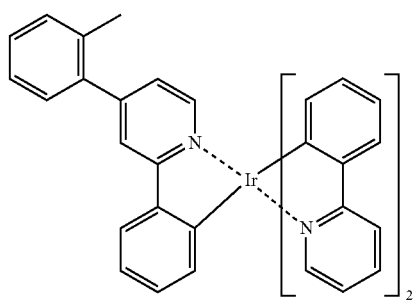

PD25
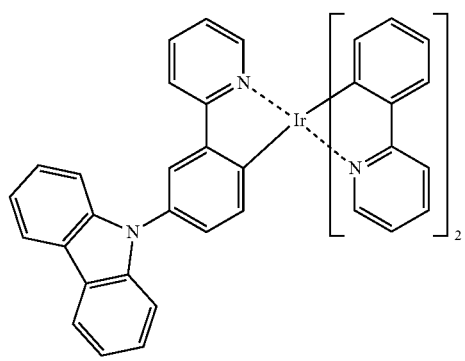

[Fluorescent Dopant in Emission Layer]

The fluorescent dopant may include an arylamine compound and/or a styrylamine compound.

The fluorescent dopant may include a compound represented by Formula 501 below.

Formula 501
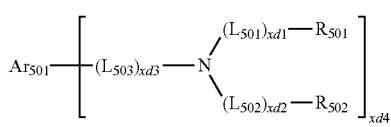

In Formula 501,

Ar$_{501}$ may be a substituted or unsubstituted C$_5$-C$_{60}$ carbocyclic group or a substituted or unsubstituted C$_1$-C$_{60}$ heterocyclic group, L$_{501}$ to L$_{503}$ may each independently be selected from a substituted or unsubstituted C$_3$-C$_{10}$ cycloalkylene group, a substituted or unsubstituted C$_1$-C$_{10}$ heterocycloalkylene group, a substituted or unsubstituted C$_3$-C$_{10}$ cycloalkenylene group, a substituted or unsubstituted C$_1$-C$_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xd1 to xd3 may each independently be an integer from 0 to 3, $R_{501}$ and $R_{502}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, and xd4 may be an integer from 1 to 6.

In one embodiment, $Ar_{501}$ in Formula 501 may be selected from:

a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, and an indenophenanthrene group; and a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, and an indenophenanthrene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In one or more embodiments, $L_{501}$ to $L_{503}$ in Formula 501 may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

In one or more embodiments, $R_{501}$ and $R_{502}$ in Formula 501 may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, and —Si($Q_{31}$)($Q_{32}$)($Q_{33}$), wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In one or more embodiments, xd4 in Formula 501 may be 2, but embodiments of the present disclosure are not limited thereto.

In one or more embodiments, the fluorescent dopant may be selected from Compounds FD1 to FD22:

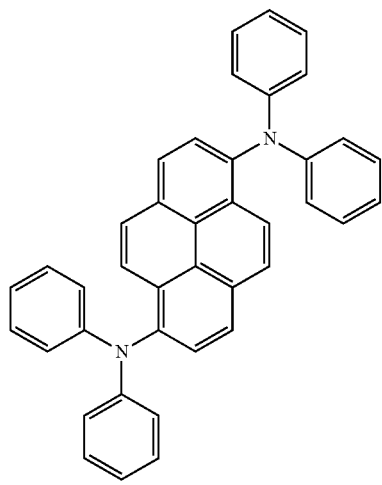

FD1

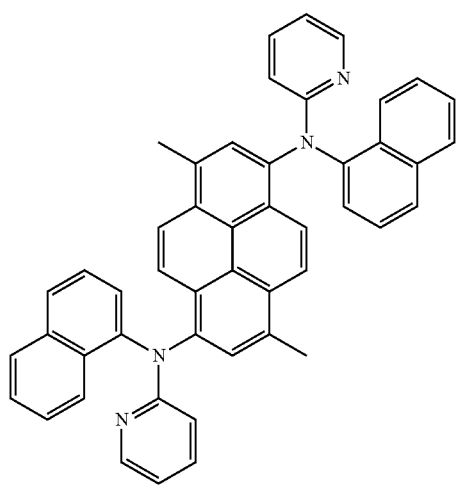

FD2

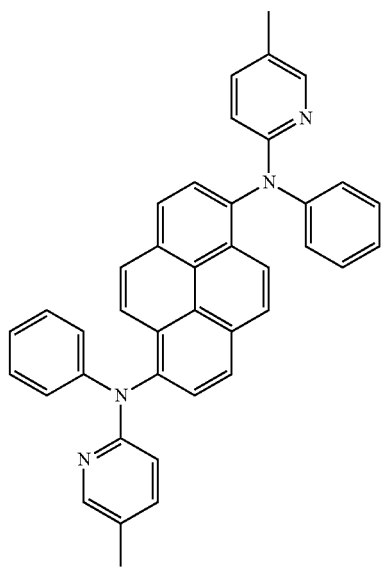

FD3

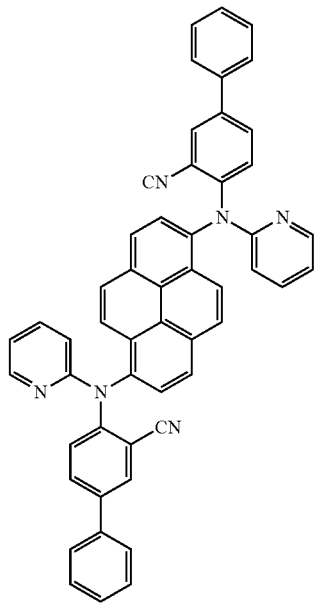

FD4

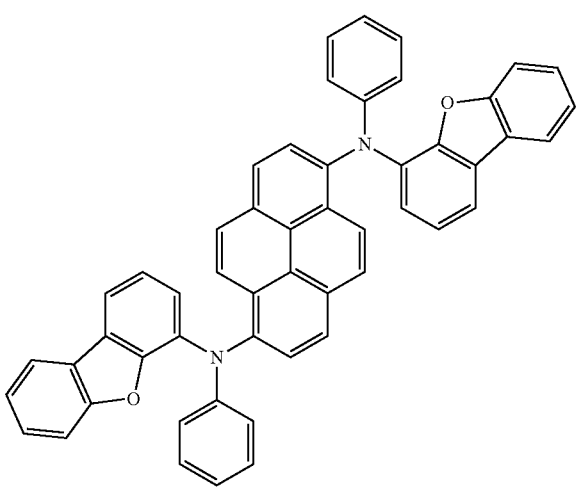

FD5

-continued
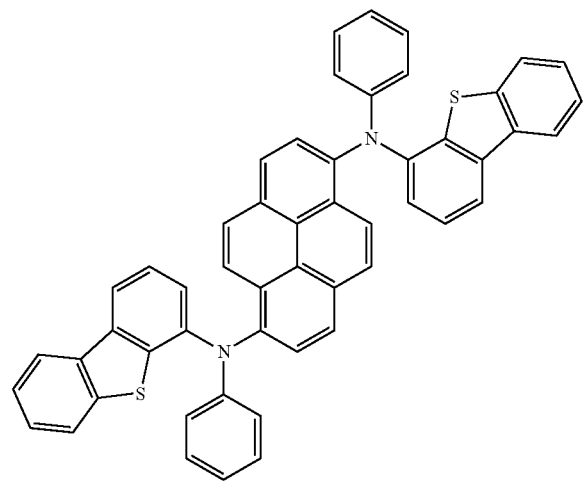
FD6
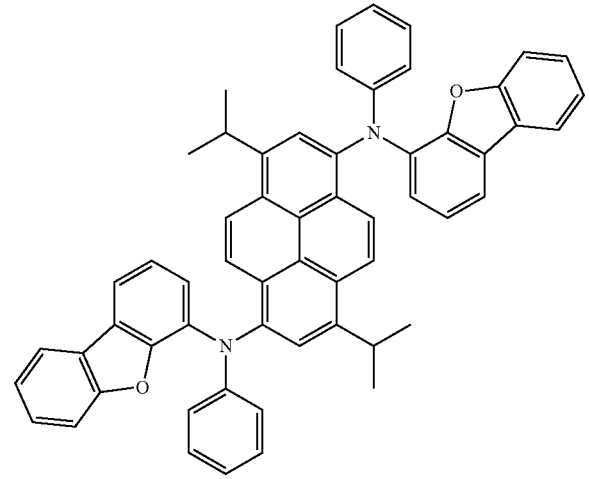
FD9
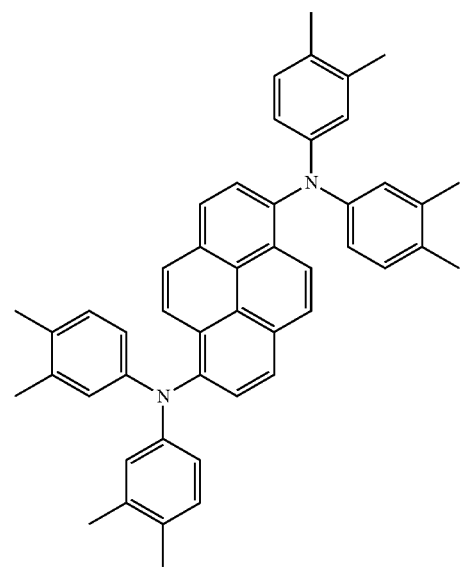
FD7
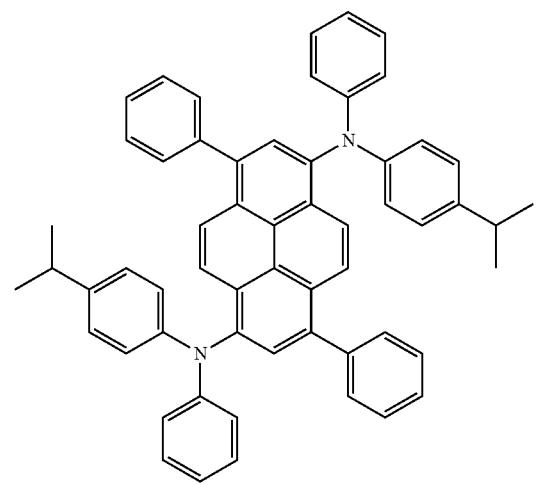
FD8
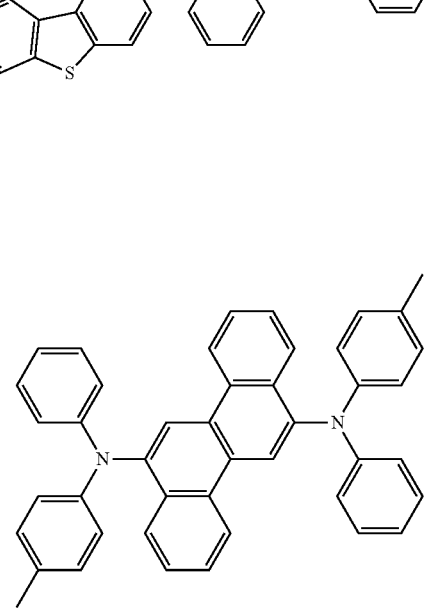
FD10
FD11
FD12

FD13
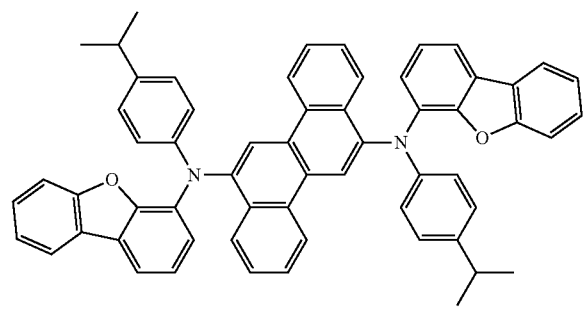
FD14
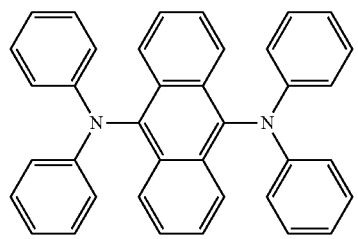
FD15
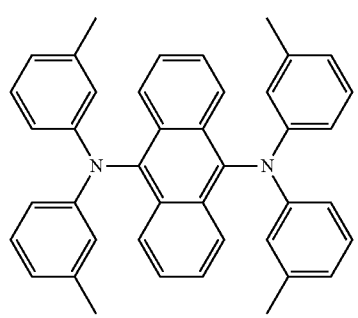
FD16
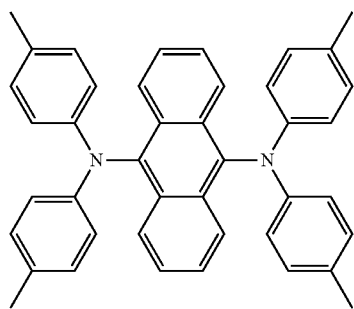
FD17
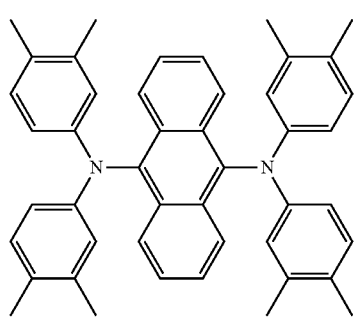
FD18
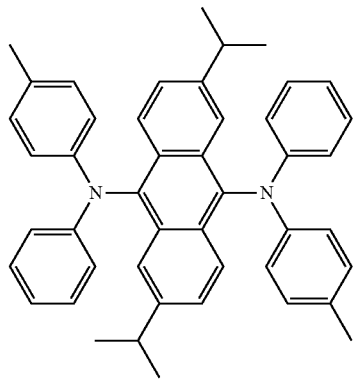
FD19
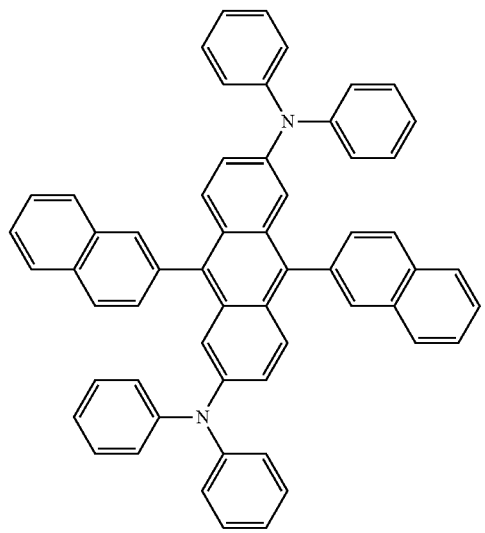
FD20
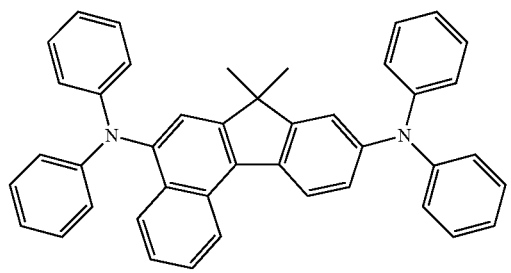
FD21
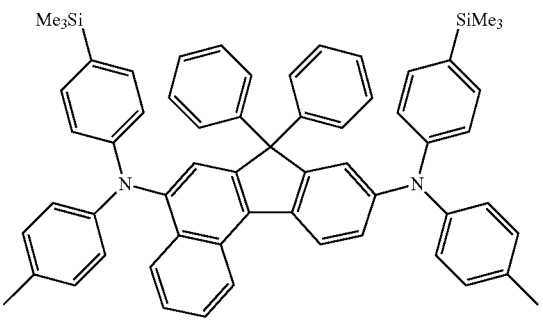

-continued

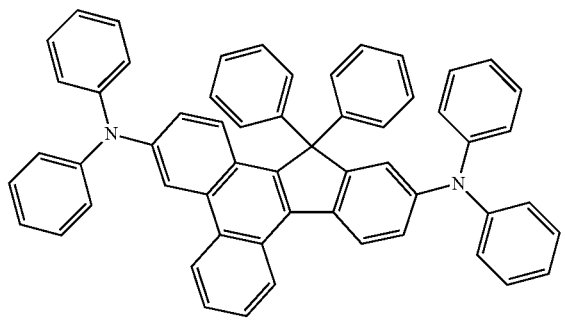

FD22

In one or more embodiments, the fluorescent dopant may be selected from the following compounds, but embodiments of the present disclosure are not limited thereto.

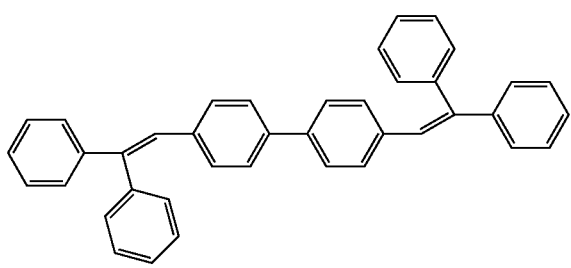

DPVBi

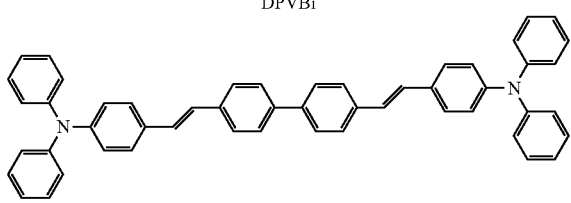

DPAVBi

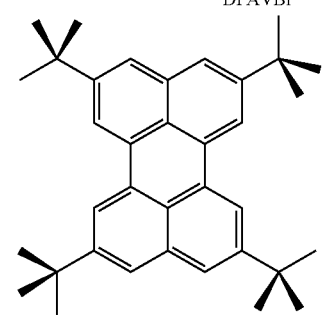

TBPe

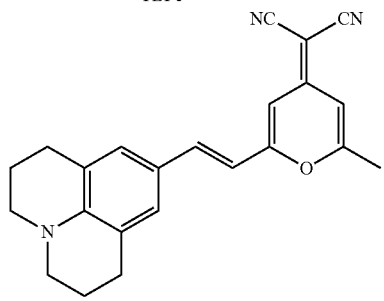

DCM

-continued

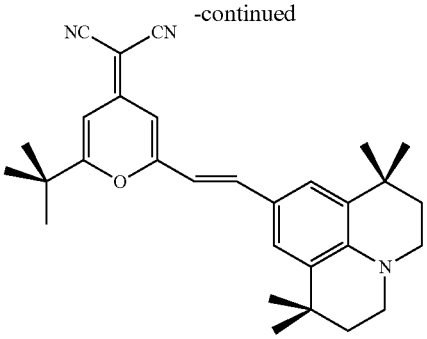

DCJTB

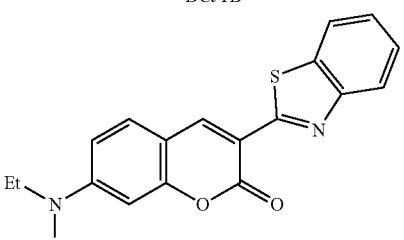

Coumarin 6

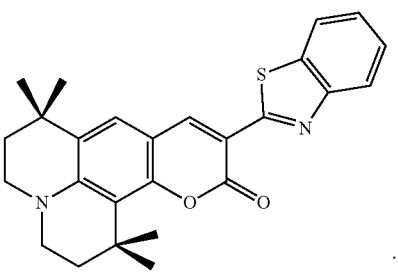

C545T

[Electron Transport Region in Organic Layer 150]

The electron transport region may have i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure having a plurality of layers including (e.g., consisting of) a plurality of different materials.

The electron transport region may include at least one selected from a buffer layer, a hole blocking layer, an electron control layer, an electron transport layer, and an electron injection layer, but embodiments of the present disclosure are not limited thereto.

In one or more embodiments, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein for each structure, constituting layers are sequentially stacked from the emission layer in the respective stated order. However, embodiments of the present disclosure are not limited thereto.

The electron transport region (for example, a buffer layer, a hole blocking layer, an electron control layer, or an electron transport layer in the electron transport region) may include a metal-free compound containing at least one 7-electron-deficient nitrogen-containing ring.

The "π-electron-deficient nitrogen-containing ring" refers to a $C_1$-$C_{60}$ heterocyclic group having at least one *—N=*' moiety as a ring-forming moiety.

For example, the "π-electron-deficient nitrogen-containing ring" may be i) a 5-membered to 7-membered heteromonocyclic group having at least one *—N=*' moiety, ii) a heteropolycyclic group in which two or more 5-membered to 7-membered heteromonocyclic groups each having at least one *—N=*' moiety are condensed with each other, or iii) a heteropolycyclic group in which at least one of 5-membered to 7-membered heteromonocyclic groups, each having at least one *—N=*' moiety, is condensed with at least one $C_5$-$C_{60}$ carbocyclic group.

Examples of the π-electron-deficient nitrogen-containing ring include an imidazole ring, a pyrazole ring, a thiazole ring, an isothiazole ring, an oxazole ring, an isoxazole ring, a pyridine ring, a pyrazine ring, a pyrimidine ring, a pyridazine ring, an indazole ring, a purine ring, a quinoline ring, an isoquinoline ring, a benzoquinoline ring, a phthalazine ring, a naphthyridine ring, a quinoxaline ring, a quinazoline ring, a cinnoline ring, a phenanthridine ring, an acridine ring, a phenanthroline ring, a phenazine ring, a benzimidazole ring, an isobenzothiazole ring, a benzoxazole ring, an isobenzoxazole ring, a triazole ring, a tetrazole ring, an oxadiazole ring, a triazine ring, a thiadiazole ring, an imidazopyridine ring, an imidazopyrimidine ring, and an azacarbazole ring, but are not limited thereto.

In one or more embodiments, the electron transport region may include a compound represented by Formula 601 below:

[Ar$_{601}$]$_{xe11}$-[(L$_{601}$)$_{xe1}$-R$_{601}$]$_{xe21}$     Formula 601

In Formula 601,

Ar$_{601}$ may be a substituted or unsubstituted $C_5$-$C_{60}$ carbocyclic group or a substituted or unsubstituted $C_1$-$C_{60}$ heterocyclic group, xe11 may be 1, 2, or 3, L$_{601}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xe1 may be an integer from 0 to 5, R$_{601}$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si(Q$_{601}$)(Q$_{602}$)(Q$_{603}$), —C(=O)(Q$_{601}$), —S(=O)$_2$(Q$_{601}$), and —P(=O)(Q$_{601}$)(Q$_{602}$), Q$_{601}$ to Q$_{603}$ may each independently be a $C_1$-$C_{10}$ alkyl group, a $C_1$-$C_{10}$ alkoxy group, a phenyl group, a biphenyl group, a terphenyl group, or a naphthyl group, and xe21 may be an integer from 1 to 5.

In one embodiment, at least one of Ar$_{601}$(s) in the number of xe11 and R$_{601}$(s) in the number of xe21 may include the π-electron-deficient nitrogen-containing ring.

In one embodiment, Ar$_{601}$ in Formula 601 may be selected from:

a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group; and a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si(Q$_{31}$)(Q$_{32}$)(Q$_{33}$), —S(=O)$_2$(Q$_{31}$), and —P(=O)(Q$_{31}$)(Q$_{32}$), wherein Q$_{31}$ to Q$_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

When xe11 in Formula 601 is 2 or more, two or more of Ar$_{601}$(s) may be linked to each other via a single bond.

In one or more embodiments, $Ar_{601}$ in Formula 601 may be an anthracene group.

In one or more embodiments, the compound represented by Formula 601 may be represented by Formula 601-1:

Formula 601-1

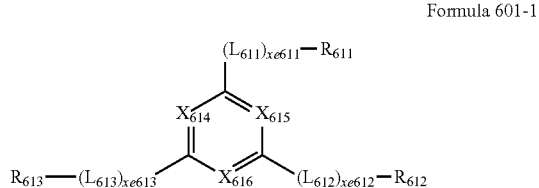

In Formula 601-1, $X_{614}$ may be N or $C(R_{614})$, $X_{615}$ may be N or $C(R_{615})$, $X_{616}$ may be N or $C(R_{616})$, and at least one of $X_{614}$ to $X_{616}$ may be N, $L_{611}$ to $L_{613}$ may each independently be the same as described in connection with $L_{601}$, xe611 to xe613 may each independently be the same as described in connection with xe1, $R_{611}$ to $R_{613}$ may each independently be the same as described in connection with $R_{601}$, and $R_{614}$ to $R_{616}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In one embodiment, $L_{601}$ and $L_{611}$ to $L_{613}$ in Formulae 601 and 601-1 may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, but embodiments of the present disclosure are not limited thereto.

In one or more embodiments, xe1 and xe611 to xe613 in Formulae 601 and 601-1 may each independently be 0, 1, or 2.

In one or more embodiments, $R_{601}$ and $R_{611}$ to $R_{613}$ in Formulae 601 and 601-1 may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group;

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and —S(=O)$_2$(Q$_{601}$) and —P(=O)(Q$_{601}$)(Q$_{602}$), wherein $Q_{601}$ and $Q_{602}$ may each independently be the same as described above.

The electron transport region may include at least one compound selected from Compounds ET1 to ET36, but embodiments of the present disclosure are not limited thereto:

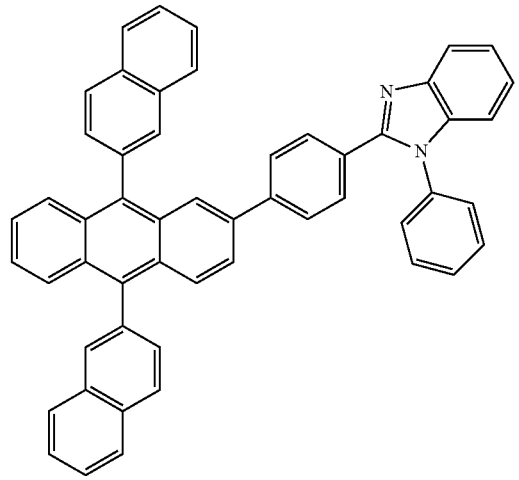

ET1

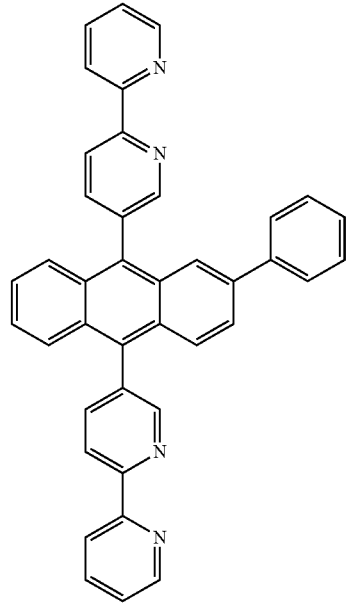

ET2

ET3
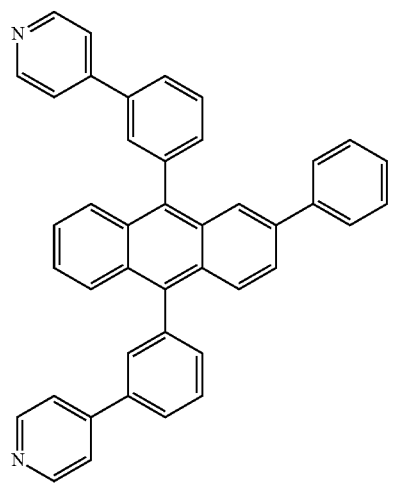
ET6
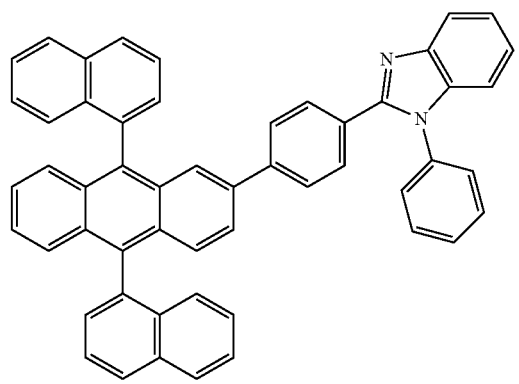
ET4
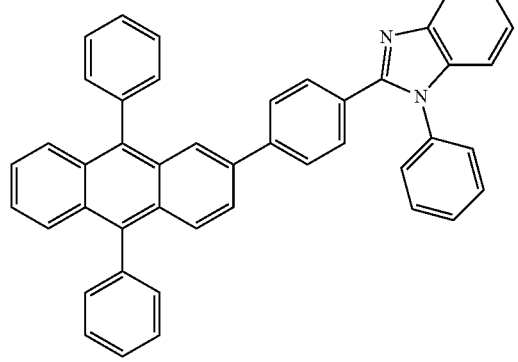
ET7
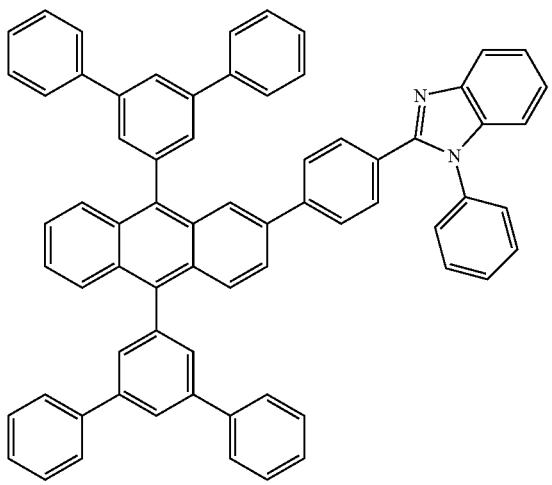
ET5
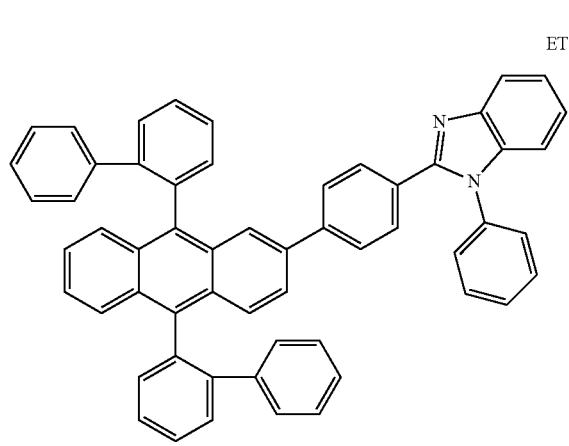
ET8
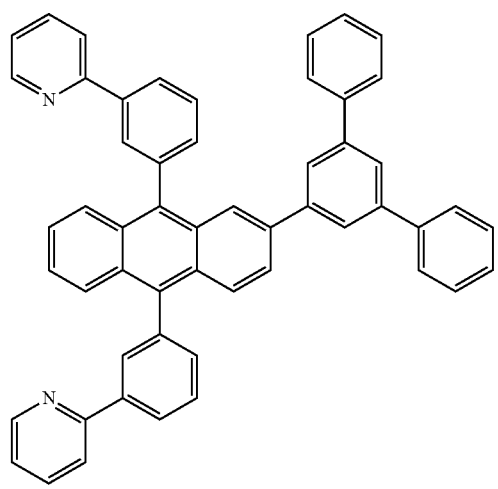

ET9
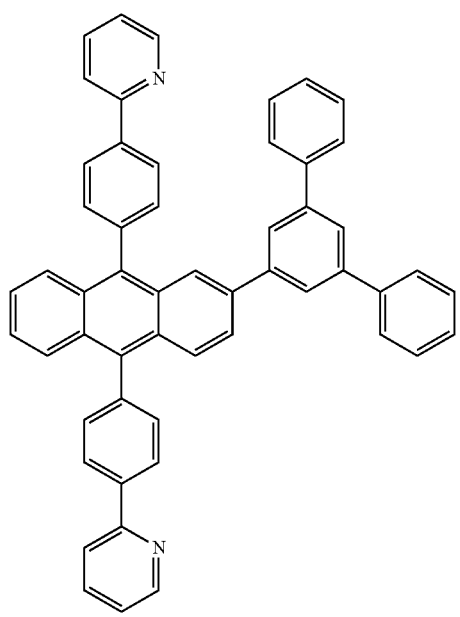
ET11
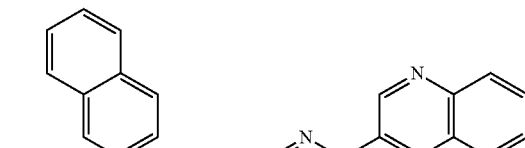
ET12
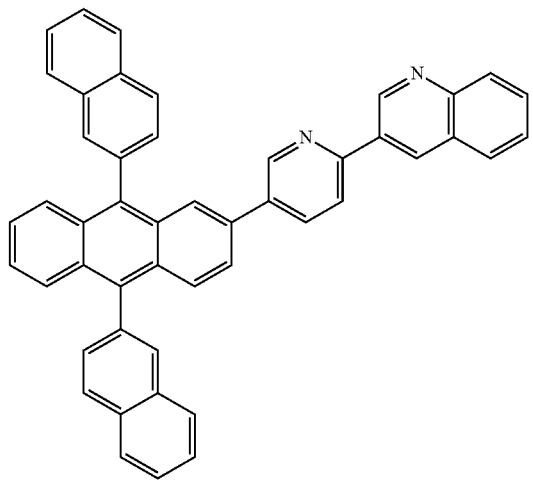
ET10
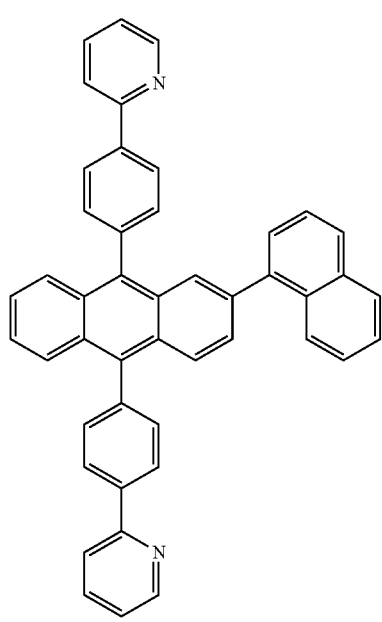
ET13
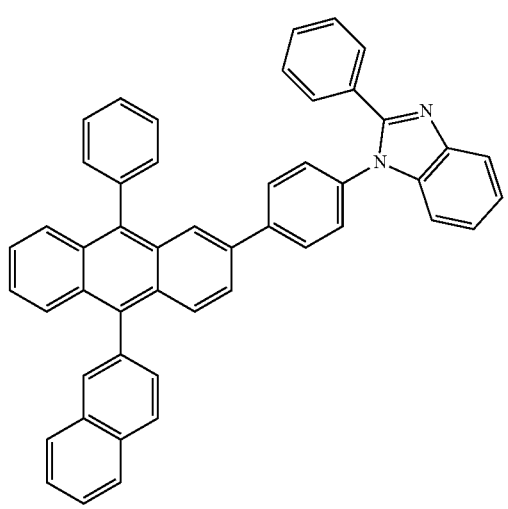

ET14
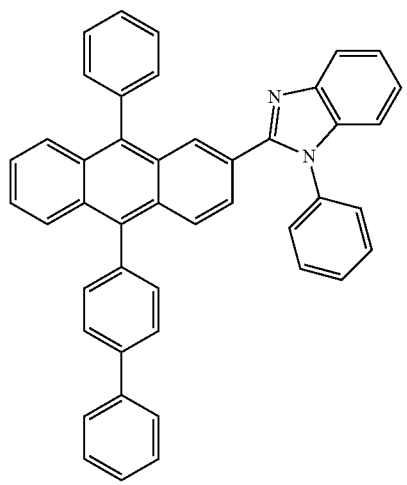
ET15
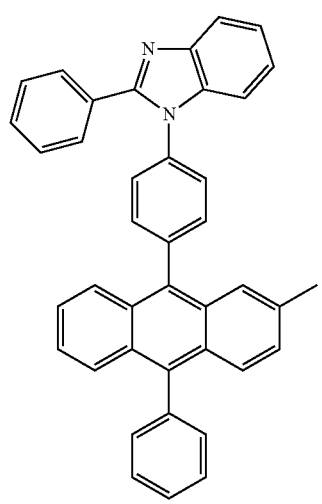
ET16
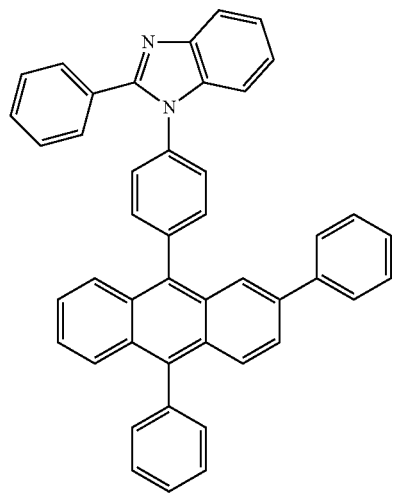
ET17
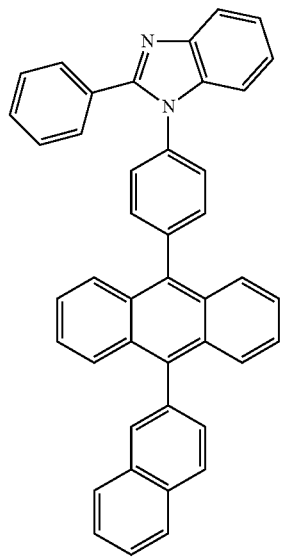
ET18
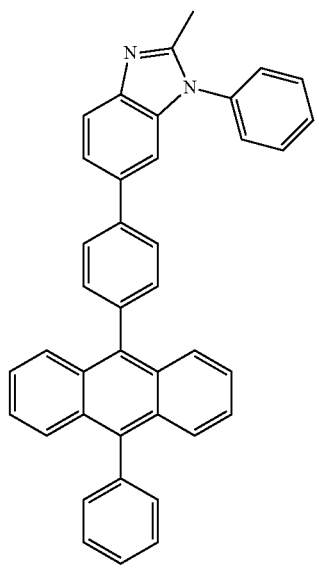
ET19
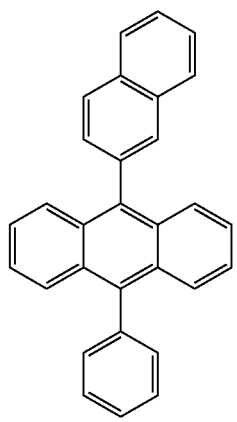

ET20
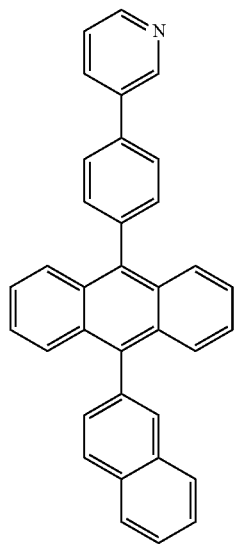
ET21
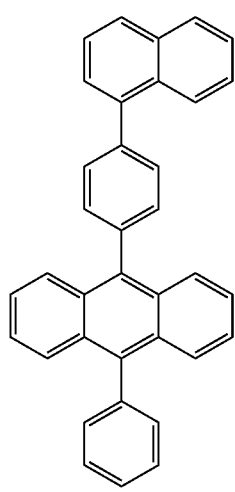
ET22
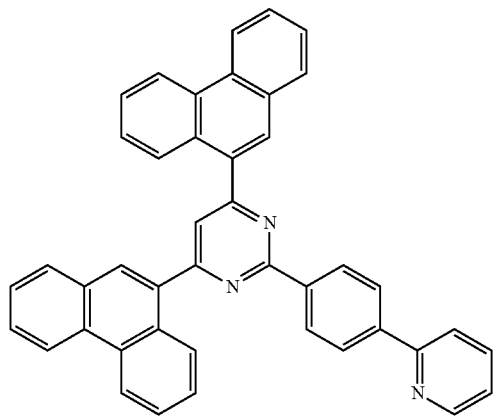
ET23
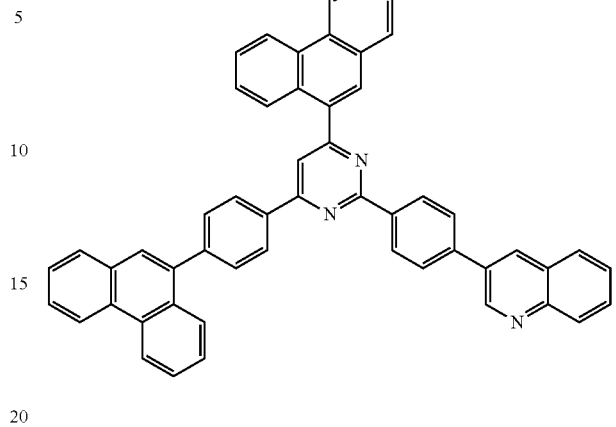
ET24
ET25
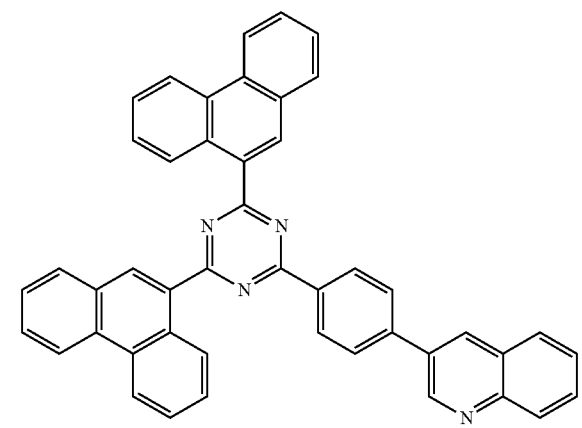

ET26
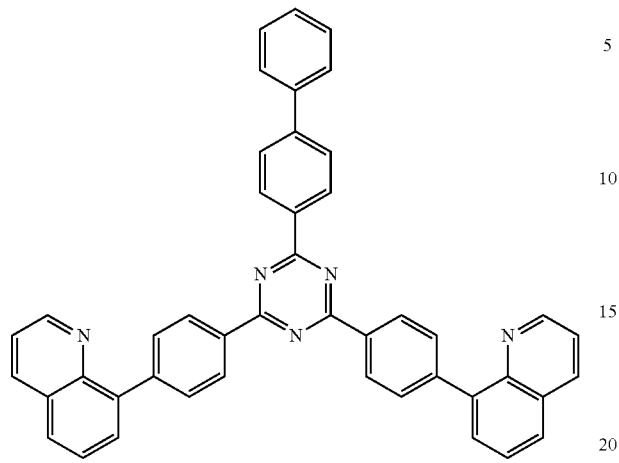
ET27
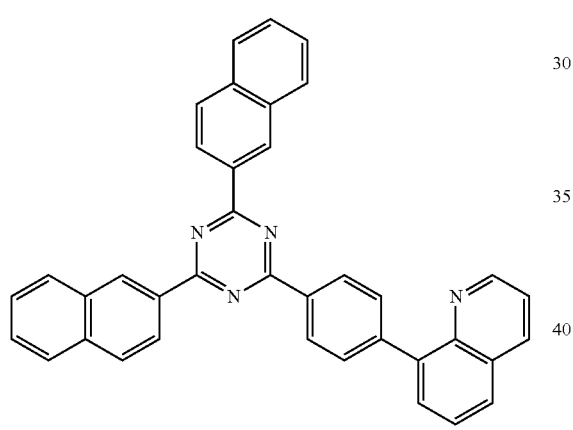
ET28
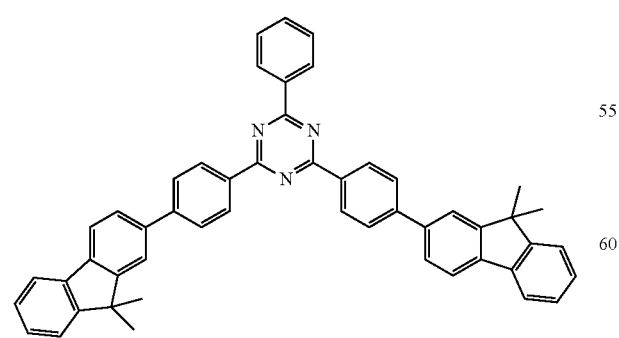
ET29
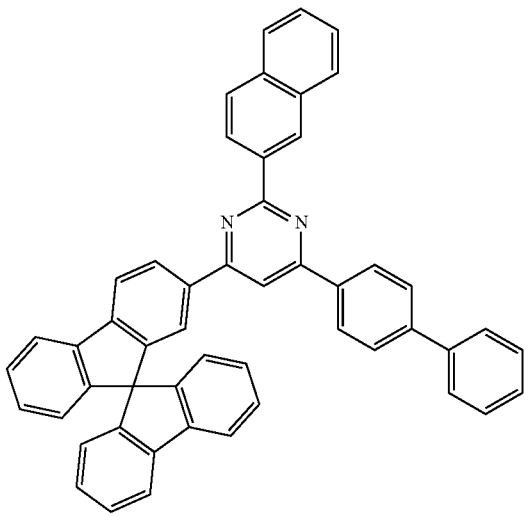
ET30
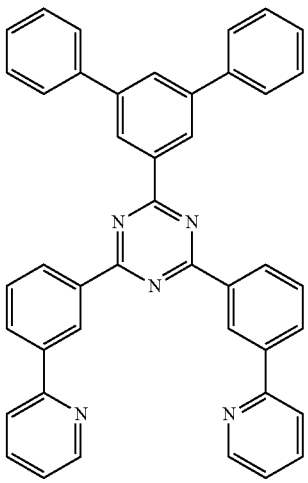
ET31
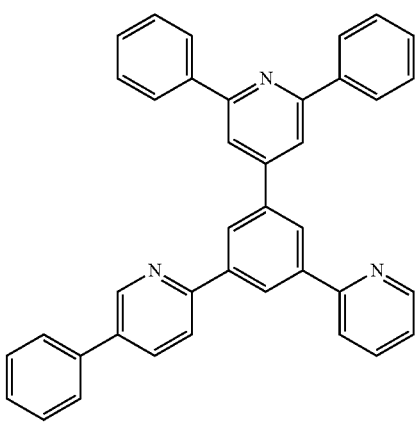

ET32
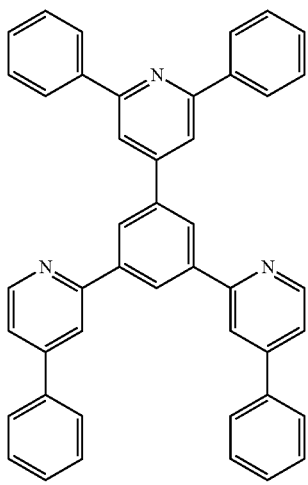
ET35
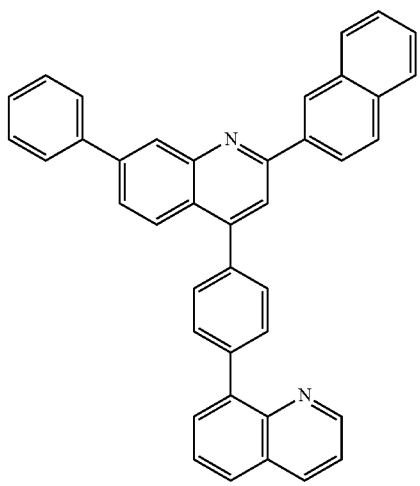
ET33
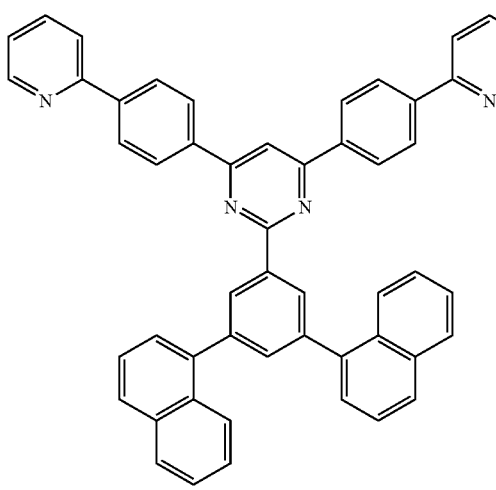
ET36
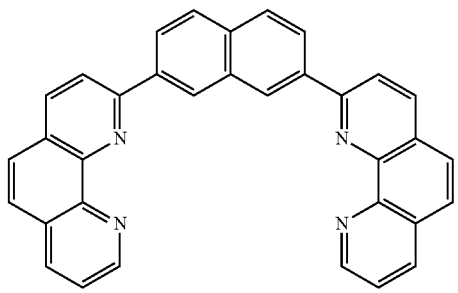
In one or more embodiments, the electron transport region may include at least one compound selected from 2,9-dimethyl-4,7-diphenyl-1,10-phenanthroline (BCP), 4,7-diphenyl-1,10-phenanthroline (Bphen), Alq3, BAlq, 3-(biphenyl-4-yl)-5-(4-tert-butylphenyl)-4-phenyl-4H-1,2,4-triazole (TAZ), and NTAZ.
ET34
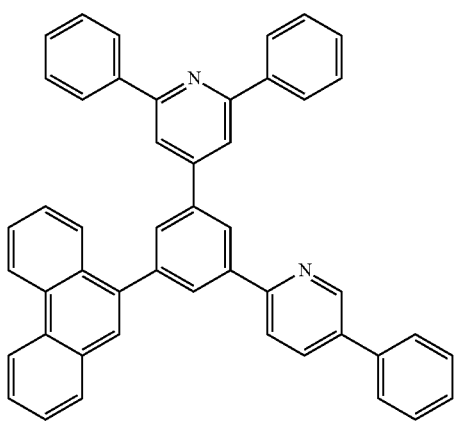
Alq3
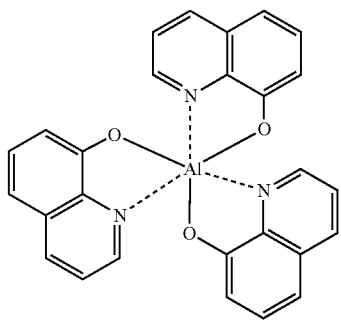

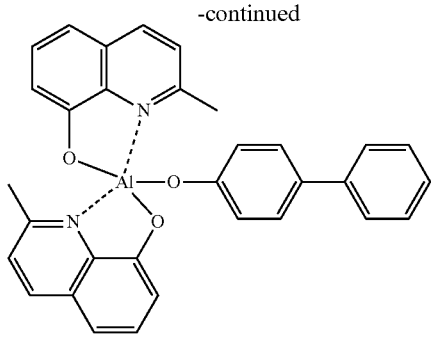

BAlq

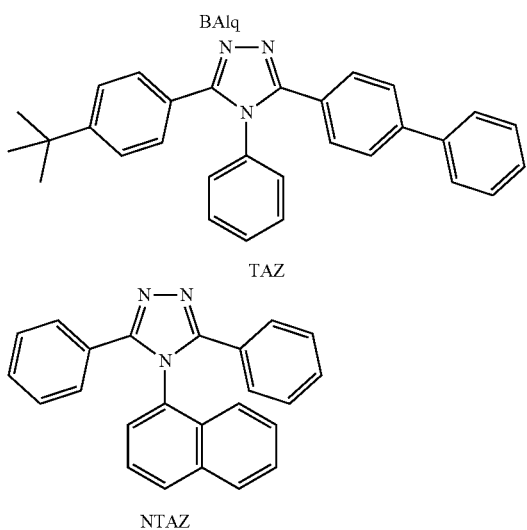

TAZ

NTAZ

In one or more embodiments, the electron transport region may include a phosphine oxide-containing compound, but embodiments of the present disclosure are not limited thereto. In one embodiment, the phosphine oxide-containing compound may be utilized in a hole blocking layer in the electron transport region, but embodiments of the present disclosure are not limited thereto.

Thicknesses of the buffer layer, the hole blocking layer, and the electron control layer may each independently be in a range of about 20 Å to about 1,000 Å, for example, about 30 Å to about 300 Å. When the thicknesses of the buffer layer, the hole blocking layer, and the electron control layer are within these ranges, excellent hole blocking characteristics or excellent electron control characteristics may be obtained without a substantial increase in driving voltage.

A thickness of the electron transport layer may be in a range of about 100 Å to about 1,000 Å, for example, about 150 Å to about 500 Å. When the thickness of the electron transport layer is within the ranges described above, satisfactory electron transport characteristics may be obtained without a substantial increase in driving voltage.

The electron transport region (for example, the electron transport layer in the electron transport region) may further include, in addition to the materials described above, a metal-containing material.

The metal-containing material may include at least one selected from an alkali metal complex and an alkaline earth-metal complex. A metal ion of the alkali metal complex may be selected from a $L_1$ ion, a Na ion, a K ion, a Rb ion, and a Cs ion, and a metal ion of the alkaline earth-metal complex may be selected from a Be ion, a Mg ion, a Ca ion, a Sr ion, and a Ba ion. A ligand coordinated with the metal ion of the alkali metal complex or the alkaline earth-metal complex may be selected from a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy phenyloxadiazole, a hydroxy phenylthiadiazole, a hydroxy phenylpyridine, a hydroxy phenylbenzimidazole, a hydroxy phenylbenzothiazole, a bipyridine, a phenanthroline, and a cyclopentadiene, but embodiments of the present disclosure are not limited thereto.

In one or more embodiments, the metal-containing material may include a Li complex. The $L_1$ complex may include, for example, Compound ET-D1 (lithium quinolate, LiQ) or ET-D2:

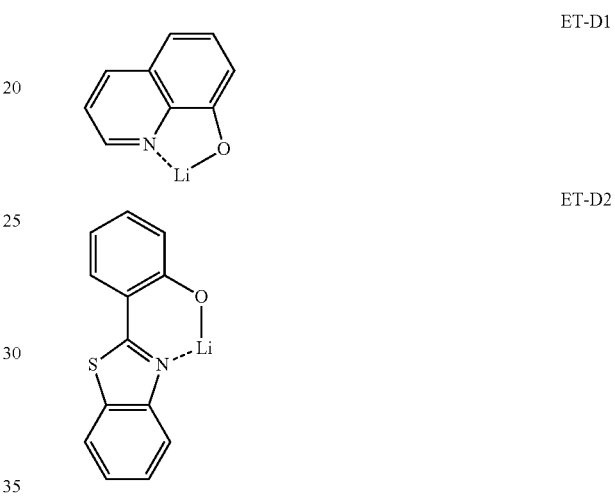

The electron transport region may include an electron injection layer that facilitates electron injection from the second electrode 190. The electron injection layer may directly contact the second electrode 190.

The electron injection layer may have i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure having a plurality of layers including (e.g., consisting of) a plurality of different materials.

The electron injection layer may include an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combination thereof.

The alkali metal may be selected from Li, Na, K, Rb, and Cs. In one embodiment, the alkali metal may be Li, Na, or Cs. In one or more embodiments, the alkali metal may be $L_1$ or Cs, but embodiments of the present disclosure are not limited thereto.

The alkaline earth metal may be selected from Mg, Ca, Sr, and Ba.

The rare earth metal may be selected from Sc, Y, Ce, Tb, Yb, and Gd.

The alkali metal compound, the alkaline earth-metal compound, and the rare earth metal compound may be selected from oxides and halides (for example, fluorides, chlorides, bromides, or iodides) of the alkali metal, the alkaline earth-metal, and the rare earth metal.

The alkali metal compound may be selected from alkali metal oxides, such as $Li_2O$, $Cs_2O$, and/or $K_2O$, and alkali metal halides, such as LiF, NaF, CsF, KF, LiI, NaI, CsI, and/or KI. In one embodiment, the alkali metal compound may be selected from LiF, $Li_2O$, NaF, LiI, NaI, CsI, and KI, but embodiments of the present disclosure are not limited thereto.

The alkaline earth-metal compound may be selected from alkaline earth-metal oxides, such as BaO, SrO, CaO, $Ba_xSr_{1-x}O$ (0<x<1), and/or $Ba_xCa_{1-x}O$ (0<x<1). In one embodiment, the alkaline earth-metal compound may be selected from BaO, SrO, and CaO, but embodiments of the present disclosure are not limited thereto.

The rare earth metal compound may be selected from $YbF_3$, $ScF_3$, $Sc_2O_3$, $Y_2O_3$, $Ce_2O_3$, $GdF_3$ and $TbF_3$. In one embodiment, the rare earth metal compound may be selected from $YbF_3$, $ScF_3$, $TbF_3$, $YbI_3$, $ScI_3$, and $TbI_3$, but embodiments of the present disclosure are not limited thereto.

The alkali metal complex, the alkaline earth-metal complex, and the rare earth metal complex may include an ion of the alkali metal, the alkaline earth-metal, and the rare earth metal, and a ligand coordinated with a metal ion of the alkali metal complex, the alkaline earth-metal complex, or the rare earth metal complex may be selected from hydroxy quinoline, hydroxy isoquinoline, hydroxy benzoquinoline, hydroxy acridine, hydroxy phenanthridine, hydroxy phenyloxazole, hydroxy phenylthiazole, hydroxy phenyloxadiazole, hydroxy phenylthiadiazole, hydroxy phenylpyridine, hydroxy phenylbenzimidazole, hydroxy phenylbenzothiazole, bipyridine, phenanthroline, and cyclopentadiene, but embodiments of the present disclosure are not limited thereto.

The electron injection layer may include (e.g., consist of) an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combination thereof, as described above. In one or more embodiments, the electron injection layer may further include an organic material. When the electron injection layer further includes an organic material, the alkali metal, the alkaline earth metal, the rare earth metal, the alkali metal compound, the alkaline earth-metal compound, the rare earth metal compound, the alkali metal complex, the alkaline earth-metal complex, the rare earth metal complex, or any combination thereof may be homogeneously or non-homogeneously dispersed in a matrix including the organic material.

A thickness of the electron injection layer may be in a range of about 1 Å to about 100 Å, for example, about 3 Å to about 90 Å. When the thickness of the electron injection layer is within the ranges described above, the electron injection layer may have satisfactory electron injection characteristics without a substantial increase in driving voltage.

[Second Electrode 190]

The second electrode 190 is located on the organic layer 150 having such a structure. The second electrode 190 may be a cathode which is an electron injection electrode, and in this regard, a material for forming the second electrode 190 may be selected from a metal, an alloy, an electrically conductive compound, and a combination thereof, which have a relatively low work function.

The second electrode 190 may include at least one selected from lithium (Li), silver (Ag), magnesium (Mg), aluminum ($A_1$), aluminum-lithium ($A_1$-Li), calcium (Ca), magnesium-indium (Mg—In), magnesium-silver (Mg—Ag), ITO, and IZO, but embodiments of the present disclosure are not limited thereto. The second electrode 190 may be a transmissive electrode, a semi-transmissive electrode, or a reflective electrode.

The second electrode 190 may have a single-layered structure or a multi-layered structure including two or more layers.

Figure 3:
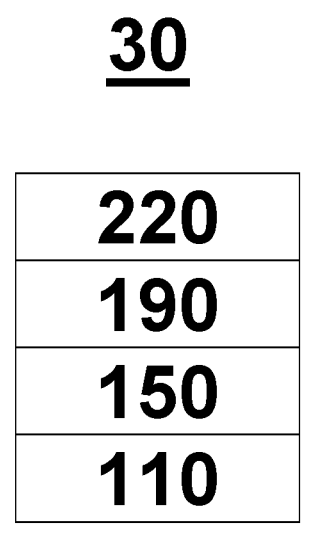
Figure 4:
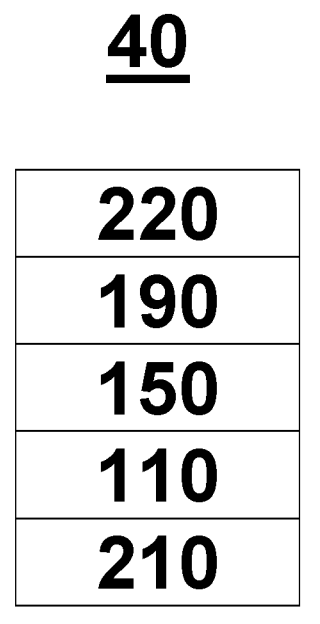

[Description of FIGS. 2 to 4]

Figure 2:
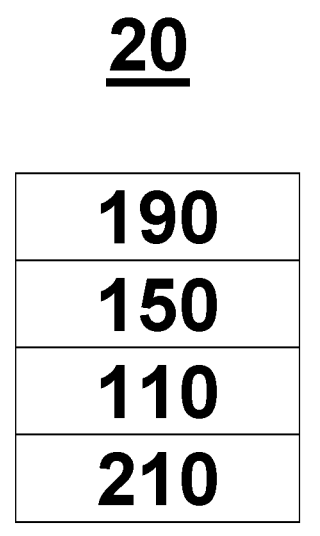

An organic light-emitting device 20 of FIG. 2 includes a first capping layer 210, a first electrode 110, an organic layer 150, and a second electrode 190 which are sequentially stacked in this stated order, an organic light-emitting device 30 of FIG. 3 includes a first electrode 110, an organic layer 150, a second electrode 190, and a second capping layer 220 which are sequentially stacked in this stated order, and an organic light-emitting device 40 of FIG. 4 includes a first capping layer 210, a first electrode 110, an organic layer 150, a second electrode 190, and a second capping layer 220 which are sequentially stacked in this stated order.

Regarding FIGS. 2 to 4, the first electrode 110, the organic layer 150, and the second electrode 190 may be understood by referring to the description presented in connection with FIG. 1.

In the organic layer 150 of each of the organic light-emitting devices 20 and 40, light generated in an emission layer may pass through the first electrode 110, which is a semi-transmissive electrode or a transmissive electrode, and the first capping layer 210 toward the outside, and in the organic layer 150 of each of the organic light-emitting devices 30 and 40, light generated in an emission layer may pass through the second electrode 190, which is a semi-transmissive electrode or a transmissive electrode, and the second capping layer 220 toward the outside.

The first capping layer 210 and the second capping layer 220 may increase external luminescence efficiency according to the principle of constructive interference.

The first capping layer 210 and the second capping layer 220 may each independently be an organic capping layer including (e.g., consisting of) an organic material, an inorganic capping layer including (e.g., consisting of) an inorganic material, or a composite capping layer including an organic material and an inorganic material.

At least one of the first capping layer 210 and the second capping layer 220 may each independently include at least one material selected from carbocyclic compounds, heterocyclic compounds, amine-based compounds, porphyrine derivatives, phthalocyanine derivatives, naphthalocyanine derivatives, alkali metal complexes, and alkaline earth-metal complexes. The carbocyclic compound, the heterocyclic compound, and the amine-based compound may be optionally substituted with a substituent containing at least one element selected from O, N, S, Se, Si, F, Cl, Br, and I. In one embodiment, at least one of the first capping layer 210 and the second capping layer 220 may each independently include an amine-based compound.

In one embodiment, at least one of the first capping layer 210 and the second capping layer 220 may each independently include the compound represented by Formula 201 or the compound represented by Formula 202.

In one or more embodiments, at least one of the first capping layer 210 and the second capping layer 220 may each independently include a compound selected from Compounds HT28 to HT33 and Compounds CP1 to CP5, but embodiments of the present disclosure are not limited thereto.

CP1
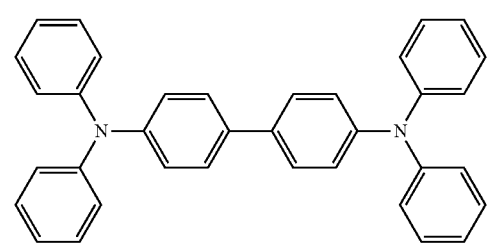

CP2
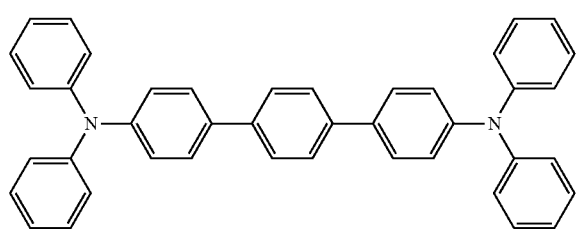

CP3
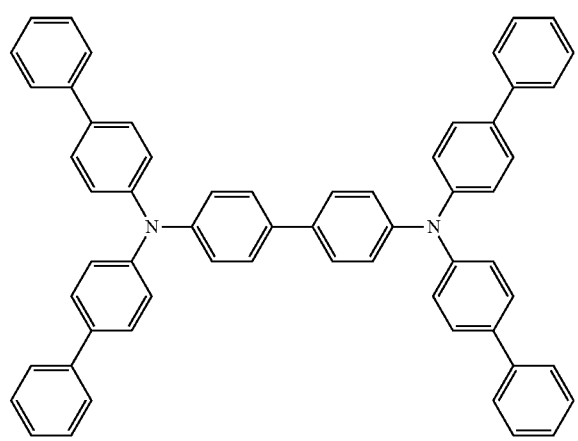

CP4
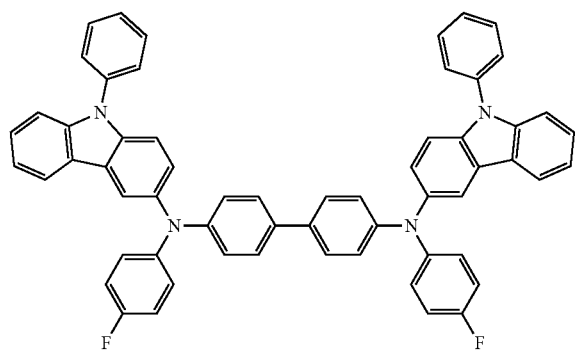

CP5
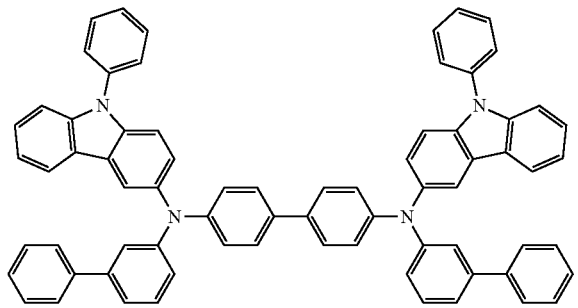

Hereinbefore, the organic light-emitting device according to an embodiment has been described in connection with FIGS. 1 to 4. However, embodiments of the present disclosure are not limited thereto.

Layers constituting the hole transport region, the emission layer, and layers constituting the electron transport region may be formed in a certain region by utilizing one or more suitable methods selected from vacuum deposition, spin coating, casting, Langmuir-Blodgett (LB) deposition, ink-jet printing, laser-printing, and laser-induced thermal imaging (LITI).

When layers constituting the hole transport region, the emission layer, and layers constituting the electron transport region are formed by vacuum deposition, the deposition may be performed at a deposition temperature of about 100° C. to about 500° C., a vacuum degree of about $10^{-8}$ torr to about $10^{-3}$ torr, and a vacuum deposition speed of about 0.01 Å/sec to about 100 Å/sec by taking into account a material to be included in the layer to be formed and a structure of the layer to be formed.

When layers constituting the hole transport region, the emission layer, and layers constituting the electron transport region are formed by spin coating, the spin coating may be performed at a coating speed of about 2,000 rpm to about 5,000 rpm and at a heat treatment temperature of about 80° C. to about 200° C. by taking into account a material to be included in the layer to be formed and a structure of the layer to be formed.

[General Definition of Substituents]

The term "$C_1$-$C_{60}$ alkyl group" as used herein refers to a linear or branched aliphatic saturated hydrocarbon monovalent group having 1 to 60 carbon atoms, and non-limiting examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a hydrocarbon group having at least one carbon-carbon double bond in the middle or at the terminus of the $C_2$-$C_{60}$ alkyl group, and non-limiting examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group having at least one carbon-carbon triple bond in the middle or at the terminus of the $C_2$-$C_{60}$ alkyl group, and non-limiting examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by —$OA_{101}$ (wherein Ani is the $C_1$-$C_{60}$ alkyl group), and non-limiting examples thereof include a methoxy group, an ethoxy group, and an isopropyloxy group.

The term "$C_3$-$C_{10}$ cycloalkyl group" as used herein refers to a monovalent saturated hydrocarbon monocyclic group having 3 to 10 carbon atoms, and non-limiting examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent saturated monocyclic group having at least one heteroatom selected from N, O, Si, P, and S as a ring-forming atom and 1 to 10 carbon atoms, and non-limiting examples thereof include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, Si, P, and S as a ring-forming atom, 1 to 10 carbon atoms, and at least one double bond in its ring. Non-limiting examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, a fluorenyl group, and a chrysenyl group. When the $C_6$-$C_{60}$ aryl group and the $C_6$-$C_{60}$ arylene group each include two or more rings, the two or more rings may be fused to each other.

The term "$C_1$-$C_{60}$ heteroaryl group" as used herein refers to a monovalent group having a heterocyclic aromatic system that has at least one heteroatom selected from N, O, Si, P, and S as a ring-forming atom, in addition to 1 to 60 carbon atoms. The term "$C_1$-$C_{60}$ heteroarylene group" as used herein refers to a divalent group having a heterocyclic aromatic system that has at least one heteroatom selected from N, O, Si, P, and S as a ring-forming atom, in addition to 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, an isoquinolinyl group, a carbazolyl group, a dibenzofuranyl group and a dibenzothiofuranyl group. When the $C_1$-$C_{60}$ heteroaryl group and the $C_1$-$C_{60}$ heteroarylene group each include two or more rings, the two or more rings may be condensed with each other.

The term "$C_6$-$C_{60}$ aryloxy group" as used herein refers to a group represented by —$OA_{102}$ (wherein $A_{102}$ is the $C_6$-$C_{60}$ aryl group), and the term "$C_6$-$C_{60}$ arylthio group" as used herein refers to a group represented by —$SA_{103}$ (wherein $A_{103}$ is the $C_6$-$C_{60}$ aryl group).

The term "monovalent non-aromatic condensed polycyclic group" as used herein refers to a monovalent group having two or more rings condensed with each other, only carbon atoms (for example, having 8 to 60 carbon atoms) as ring-forming atoms, and non-aromaticity in its entire molecular structure. Non-limiting examples of the monovalent non-aromatic condensed polycyclic group include a fluorenyl group and an adamantyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group having two or more rings condensed to each other, at least one heteroatom selected from N, O, Si, P, and S, other than carbon atoms (for example, having 8 to 60 carbon atoms), as a ring-forming atom, and non-aromaticity in its entire molecular structure. Non-limiting examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{60}$ carbocyclic group" as used herein refers to a monocyclic or polycyclic group having 5 to 60 carbon atoms which includes only carbon atoms as a ring-forming atom. The term "$C_5$-$C_{60}$ carbocyclic group" as used herein refers to an aromatic carbocyclic group or a non-aromatic carbocyclic group. The $C_5$-$C_{60}$ carbocyclic group may be a ring, such as benzene, a monovalent group, such as a phenyl group, or a divalent group, such as a phenylene group. In one or more embodiments, depending on the number of substituents connected to the $C_5$-$C_{60}$ carbocyclic group, the $C_5$-$C_{60}$ carbocyclic group may be a trivalent group or a quadrivalent group.

The term "$C_1$-$C_{60}$ heterocyclic group" as used herein refers to a group having the same structure as the $C_5$-$C_{60}$ carbocyclic group, except that as a ring-forming atom, at least one heteroatom selected from N, O, Si, P, and S is used in addition to carbon atoms (the number of carbon atoms may be in a range of 1 to 60).

In the present specification, at least one substituent of the substituted $C_5$-$C_{60}$ carbocyclic group, the substituted $C_1$-$C_{60}$ heterocyclic group, the substituted $C_1$-$C_{20}$ alkylene group, the substituted $C_2$-$C_{20}$ alkenylene group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from:

- deuterium (-D), —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;
- a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($C_{211}$)($C_{212}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$);
- a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;
- a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —C$_1$, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), and —P(=O)($Q_{21}$)($Q_{22}$); and
- —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a $C_1$-$C_{60}$ alkyl group substituted with at least one selected from deuterium, —F, and a cyano group, a $C_6$-$C_{60}$ aryl group substituted with at least one selected from deuterium, —F, and a cyano group, a biphenyl group, and a terphenyl group.

The term "Ph" as used herein refers to a phenyl group, the term "Me" as used herein refers to a methyl group, the term "Et" as used herein refers to an ethyl group, the term "ter-Bu" or "But" as used herein refers to a tert-butyl group, and the term "OMe" as used herein refers to a methoxy group.

The term "biphenyl group" as used herein refers to "a phenyl group substituted with a phenyl group". In other words, the "biphenyl group" is a substituted phenyl group having a $C_6$-$C_{60}$ aryl group as a substituent.

The term "terphenyl group" as used herein refers to "a phenyl group substituted with a biphenyl group". In other words, the "terphenyl group" is a substituted phenyl group having, as a substituent, a $C_6$-$C_{60}$ aryl group substituted with a $C_6$-$C_{60}$ aryl group.

*, *', and *'', as used herein, unless defined otherwise, each refer to a binding site to a neighboring atom in a corresponding formula.

Hereinafter, a compound according to embodiments and an organic light-emitting device according to embodiments will be described in more detail with reference to Synthesis Examples and Examples. The wording "B was utilized instead of A" used in describing Synthesis Examples refers to that an identical molar equivalent of B was utilized in place of A.

SYNTHESIS EXAMPLE

Synthesis Example 1: Synthesis of Compound 1

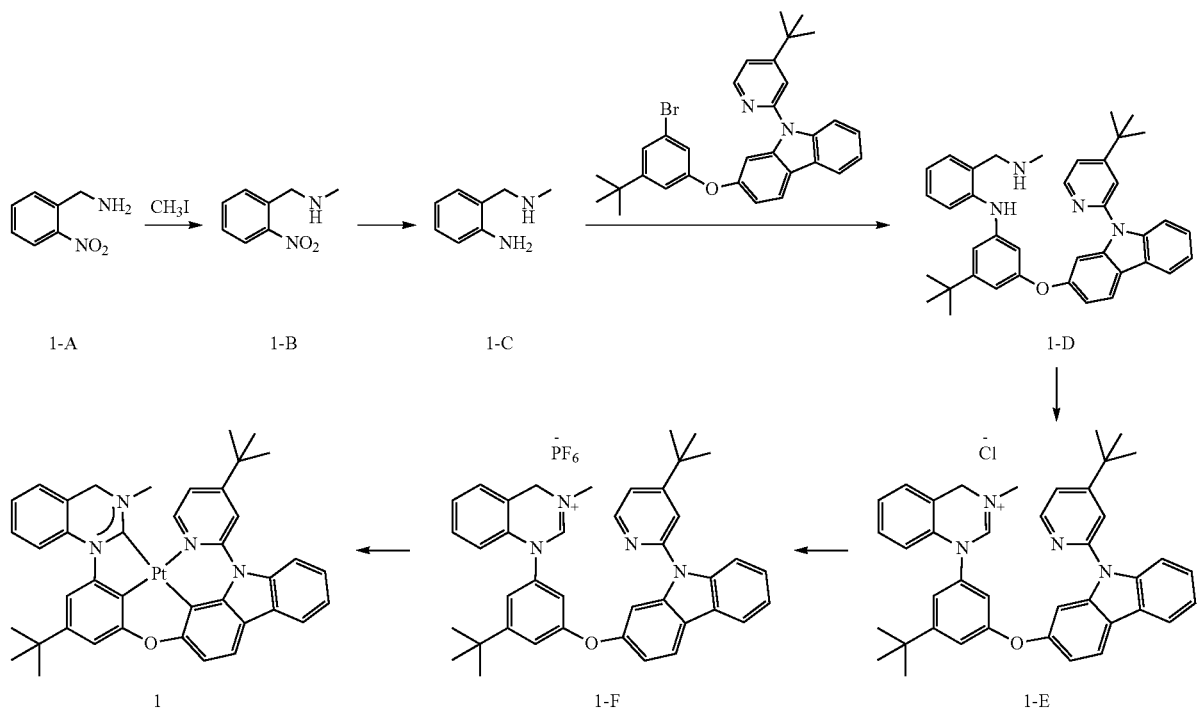

Synthesis of Intermediate Compound 1-B

1-A (1.0 eq), iodomethane (3.0 eq), Pd$_2$(dba)$_3$ (5 mol %), Sphos (7 mol %), and sodium tert-butoxide (2.0 eq) were dissolved in toluene (0.1 M), and then stirred at 110° C. for 12 hours. The reaction mixture was cooled to room temperature, and then subjected to an extraction process three times utilizing dichloromethane and water to thereby obtain an organic layer. The obtained organic layer was dried utilizing anhydrous magnesium sulfate and concentrated, and column chromatography was utilized to obtain Intermediate Compound 1-B (yield: 75%).

Synthesis of Intermediate Compound 1-C

Intermediate Compound 1-B (1.0 eq), Sn (1.5 eq), and HCl (30 eq) were dissolved in ethanol, and then stirred at 80° C. for 12 hours. The reaction mixture was cooled to room temperature, and then neutralized utilizing an NaOH solution. Then, an extraction process was performed thereon utilizing dichloromethane and water to obtain an organic layer, followed by filtration through celite/silica gel. Filtrate was dried utilizing anhydrous magnesium sulfate and concentrated, and column chromatography (MC:hexane=1:3) was utilized to obtain Intermediate Compound 1-C (yield: 86%). Synthesis of Intermediate Compound 1-D Intermediate Compound 1-C (1.2 eq), 2-(3-bromo-5-(tert-butyl)phenoxy)-9-(4-(tert-butyl)pyridin-2-yl)-9H-carbazole (1.0 eq), Pd$_2$(dba)$_3$ (5 mol %), Sphos (7 mol %), and sodium tert-butoxide (2.0 eq) were dissolved in toluene (0.1 M), and then stirred at 110° C. for 3 hours. The reaction mixture was cooled to room temperature, and then subjected to an extraction process three times utilizing dichloromethane and water to thereby obtain an organic layer. The obtained organic layer was dried utilizing anhydrous magnesium sulfate and concentrated, and column chromatography (ethyl acetate:hexane=1:9) was utilized to obtain Intermediate Compound 1-D (yield: 78%).

Synthesis of Intermediate Compound 1-E

Intermediate Compound 1-D (1.0 eq) was dissolved in triethyl orthoformate (30 eq) at 80° C., and then 37% HCl (1.5 eq) was added thereto and stirred at 80° C. for 12 hours. The reaction mixture was cooled to room temperature, and triethyl orhoformate was concentrated, followed by an extraction process three times utilizing dichloromethane and water to thereby obtain an organic layer. The obtained organic layer was dried utilizing anhydrous magnesium sulfate and concentrated, and column chromatography (MC, MC:5 vol % methanol) was utilized to obtain Intermediate Compound 1-E (yield: 90%).

Synthesis of Intermediate Compound 1-F

Intermediate Compound 1-E (1.0 eq) and ammonium hexafluorophosphate (3.0 eq) were dissolved in methanol (0.5 M), and then distilled water was added thereto and stirred at room temperature for 3 hours to 12 hours. The reaction mixture was washed with distilled water and filtered to obtain a solid, and then subjected to an extraction process three times utilizing dichloromethane and water to thereby obtain an organic layer. The obtained organic layer was dried utilizing anhydrous magnesium sulfate and concentrated to thereby obtain Intermediate Compound 1-F (yield: 94%).

Synthesis of Compound 1

Intermediate Compound 1-F (1.0 eq), dichloro(1,5-cyclooctadiene)platinum(II) (1.1 eq), and sodium acetate (3.0 eq) were dissolved in anhydrous 1,4-dioxane, and then stirred at 120° C. under a nitrogen condition for 4 days. The reaction mixture was cooled to room temperature, and then subjected to an extraction process three times utilizing dichloromethane and water to thereby obtain an organic layer. The obtained organic layer was dried utilizing anhydrous magnesium sulfate and concentrated, and column chromatography (MC:50 vol % hexane) was utilized to obtain Compound 1 (yield: 23%).

Synthesis Example 2: Synthesis of Compound 2

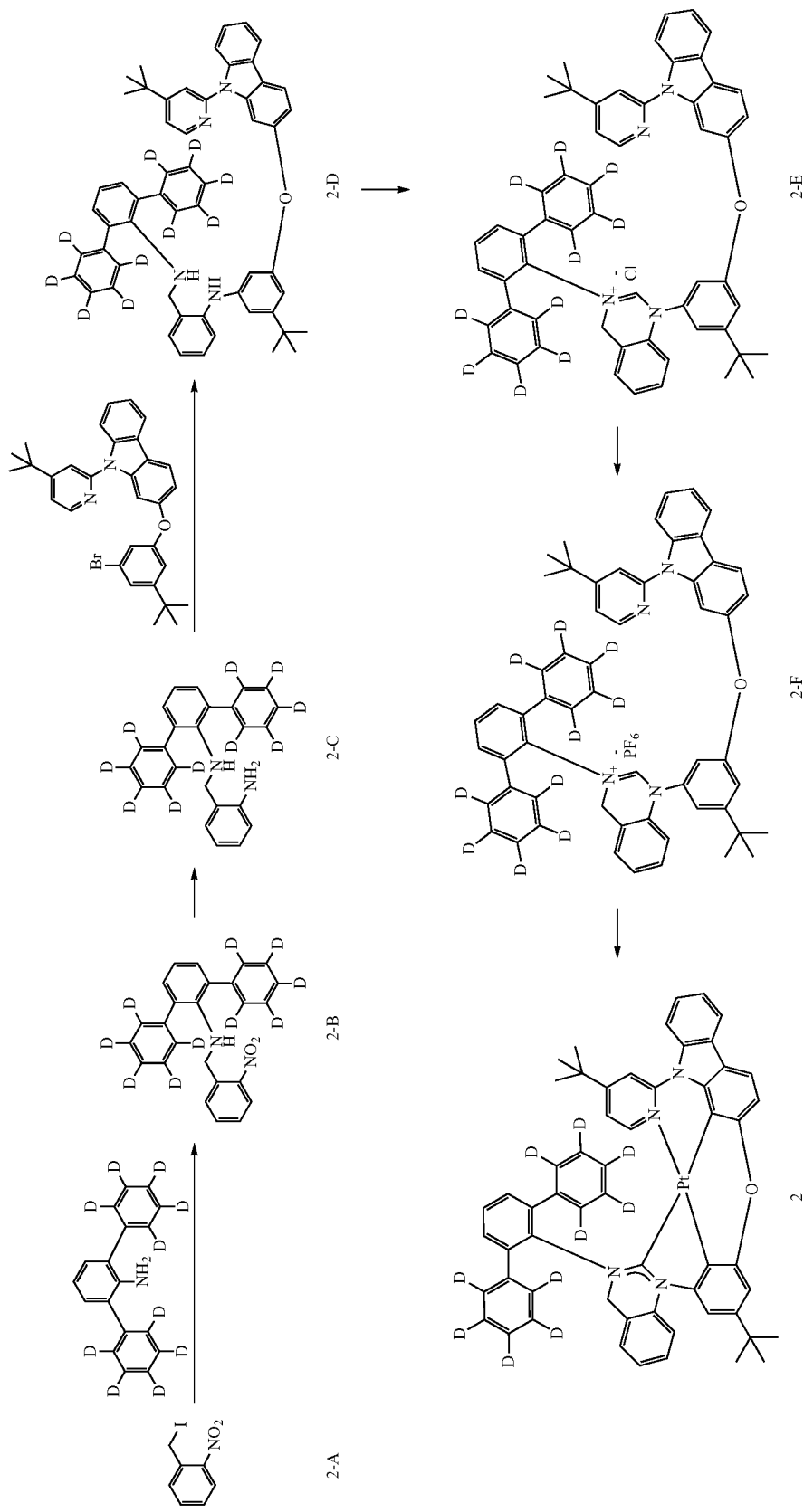

Synthesis of Intermediate Compound 2-B

Intermediate Compound 2-A (1.0 eq), 2,6-diphenyl-d[10]-aniline (1.2 eq), $Pd_2(dba)_3$ (5 mol %), Sphos (7 mol %), and sodium tert-butoxide (2.0 eq) were dissolved in toluene (0.1 M), and then stirred at 110° C. for 12 hours. The reaction mixture was cooled to room temperature, and then subjected to an extraction process three times utilizing dichloromethane and water to thereby obtain an organic layer. The obtained organic layer was dried utilizing anhydrous magnesium sulfate and concentrated, and column chromatography (dichloromethane:hexane=1:3) was utilized to obtain Intermediate Compound 2-B (yield: 73%).

Synthesis of Intermediate Compound 2-C

Intermediate Compound 2-B (1.0 eq), Sn (1.5 eq), and HCl (30 eq) were dissolved in ethanol, and then stirred at 80° C. for 12 hours. The reaction mixture was cooled to room temperature, and then neutralized utilizing an NaOH solution. Then, an extraction process was performed thereon utilizing dichloromethane and water to obtain an organic layer, followed by filtration through celite/silica gel. Filtrate was dried utilizing anhydrous magnesium sulfate and concentrated, and column chromatography (MC:hexane=1:3) was utilized to obtain Intermediate Compound 2-C (yield: 85%).

Synthesis of Intermediate Compound 2-D

Intermediate Compound 2-C (1.2 eq), 2-(3-bromo-5-(tert-butyl)phenoxy)-9-(4-(tert-butyl)pyridin-2-yl)-9H-carbazole (1.0 eq), $Pd_2(dba)_3$ (5 mol %), Sphos (7 mol %), and sodium tert-butoxide (2.0 eq) were dissolved in toluene (0.1 M), and then stirred at 110° C. for 3 hours. The reaction mixture was cooled to room temperature, and then subjected to an extraction process three times utilizing dichloromethane and water to thereby obtain an organic layer. The obtained organic layer was dried utilizing anhydrous magnesium sulfate and concentrated, and column chromatography (ethyl acetate:hexane=1:9) was utilized to obtain Intermediate Compound 2-D (yield: 78%).

Synthesis of Intermediate Compound 2-E

Intermediate Compound 2-D (1.0 eq) was dissolved in triethyl orthoformate (30 eq) at 80° C., and then 37% HCl (1.5 eq) was added thereto and stirred at 80° C. for 12 hours. The reaction mixture was cooled to room temperature, and then a reaction solvent was concentrated, followed by an extraction process utilizing dichloromethane and water to thereby obtain an organic layer. The obtained organic layer was dried utilizing anhydrous magnesium sulfate and concentrated, and column chromatography (MC, MC:1 vol % methanol, MC:2 vol % methanol, MC:5 vol % methanol) was utilized to obtain Intermediate Compound 2-E (yield: 89%).

Synthesis of Intermediate Compound 2-F

Intermediate Compound 2-E (1.0 eq) and ammonium hexafluorophosphate (3.0 eq) were dissolved in methanol (0.5 M), and then distilled water was added thereto and stirred at room temperature for 3 hours to 12 hours. The reaction mixture was washed with distilled water and filtered to obtain a solid, and then subjected to an extraction process three times utilizing dichloromethane and water to thereby obtain an organic layer. The obtained organic layer was dried utilizing anhydrous magnesium sulfate and concentrated to thereby obtain Intermediate Compound 2-F (yield: 96%).

Synthesis of Compound 2

Intermediate Compound 2-F (1.0 eq), dichloro(1,5-cyclooctadiene)platinum(II) (1.1 eq), and sodium acetate (3.0 eq) were dissolved in anhydrous 1,4-dioxane, and then stirred at 120° C. under a nitrogen condition for 4 days. The reaction mixture was cooled to room temperature, and then subjected to an extraction process three times utilizing dichloromethane and water to thereby obtain an organic layer. The obtained organic layer was dried utilizing anhydrous magnesium sulfate and concentrated, and column chromatography (MC:50 vol % hexane) was utilized to obtain Compound 2 (yield: 23%).

Synthesis Example 3: Synthesis of Compound 3

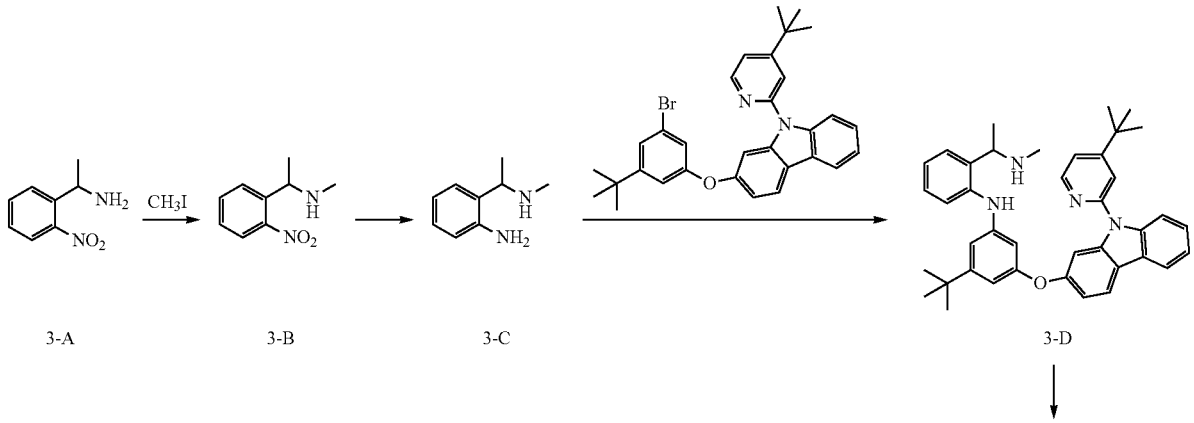

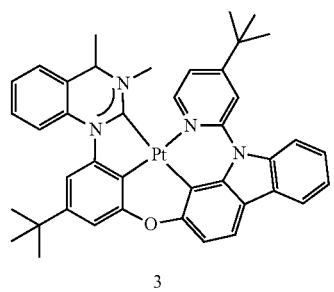

3

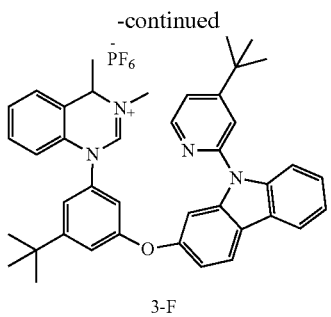

3-F

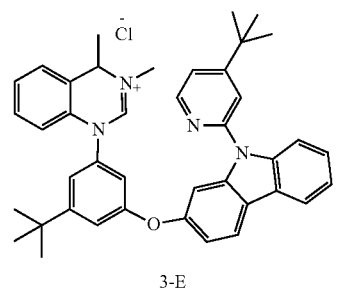

3-E

Synthesis of Intermediate Compound 3-B

Intermediate Compound 3-A (1.0 eq), Iodomethane (3.0 eq), Pd$_2$(dba)$_3$ (5 mol %), Sphos (7 mol %), and sodium tert-butoxide (2.0 eq) were dissolved in toluene (0.1 M), and then stirred at 120° C. for 12 hours. The reaction mixture was cooled to room temperature, and then subjected to an extraction process three times utilizing dichloromethane and water to thereby obtain an organic layer. The obtained organic layer was dried utilizing anhydrous magnesium sulfate and concentrated, and column chromatography was utilized to obtain Intermediate Compound 3-B (yield: 77%).

Synthesis of Intermediate Compound 3-C

Intermediate Compound 3-B (1.0 eq), Sn (1.5 eq), and HCl (30 eq) were dissolved in ethanol, and then stirred at 80° C. for 12 hours. The reaction mixture was cooled to room temperature, and then neutralized utilizing an NaOH solution. Then, an extraction process was performed thereon utilizing dichloromethane and water to obtain an organic layer, followed by filtration through celite/silica gel. Filtrate was dried utilizing anhydrous magnesium sulfate and concentrated, and column chromatography (MC:hexane=1:3) was utilized to obtain Intermediate Compound 3-C (yield: 88%).

Synthesis of Intermediate Compound 3-D

Intermediate Compound 3-C (1.2 eq), 2-(3-bromo-5-(tert-butyl)phenoxy)-9-(4-(tert-butyl)pyridin-2-yl)-9H-carbazole (1.0 eq), Pd$_2$(dba)$_3$ (5 mol %), Sphos (7 mol %), and sodium tert-butoxide (2.0 eq) were dissolved in toluene (0.1 M), and then stirred at 110° C. for 3 hours. The reaction mixture was cooled to room temperature, and then subjected to an extraction process three times utilizing dichloromethane and water to thereby obtain an organic layer. The obtained organic layer was dried utilizing anhydrous magnesium sulfate and concentrated, and column chromatography (ethyl acetate:hexane=1:9) was utilized to obtain Intermediate Compound 3-D (yield: 74%).

Synthesis of Intermediate Compound 3-E

Intermediate Compound 3-D (1.0 eq) was dissolved in triethyl orthoformate (30 eq) at 80° C., and then 37% HCl (1.5 eq) was added thereto and stirred at 80° C. for 12 hours. The reaction mixture was cooled to room temperature, and triethyl orhoformate was concentrated, followed by an extraction process three times utilizing dichloromethane and water to thereby obtain an organic layer. The obtained organic layer was dried utilizing anhydrous magnesium sulfate and concentrated, and column chromatography (MC, MC:5 vol % methanol) was utilized to obtain Intermediate Compound 3-E (yield: 90%).

Synthesis of Intermediate Compound 3-F

Intermediate Compound 3-E (1.0 eq) and ammonium hexafluorophosphate (3.0 eq) were dissolved in methanol (0.5 M), and then distilled water was added thereto and stirred at room temperature for 3 hours to 12 hours. The reaction mixture was washed with distilled water and filtered to obtain a solid, and then subjected to an extraction process three times utilizing dichloromethane and water to thereby obtain an organic layer. The obtained organic layer was dried utilizing anhydrous magnesium sulfate and concentrated to thereby obtain Intermediate Compound 3-F (yield: 95%).

Synthesis of Compound 3

Intermediate Compound 3-F (1.0 eq), dichloro(1,5-cyclooctadiene)platinum(II) (1.1 eq), and sodium acetate (3.0 eq) were dissolved in anhydrous 1,4-dioxane, and then stirred at 120° C. under a nitrogen condition for 4 days. The reaction mixture was cooled to room temperature, and then subjected to an extraction process three times utilizing dichloromethane and water to thereby obtain an organic layer. The obtained organic layer was dried utilizing anhydrous magnesium sulfate and concentrated, and column chromatography (MC:50 vol % hexane) was utilized to obtain Compound 3 (yield: 21%).

Synthesis Example 4: Synthesis of Compound 4

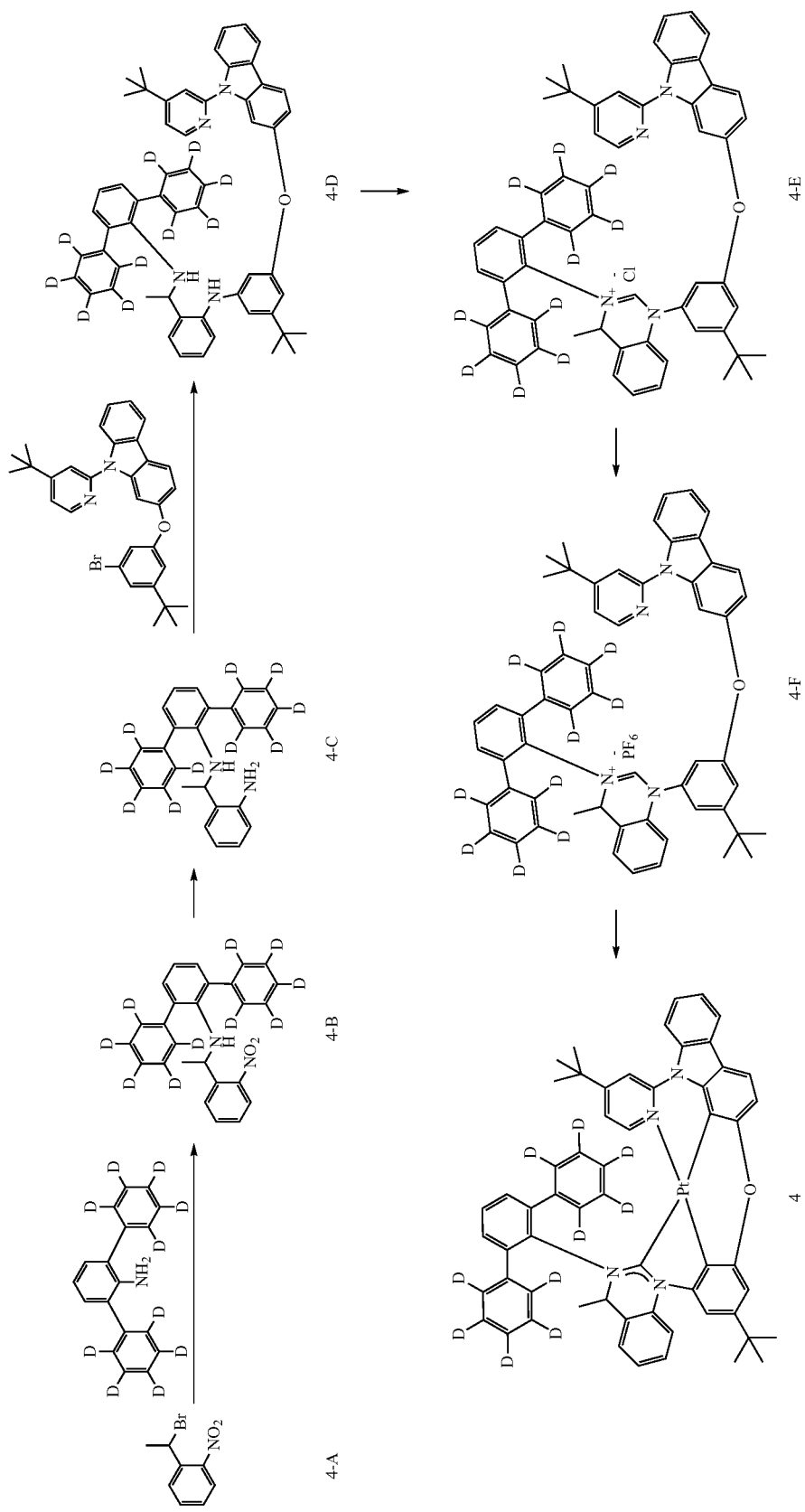

Synthesis of Intermediate Compound 4-B

4-A (1-(1-bromoethyl)-2-nitrobenzene) (1.0 eq), 2,6-diphenyl-d[10]-aniline (1.2 eq), chlorophenylallyl[1,3-bis(2,6-diisopropylphenyl)-2-imidazolidinylidene]palladium(II) (5 mol %), and sodium tert-butoxide (2.0 eq) were dissolved in toluene (0.1 M), and then stirred at 110° C. for 12 hours. The reaction mixture was cooled to room temperature, and then subjected to an extraction process three times utilizing dichloromethane and water to thereby obtain an organic layer. The obtained organic layer was dried utilizing anhydrous magnesium sulfate and concentrated, and column chromatography (dichloromethane:hexane=1:3) was utilized to obtain Intermediate Compound 4-B (yield: 75%).

Synthesis of Intermediate Compound 4-C

Intermediate Compound 4-B (1.0 eq), Sn (3.5 eq), and HCl (5.5 eq) were dissolved in ethanol, and then stirred at 80° C. for 12 hours. The reaction mixture was cooled to room temperature, and then neutralized utilizing an NaOH solution. Then, an extraction process was performed thereon utilizing dichloromethane and water to obtain an organic layer, followed by filtration through celite/silica gel. Filtrate was dried utilizing anhydrous magnesium sulfate and concentrated, and column chromatography (MC:hexane=1:3) was utilized to obtain Intermediate Compound 4-C (yield: 82%).

Synthesis of Intermediate Compound 4-D

Intermediate Compound 4-C (1.2 eq), 2-(3-bromo-5-(tert-butyl)phenoxy)-9-(4-(tert-butyl)pyridin-2-yl)-9H-carbazole (1.0 eq), Pd$_2$(dba)$_3$ (5 mol %), Sphos (7 mol %), and sodium tert-butoxide (2.0 eq) were dissolved in toluene (0.1 M), and then stirred at 110° C. for 3 hours. The reaction mixture was cooled to room temperature, and then subjected to an extraction process three times utilizing dichloromethane and water to thereby obtain an organic layer. The obtained organic layer was dried utilizing anhydrous magnesium sulfate and concentrated, and column chromatography (ethyl acetate:hexane=1:9) was utilized to obtain Intermediate Compound 4-D (yield: 78%).

Synthesis of Intermediate Compound 4-E

Intermediate Compound 4-D (1.0 eq) was dissolved in triethyl orthoformate (30 eq) at 80° C., and then 37% HCl (1.5 eq) was added thereto and stirred at 80° C. for 12 hours. The reaction mixture was cooled to room temperature, and then a reaction solvent was concentrated, followed by an extraction process utilizing dichloromethane and water to thereby obtain an organic layer. The obtained organic layer was dried utilizing anhydrous magnesium sulfate and concentrated, and column chromatography (MC, MC:1 vol % methanol, MC:2 vol % methanol, MC:5 vol % methanol) was utilized to obtain Intermediate Compound 4-E (yield: 89%).

Synthesis of Intermediate Compound 4-F

Intermediate Compound 4-E (1.0 eq) and ammonium hexafluorophosphate (3.0 eq) were dissolved in methanol (0.5 M), and then distilled water was added thereto and stirred at room temperature for 3 hours. The reaction mixture was washed with distilled water and filtered to obtain a solid, and then subjected to an extraction process three times utilizing dichloromethane and water to thereby obtain an organic layer. The obtained organic layer was dried utilizing anhydrous magnesium sulfate and concentrated to thereby obtain Intermediate Compound 4-F (yield: 94%).

Synthesis of Compound 4

Intermediate Compound 4-F (1.0 eq), dichloro(1,5-cyclooctadiene)platinum(II) (1.1 eq), and sodium acetate (3.0 eq) were dissolved in anhydrous 1,4-dioxane, and then stirred at 120° C. under a nitrogen condition for 4 days. The reaction mixture was cooled to room temperature, and then subjected to an extraction process three times utilizing dichloromethane and water to thereby obtain an organic layer. The obtained organic layer was dried utilizing anhydrous magnesium sulfate and concentrated, and column chromatography (MC:50 vol % hexane) was utilized to obtain Compound 4 (yield: 23%).

Synthesis Example 5: Synthesis of Compound 5

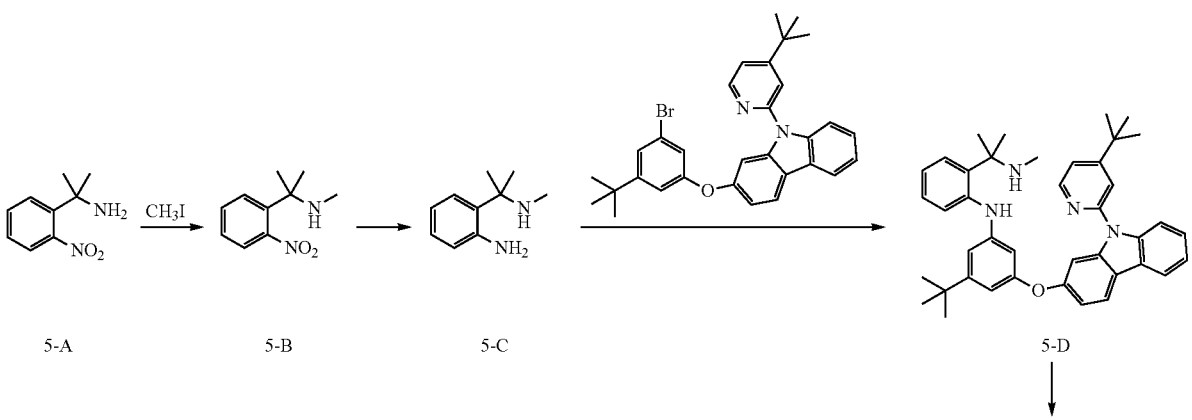

5-A      5-B      5-C      5-D

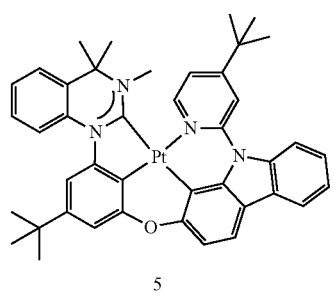
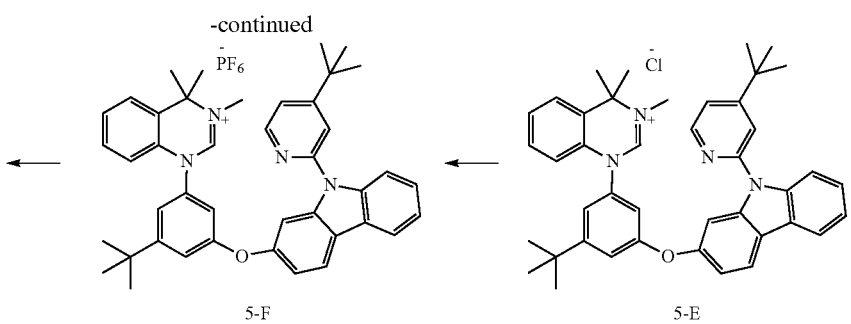

Synthesis of Intermediate Compound 5-B

5-A (1.0 eq), Iodomethane (3.0 eq), Pd$_2$(dba)$_3$ (5 mol %), Sphos (7 mol %), and sodium tert-butoxide (2.0 eq) were dissolved in toluene (0.1 M), and then stirred at 120° C. for 12 hours. The reaction mixture was cooled to room temperature, and then subjected to an extraction process three times utilizing dichloromethane and water to thereby obtain an organic layer. The obtained organic layer was dried utilizing anhydrous magnesium sulfate and concentrated, and column chromatography was utilized to obtain Intermediate Compound 5-B (yield: 71%).

Synthesis of Intermediate Compound 5-C

Intermediate Compound 5-B (1.0 eq), Sn (3.0 eq), and HCl (5.5 eq) were dissolved in ethanol, and then stirred at 80° C. for 12 hours. The reaction mixture was cooled to room temperature, and then neutralized utilizing an NaOH solution. Then, an extraction process was performed thereon utilizing dichloromethane and water to obtain an organic layer, followed by filtration through celite/silica gel. Filtrate was dried utilizing anhydrous magnesium sulfate and concentrated, and column chromatography (MC:hexane=1:3) was utilized to obtain Intermediate Compound 5-C (yield: 91%).

Synthesis of Intermediate Compound 5-D

Intermediate Compound 5-C (1.2 eq), 2-(3-bromo-5-(tert-butyl)phenoxy)-9-(4-(tert-butyl)pyridin-2-yl)-9H-carbazole (1.0 eq), Pd$_2$(dba)$_3$ (5 mol %), Sphos (7 mol %), and sodium tert-butoxide (2.0 eq) were dissolved in toluene (0.1 M), and then stirred at 110° C. for 3 hours. The reaction mixture was cooled to room temperature, and then subjected to an extraction process three times utilizing dichloromethane and water to thereby obtain an organic layer. The obtained organic layer was dried utilizing anhydrous magnesium sulfate and concentrated, and column chromatography (ethyl acetate:hexane=1:9) was utilized to obtain Intermediate Compound 5-D (yield: 73%).

Synthesis of Intermediate Compound 5-E

Intermediate Compound 5-D (1.0 eq) was dissolved in triethyl orthoformate (30 eq) at 80° C., and then 37% HCl (1.5 eq) was added thereto and stirred at 80° C. for 12 hours. The reaction mixture was cooled to room temperature, and triethyl orhoformate was concentrated, followed by an extraction process three times utilizing dichloromethane and water to thereby obtain an organic layer. The obtained organic layer was dried utilizing anhydrous magnesium sulfate and concentrated, and column chromatography (MC, MC:5 vol % methanol) was utilized to obtain Intermediate Compound 5-E (yield: 90%).

Synthesis of Intermediate Compound 5-F

Intermediate Compound 5-E (1.0 eq) and ammonium hexafluorophosphate (3.0 eq) were dissolved in methanol (0.5 M), and then distilled water was added thereto and stirred at room temperature for 3 hours to 12 hours. The reaction mixture was washed with distilled water and filtered to obtain a solid, and then subjected to an extraction process three times utilizing dichloromethane and water to thereby obtain an organic layer. The obtained organic layer was dried utilizing anhydrous magnesium sulfate and concentrated to thereby obtain Intermediate Compound 5-F (yield: 94%).

Synthesis of Compound 5

Intermediate Compound 5-F (1.0 eq), dichloro(1,5-cyclooctadiene)platinum(II) (1.1 eq), and sodium acetate (3.0 eq) were dissolved in anhydrous 1,4-dioxane, and then stirred at 120° C. under a nitrogen condition for 4 days. The reaction mixture was cooled to room temperature, and then subjected to an extraction process three times utilizing dichloromethane and water to thereby obtain an organic layer. The obtained organic layer was dried utilizing anhydrous magnesium sulfate and concentrated, and column chromatography (MC:50 vol % hexane) was utilized to obtain Compound 5 (yield: 21%).

Synthesis Example 6: Synthesis of Compound 6

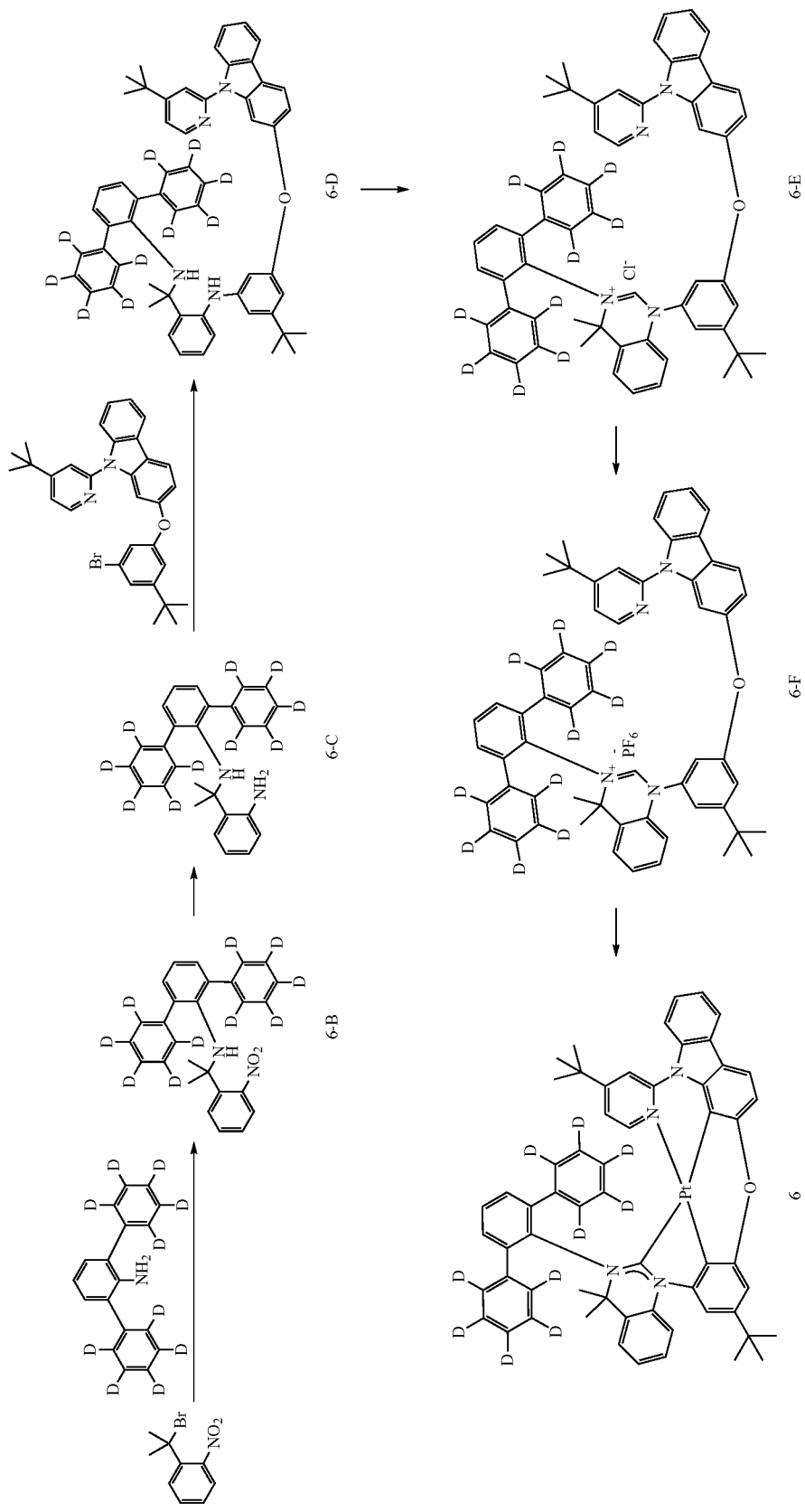

Synthesis of Intermediate Compound 6-B 1-(2-bromopropan-2-yl)-2-nitrobenzene (1.0 eq), 2,6-diphenyl-d$^{10}$-aniline (1.2 eq), chlorophenylallyl[1,3-bis(2,6-diisopropylphenyl)-2-imidazolidinylidene]palladium(II) (5 mol %), and sodium tert-butoxide (2.0 eq) were dissolved in toluene (0.1 M), and then stirred at 120° C. for 12 hours. The reaction mixture was cooled to room temperature, and then subjected to an extraction process utilizing dichloromethane and water to thereby obtain an organic layer. The obtained organic layer was dried utilizing anhydrous magnesium sulfate and concentrated, and column chromatography (dichloromethane:hexane=1:3) was utilized to obtain Intermediate Compound 6-B (yield: 74%).

Synthesis of Intermediate Compound 6-C

Intermediate Compound 6-B (1.0 eq), Sn (3.5 eq), and HCl (5.5 eq) were dissolved in ethanol, and then stirred at 80° C. for 12 hours. The reaction mixture was cooled to room temperature, and then neutralized utilizing an NaOH solution. Then, an extraction process was performed thereon utilizing dichloromethane and water to obtain an organic layer, followed by filtration through celite/silica gel. Filtrate was dried utilizing anhydrous magnesium sulfate and concentrated, and column chromatography (MC:hexane=1:3) was utilized to obtain Intermediate Compound 6-C (yield: 89%).

Synthesis of Intermediate Compound 6-D

Intermediate Compound 6-C (1.2 eq), 2-(3-bromo-5-(tert-butyl)phenoxy)-9-(4-(tert-butyl)pyridin-2-yl)-9H-carbazole (1.0 eq), Pd$_2$(dba)$_3$ (5 mol %), Sphos (7 mol %), and sodium tert-butoxide (2.0 eq) were dissolved in toluene (0.1 M), and then stirred at 110° C. for 3 hours. The reaction mixture was cooled to room temperature, and then subjected to an extraction process three times utilizing dichloromethane and water to thereby obtain an organic layer. The obtained organic layer was dried utilizing anhydrous magnesium sulfate and concentrated, and column chromatography (ethyl acetate:hexane=1:9) was utilized to obtain Intermediate Compound 6-D (yield: 77%).

Synthesis of Intermediate Compound 6-E

Intermediate Compound 6-D (1.0 eq) was dissolved in triethyl orthoformate (30 eq) at 80° C., and then 37% HCl (1.5 eq) was added thereto and stirred at 80° C. for 12 hours. The reaction mixture was cooled to room temperature, and then a reaction solvent was concentrated, followed by an extraction process utilizing dichloromethane and water to thereby obtain an organic layer. The obtained organic layer was dried utilizing anhydrous magnesium sulfate and concentrated, and column chromatography (MC, MC:1 vol % methanol, MC:2 vol % methanol, MC:5 vol % methanol) was utilized to obtain Intermediate Compound 6-E (yield: 89%).

Synthesis of Intermediate Compound 6-F

Intermediate Compound 6-E (1.0 eq) and ammonium hexafluorophosphate (3.0 eq) were dissolved in methanol (0.5 M), and then distilled water was added thereto and stirred at room temperature for 3 hours. The reaction mixture was washed with distilled water and filtered to obtain a solid, and then subjected to an extraction process three times utilizing dichloromethane and water to thereby obtain an organic layer. The obtained organic layer was dried utilizing anhydrous magnesium sulfate and concentrated to thereby obtain Intermediate Compound 6-F (yield: 95%).

Synthesis of Compound 6

Intermediate Compound 6-F (1.0 eq), dichloro(1,5-cyclooctadiene)platinum(II) (1.1 eq), and sodium acetate (3.0 eq) were dissolved in anhydrous 1,4-dioxane, and then stirred at 120° C. under a nitrogen condition for 4 days. The reaction mixture was cooled to room temperature, and then subjected to an extraction process three times utilizing dichloromethane and water to thereby obtain an organic layer. The obtained organic layer was dried utilizing anhydrous magnesium sulfate and concentrated, and column chromatography (MC:50 vol % hexane) was utilized to obtain Compound 6 (yield: 25%).

Synthesis Example 7: Synthesis of Compound 7

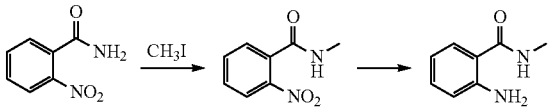
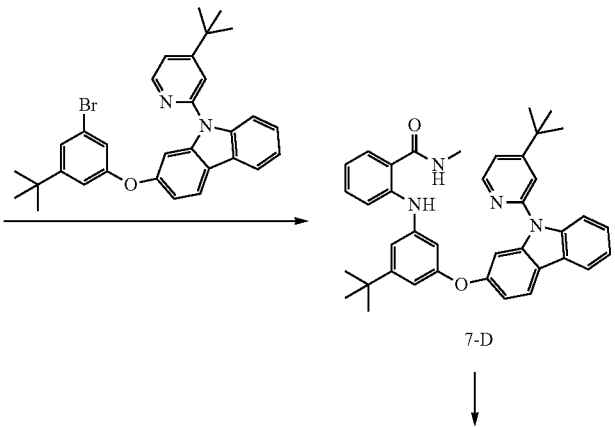

7-A    7-B    7-C    7-D

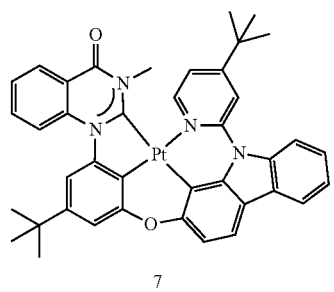

7

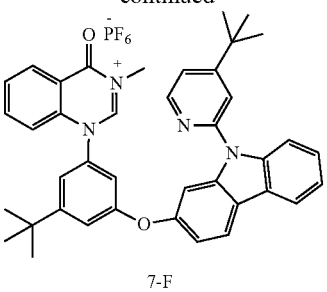

7-F

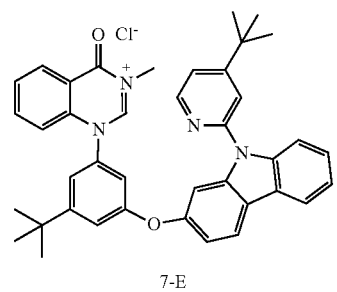

7-E

Synthesis of Intermediate Compound 7-B

7-A (1.0 eq), iodomethane (3.0 eq), Pd$_2$(dba)$_3$ (5 mol %), Sphos (7 mol %), and sodium tert-butoxide (2.0 eq) were dissolved in toluene (0.1 M), and then stirred at 120° C. for 12 hours. The reaction mixture was cooled to room temperature, and then subjected to an extraction process three times utilizing dichloromethane and water to thereby obtain an organic layer. The obtained organic layer was dried utilizing anhydrous magnesium sulfate and concentrated, and column chromatography was utilized to obtain Intermediate Compound 7-B (yield: 71%).

Synthesis of Intermediate Compound 7-C

Intermediate Compound 7-B (1.0 eq), Sn (3.0 eq), and HCl (5.5 eq) were dissolved in ethanol, and then stirred at 80° C. for 12 hours. The reaction mixture was cooled to room temperature, and then neutralized utilizing an NaOH solution. Then, an extraction process was performed thereon utilizing dichloromethane and water to obtain an organic layer, followed by filtration through celite/silica gel. Filtrate was dried utilizing anhydrous magnesium sulfate and concentrated, and column chromatography (MC:hexane=1:3) was utilized to obtain Intermediate Compound 7-C (yield: 91%).

Synthesis of Intermediate Compound 7-D

Intermediate Compound 7-C (1.2 eq), 2-(3-bromo-5-(tert-butyl)phenoxy)-9-(4-(tert-butyl)pyridin-2-yl)-9H-carbazole (1.0 eq), Pd$_2$(dba)$_3$ (5 mol %), Sphos (7 mol %), and sodium tert-butoxide (2.0 eq) were dissolved in toluene (0.1 M), and then stirred at 110° C. for 3 hours. The reaction mixture was cooled to room temperature, and then subjected to an extraction process three times utilizing dichloromethane and water to thereby obtain an organic layer. The obtained organic layer was dried utilizing anhydrous magnesium sulfate and concentrated, and column chromatography (ethyl acetate:hexane=1:9) was utilized to obtain Intermediate Compound 7-D (yield: 73%).

Synthesis of Intermediate Compound 7-E

Intermediate Compound 7-D (1.0 eq) was dissolved in triethyl orthoformate (30 eq) at 80° C., and then 37% HCl (1.5 eq) was added thereto and stirred at 80° C. for 12 hours. The reaction mixture was cooled to room temperature, and triethyl orhoformate was concentrated, followed by an extraction process three times utilizing dichloromethane and water to thereby obtain an organic layer. The obtained organic layer was dried utilizing anhydrous magnesium sulfate and concentrated, and column chromatography (MC, MC:5 vol % methanol) was utilized to obtain Intermediate Compound 7-E (yield: 90%).

Synthesis of Intermediate Compound 7-F

Intermediate Compound 7-E (1.0 eq) and ammonium hexafluorophosphate (3.0 eq) were dissolved in methanol (0.5 M), and then distilled water was added thereto and stirred at room temperature for 3 hours to 12 hours. The reaction mixture was washed with distilled water and filtered to obtain a solid, and then subjected to an extraction process three times utilizing dichloromethane and water to thereby obtain an organic layer. The obtained organic layer was dried utilizing anhydrous magnesium sulfate and concentrated to thereby obtain Intermediate Compound 7-F (yield: 94%).

Synthesis of Compound 7

Intermediate Compound 7-F (1.0 eq), dichloro(1,5-cyclooctadiene)platinum(II) (1.1 eq), and sodium acetate (3.0 eq) were dissolved in anhydrous 1,4-dioxane, and then stirred at 120° C. under a nitrogen condition for 4 days. The reaction mixture was cooled to room temperature, and then subjected to an extraction process three times utilizing dichloromethane and water to thereby obtain an organic layer. The obtained organic layer was dried utilizing anhydrous magnesium sulfate and concentrated, and column chromatography (MC:50 vol % hexane) was utilized to obtain Compound 7 (yield: 26%).

Synthesis Example 8: Synthesis of Compound 8

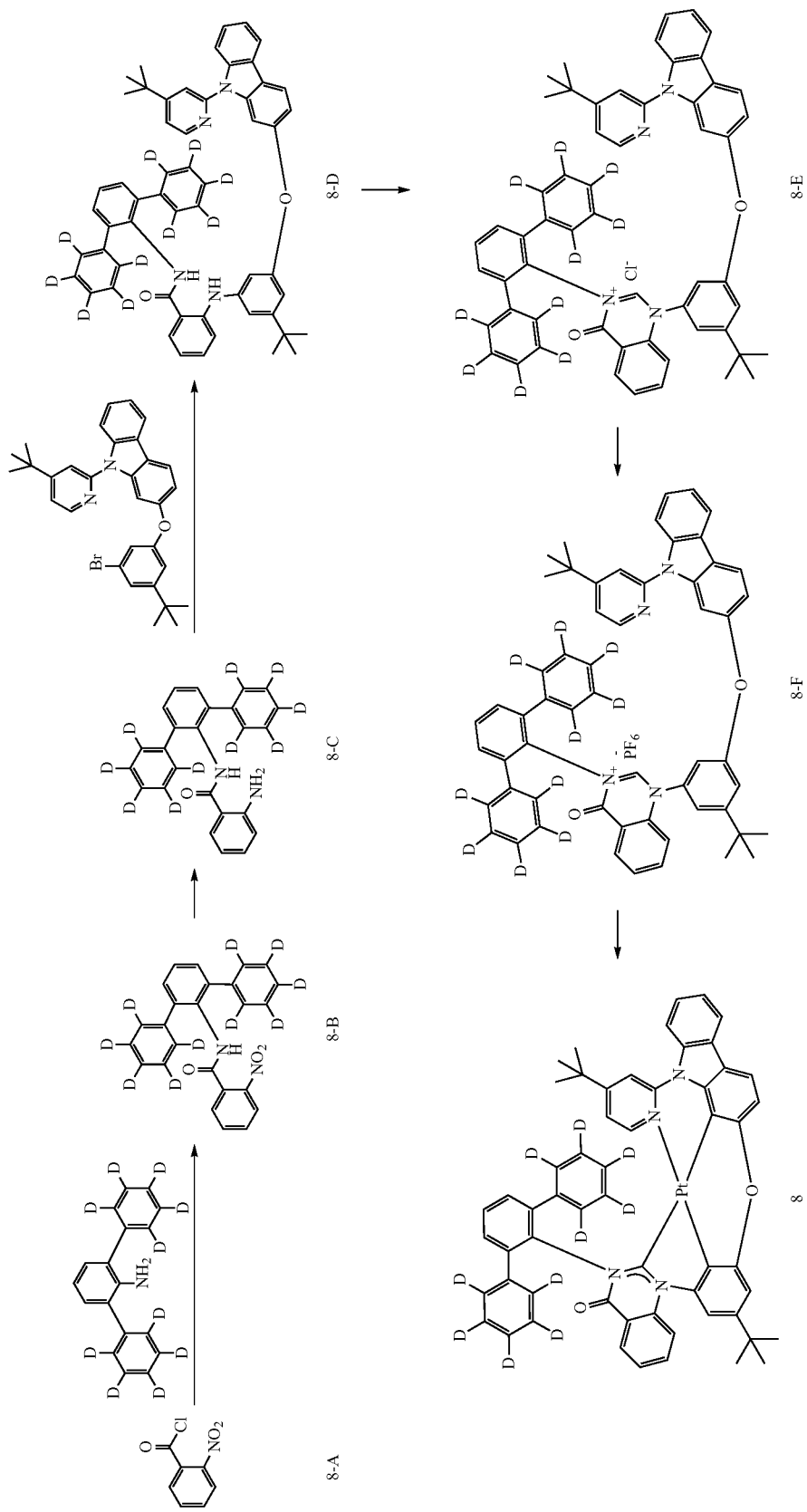

Synthesis of Intermediate Compound 8-B

8-A (1.0 eq), 2,6-diphenyl-d$^{10}$-aniline (1.2 eq), Pd$_2$(dba)$_3$ (5 mol %), Sphos (7 mol %), and sodium tert-butoxide (2.0 eq) were dissolved in toluene (0.1 M), and then stirred at 110° C. for 12 hours. The reaction mixture was cooled to room temperature, and then subjected to an extraction process three times utilizing dichloromethane and water to thereby obtain an organic layer. The obtained organic layer was dried utilizing anhydrous magnesium sulfate and concentrated, and column chromatography (dichloromethane:hexane=1:3) was utilized to obtain Intermediate Compound 8-B (yield: 84%).

Synthesis of Intermediate Compound 8-C

Intermediate Compound 8-B (1.0 eq), Sn (3.0 eq), and HCl (5.5 eq) were dissolved in ethanol, and then stirred at 80° C. for 12 hours. The reaction mixture was cooled to room temperature, and then neutralized utilizing an NaOH solution. Then, an extraction process was performed thereon utilizing dichloromethane and water to obtain an organic layer, followed by filtration through celite/silica gel. Filtrate was dried utilizing anhydrous magnesium sulfate and concentrated, and column chromatography (MC:hexane=1:3) was utilized to obtain Intermediate Compound 8-C (yield: 91%).

Synthesis of Intermediate Compound 8-D

Intermediate Compound 8-C (1.2 eq), 2-(3-bromo-5-(tert-butyl)phenoxy)-9-(4-(tert-butyl)pyridin-2-yl)-9H-carbazole (1.0 eq), Pd$_2$(dba)$_3$ (5 mol %), Sphos (7 mol %), and sodium tert-butoxide (2.0 eq) were dissolved in toluene (0.1 M), and then stirred at 110° C. for 3 hours. The reaction mixture was cooled to room temperature, and then subjected to an extraction process three times utilizing dichloromethane and water to thereby obtain an organic layer. The obtained organic layer was dried utilizing anhydrous magnesium sulfate and concentrated, and column chromatography (ethyl acetate:hexane=1:9) was utilized to obtain Intermediate Compound 8-D (yield: 72%).

Synthesis of Intermediate Compound 8-E

Intermediate Compound 8-D (1.0 eq) was dissolved in triethyl orthoformate (30 eq) at 80° C., and then 37% HCl (1.5 eq) was added thereto and stirred at 80° C. for 12 hours. The reaction mixture was cooled to room temperature, and then a reaction solvent was concentrated, followed by an extraction process utilizing dichloromethane and water to thereby obtain an organic layer. The obtained organic layer was dried utilizing anhydrous magnesium sulfate and concentrated, and column chromatography (MC, MC:1 vol % methanol, MC:2 vol % methanol, MC:5 vol % methanol) was utilized to obtain Intermediate Compound 8-E (yield: 95%).

Synthesis of Intermediate Compound 8-F

Intermediate Compound 8-E (1.0 eq) and ammonium hexafluorophosphate (3.0 eq) were dissolved in methanol (0.5 M), and then distilled water was added thereto and stirred at room temperature for 3 hours to 12 hours. The reaction mixture was washed with distilled water and filtered to obtain a solid, and then subjected to an extraction process three times utilizing dichloromethane and water to thereby obtain an organic layer. The obtained organic layer was dried utilizing anhydrous magnesium sulfate and concentrated to thereby obtain Intermediate Compound 8-F (yield: 93%).

Synthesis of Compound 8

Intermediate Compound 8-F (1.0 eq), dichloro(1,5-cyclooctadiene)platinum(II) (1.1 eq), and sodium acetate (3.0 eq) were dissolved in anhydrous 1,4-dioxane, and then stirred at 120° C. under a nitrogen condition for 4 days. The reaction mixture was cooled to room temperature, and then subjected to an extraction process three times utilizing dichloromethane and water to thereby obtain an organic layer. The obtained organic layer was dried utilizing anhydrous magnesium sulfate and concentrated, and column chromatography (MC:50 vol % hexane) was utilized to obtain Compound 8 (yield: 22%).

Synthesis Example 9: Synthesis of Compound 9

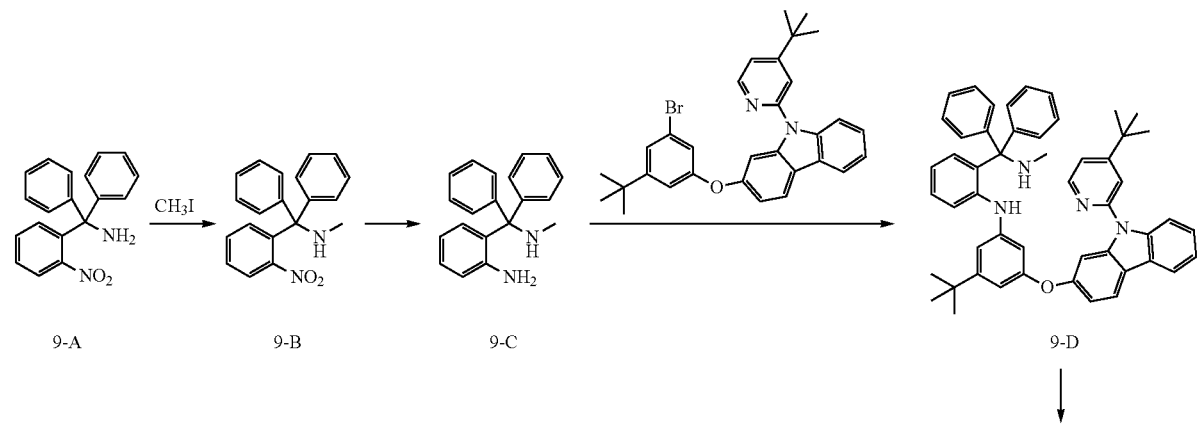

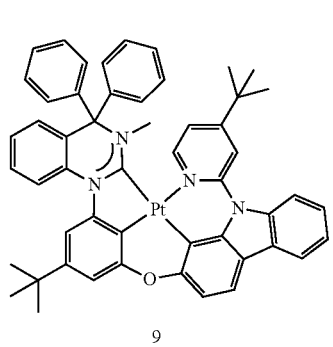

9

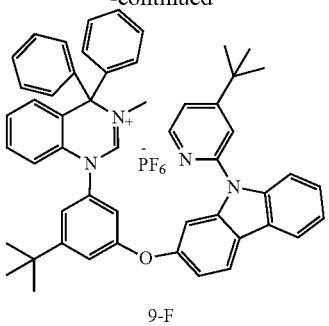

9-F

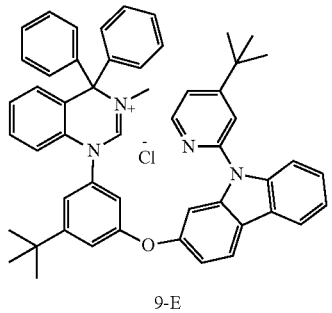

9-E

Synthesis of Intermediate Compound 9-B

9-A (1.0 eq), iodomethane (5.0 eq), Pd$_2$(dba)$_3$ (5 mol %), Sphos (7 mol %), and sodium tert-butoxide (2.0 eq) were dissolved in toluene (0.1 M), and then stirred at 120° C. for 12 hours. The reaction mixture was cooled to room temperature, and then subjected to an extraction process three times utilizing dichloromethane and water to thereby obtain an organic layer. The obtained organic layer was dried utilizing anhydrous magnesium sulfate and concentrated, and column chromatography was utilized to obtain Intermediate Compound 9-B (yield: 90%).

Synthesis of Intermediate Compound 9-C

Intermediate Compound 9-B (1.0 eq), Sn (3.0 eq), and HCl (5.5 eq) were dissolved in ethanol, and then stirred at 80° C. for 12 hours. The reaction mixture was cooled to room temperature, and then neutralized utilizing an NaOH solution. Then, an extraction process was performed thereon utilizing dichloromethane and water to obtain an organic layer, followed by filtration through celite/silica gel. Filtrate was dried utilizing anhydrous magnesium sulfate and concentrated, and column chromatography (MC:hexane=1:3) was utilized to obtain Intermediate Compound 9-C (yield: 93%).

Synthesis of Intermediate Compound 9-D

Intermediate Compound 9-C (1.2 eq), 2-(3-bromo-5-(tert-butyl)phenoxy)-9-(4-(tert-butyl)pyridin-2-yl)-9H-carbazole (1.0 eq), Pd$_2$(dba)$_3$ (5 mol %), Sphos (7 mol %), and sodium tert-butoxide (2.0 eq) were dissolved in toluene (0.1 M), and then stirred at 110° C. for 3 hours. The reaction mixture was cooled to room temperature, and then subjected to an extraction process three times utilizing dichloromethane and water to thereby obtain an organic layer. The obtained organic layer was dried utilizing anhydrous magnesium sulfate and concentrated, and column chromatography (ethyl acetate:hexane=1:9) was utilized to obtain Intermediate Compound 9-D (yield: 76%).

Synthesis of Intermediate Compound 9-E

Intermediate Compound 9-D (1.0 eq) was dissolved in triethyl orthoformate (30 eq) at 80° C., and then 37% HCl (1.5 eq) was added thereto and stirred at 80° C. for 12 hours. The reaction mixture was cooled to room temperature, and triethyl orhoformate was concentrated, followed by an extraction process three times utilizing dichloromethane and water to thereby obtain an organic layer. The obtained organic layer was dried utilizing anhydrous magnesium sulfate and concentrated, and column chromatography (MC, MC:5 vol % methanol) was utilized to obtain Intermediate Compound 9-E (yield: 91%).

Synthesis of Intermediate Compound 9-F

Intermediate Compound 9-E (1.0 eq) and ammonium hexafluorophosphate (3.0 eq) were dissolved in methanol (0.5 M), and then distilled water was added thereto and stirred at room temperature for 3 hours to 12 hours. The reaction mixture was washed with distilled water and filtered to obtain a solid, and then subjected to an extraction process three times utilizing dichloromethane and water to thereby obtain an organic layer. The obtained organic layer was dried utilizing anhydrous magnesium sulfate and concentrated to thereby obtain Intermediate Compound 9-F (yield: 96%).

Synthesis of Compound 9

Intermediate Compound 9-F (1.0 eq), dichloro(1,5-cyclooctadiene)platinum(II) (1.1 eq), and sodium acetate (3.0 eq) were dissolved in anhydrous 1,4-dioxane, and then stirred at 120° C. under a nitrogen condition for 4 days. The reaction mixture was cooled to room temperature, and then subjected to an extraction process three times utilizing dichloromethane and water to thereby obtain an organic layer. The obtained organic layer was dried utilizing anhydrous magnesium sulfate and concentrated, and column chromatography (MC:50 vol % hexane) was utilized to obtain Compound 9 (yield: 27%).

Synthesis Example 10: Synthesis of Compound 10

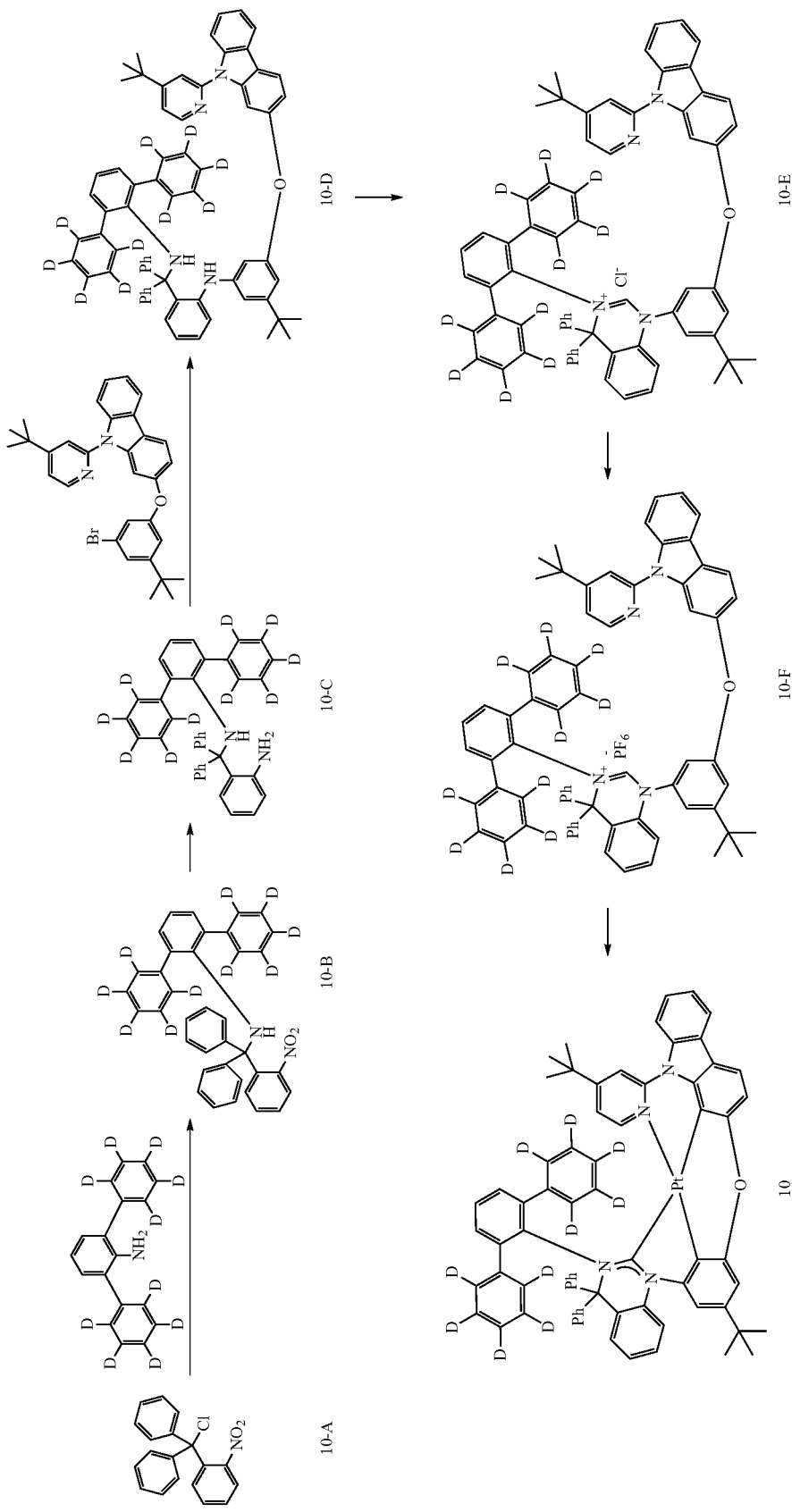

Synthesis of Intermediate Compound 10-B

10-A (1.0 eq), 2,6-diphenyl-d$^{10}$-aniline (1.2 eq), Pd$_2$(dba)$_3$ (5 mol %), Sphos (7 mol %), and sodium tert-butoxide (2.0 eq) were dissolved in toluene (0.1 M), and then stirred at 110° C. for 12 hours. The reaction mixture was cooled to room temperature, and then subjected to an extraction process three times utilizing dichloromethane and water to thereby obtain an organic layer. The obtained organic layer was dried utilizing anhydrous magnesium sulfate and concentrated, and column chromatography was utilized to obtain Intermediate Compound 10-B (yield: 74%).

Synthesis of Intermediate Compound 10-C

Intermediate Compound 10-B (1.0 eq), Sn (3.0 eq), and HCl (5.5 eq) were dissolved in ethanol, and then stirred at 80° C. for 12 hours. The reaction mixture was cooled to room temperature, and then neutralized utilizing an NaOH solution. Then, an extraction process was performed thereon utilizing dichloromethane and water to obtain an organic layer, followed by filtration through celite/silica gel. Filtrate was dried utilizing anhydrous magnesium sulfate and concentrated, and column chromatography was utilized to obtain Intermediate Compound 10-C (yield: 95%).

Synthesis of Intermediate Compound 10-D

Intermediate Compound 10-C (1.2 eq), 2-(3-bromo-5-(tert-butyl)phenoxy)-9-(4-(tert-butyl)pyridin-2-yl)-9H-carbazole (1.0 eq), Pd$_2$(dba)$_3$ (5 mol %), Sphos (7 mol %), and sodium tert-butoxide (2.0 eq) were dissolved in toluene (0.1 M), and then stirred at 110° C. for 3 hours. The reaction mixture was cooled to room temperature, and then subjected to an extraction process three times utilizing dichloromethane and water to thereby obtain an organic layer. The obtained organic layer was dried utilizing anhydrous magnesium sulfate and concentrated, and column chromatography was utilized to obtain Intermediate Compound 10-D (yield: 70%).

Synthesis of Intermediate Compound 10-E

Intermediate Compound 10-D (1.0 eq) was dissolved in triethyl orthoformate (30 eq) at 80° C., and then 37% HCl (1.5 eq) was added thereto and stirred at 80° C. for 12 hours. The reaction mixture was cooled to room temperature, and then a reaction solvent was concentrated, followed by an extraction process utilizing dichloromethane and water to thereby obtain an organic layer. The obtained organic layer was dried utilizing anhydrous magnesium sulfate and concentrated, and column chromatography (dichloromethane:methanol=20:1) was utilized to obtain Intermediate Compound 10-E (yield: 91%).

Synthesis of Intermediate Compound 10-F

Intermediate Compound 10-E (1.0 eq) and ammonium hexafluorophosphate (3.0 eq) were dissolved in methanol (0.5 M), and then distilled water was added thereto and stirred at room temperature for 4 hours. The reaction mixture was washed with distilled water and filtered to obtain a solid, and then subjected to an extraction process three times utilizing dichloromethane and water to thereby obtain an organic layer. The obtained organic layer was dried utilizing anhydrous magnesium sulfate and concentrated to thereby obtain Intermediate Compound 10-F (yield: 95%).

Synthesis of Compound 10

Intermediate Compound 10-F (1.0 eq), dichloro(1,5-cyclooctadiene)platinum(II) (1.1 eq), and sodium acetate (3.0 eq) were dissolved in anhydrous 1,4-dioxane, and then stirred at 120° C. under a nitrogen condition for 4 days. The reaction mixture was cooled to room temperature, and then subjected to an extraction process three times utilizing dichloromethane and water to thereby obtain an organic layer. The obtained organic layer was dried utilizing anhydrous magnesium sulfate and concentrated, and column chromatography (MC:50 vol % hexane) was utilized to obtain Compound 10 (yield: 27%).

Synthesis Example 11: Synthesis of Compound 11

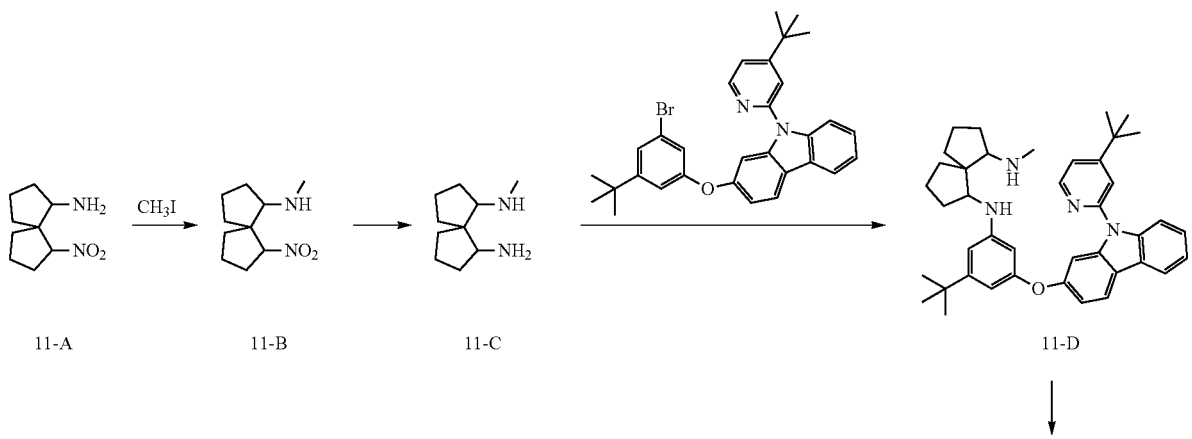

11-A     11-B     11-C                               11-D

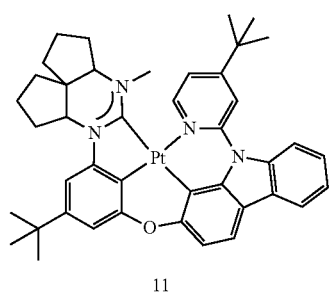
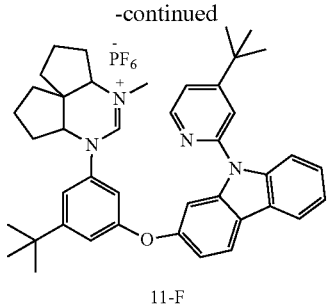
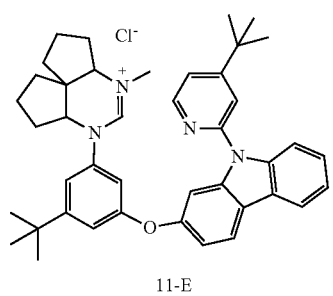

11　　　　　　　　　　11-F　　　　　　　　　　11-E

Synthesis of Intermediate Compound 11-B

11-A (1.0 eq), iodomethane (3.0 eq), Pd(OAc)$_2$ (5 mol %), tri-tert-butylphosphine (10 mol %), and potassium carbonate (2.0 eq) were dissolved in toluene (0.1 M), and then stirred at 110° C. for 12 hours. The reaction mixture was cooled to room temperature, and then subjected to an extraction process utilizing dichloromethane and water to thereby obtain an organic layer. The obtained organic layer was dried utilizing anhydrous magnesium sulfate and concentrated, and column chromatography was utilized to obtain Intermediate Compound 11-B (yield: 87%).

Synthesis of Intermediate Compound 11-C

Intermediate Compound 11-B (1.0 eq), Sn (3.0 eq), and HCl (5.5 eq) were dissolved in ethanol, and then stirred at 80° C. for 12 hours. The reaction mixture was cooled to room temperature, and then neutralized utilizing an NaOH solution. Then, an extraction process was performed thereon utilizing dichloromethane and water to obtain an organic layer, followed by filtration through celite/silica gel. Filtrate was dried utilizing anhydrous magnesium sulfate and concentrated, and column chromatography was utilized to obtain Intermediate Compound 11-C (yield: 92%).

Synthesis of Intermediate Compound 11-D

Intermediate Compound 11-C (1.2 eq), 2-(3-bromo-5-(tert-butyl)phenoxy)-9-(4-(tert-butyl)pyridin-2-yl)-9H-carbazole (1.0 eq), Pd$_2$(dba)$_3$ (5 mol %), Sphos (7 mol %), and sodium tert-butoxide (2.0 eq) were dissolved in toluene (0.1 M), and then stirred at 110° C. for 4 hours. The reaction mixture was cooled to room temperature, and then subjected to an extraction process three times utilizing dichloromethane and water to thereby obtain an organic layer. The obtained organic layer was dried utilizing anhydrous magnesium sulfate and concentrated, and column chromatography was utilized to obtain Intermediate Compound 11-D (yield: 72%).

Synthesis of Intermediate Compound 11-E

Intermediate Compound 11-D (1.0 eq) was dissolved in triethyl orthoformate (30 eq) at 80° C., and then 37% HCl (1.5 eq) was added thereto and stirred at 80° C. for 12 hours. The reaction mixture was cooled to room temperature, and triethyl orhoformate was concentrated, followed by an extraction process three times utilizing dichloromethane and water to thereby obtain an organic layer. The obtained organic layer was dried utilizing anhydrous magnesium sulfate and concentrated, and column chromatography was utilized to obtain Intermediate Compound 11-E (yield: 88%).

Synthesis of Intermediate Compound 11-F

Intermediate Compound 11-E (1.0 eq) and ammonium hexafluorophosphate (3.0 eq) were dissolved in methanol (0.5 M), and then distilled water was added thereto and stirred at room temperature for 3 hours to 12 hours. The reaction mixture was washed with distilled water and filtered to obtain a solid, and then subjected to an extraction process three times utilizing dichloromethane and water to thereby obtain an organic layer. The obtained organic layer was dried utilizing anhydrous magnesium sulfate and concentrated to thereby obtain Intermediate Compound 11-F (yield: 93%).

Synthesis of Compound 11

Intermediate Compound 11-F (1.0 eq), dichloro(1,5-cyclooctadiene)platinum(II) (1.1 eq), and sodium acetate (3.0 eq) were dissolved in anhydrous 1,4-dioxane, and then stirred at 120° C. under a nitrogen condition for 4 days. The reaction mixture was cooled to room temperature, and then subjected to an extraction process three times utilizing dichloromethane and water to thereby obtain an organic layer. The obtained organic layer was dried utilizing anhydrous magnesium sulfate and concentrated, and column chromatography was utilized to obtain Compound 11 (yield: 24%).

Synthesis Example 12: Synthesis of Compound 12

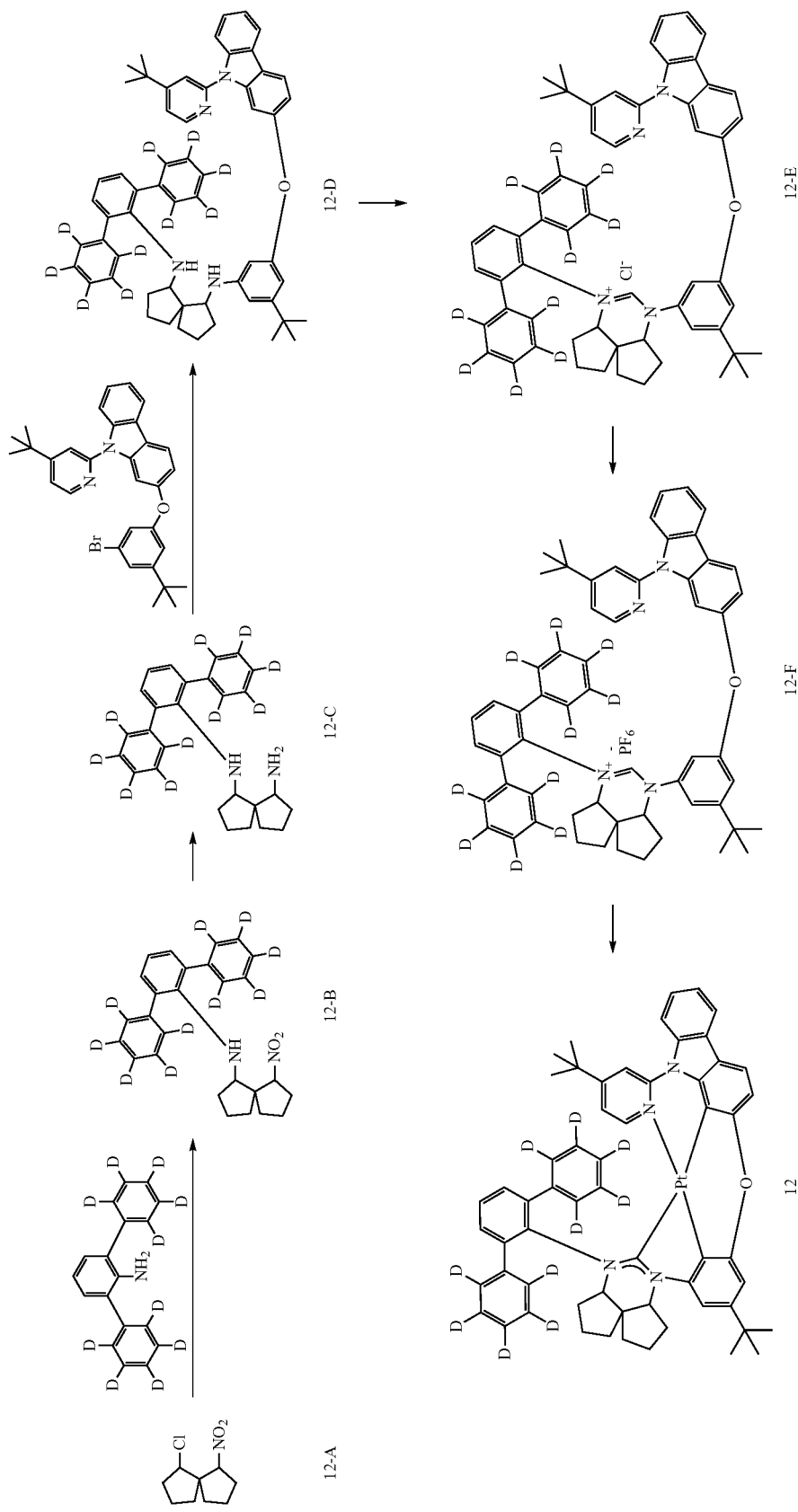

Synthesis of Intermediate Compound 12-B

12-A (1.0 eq), 2,6-diphenyl-d$^{10}$-aniline (1.2 eq), Pd(OAc)$_2$ (5 mol %), tri-tert-butylphosphine (10 mol %), and potassium carbonate (2.0 eq) were dissolved in toluene (0.1 M), and then stirred at 110° C. for 12 hours. The reaction mixture was cooled to room temperature, and then subjected to an extraction process utilizing dichloromethane and water to thereby obtain an organic layer. The obtained organic layer was dried utilizing anhydrous magnesium sulfate and concentrated, and column chromatography was utilized to obtain Intermediate Compound 12-B (yield: 70%).

Synthesis of Intermediate Compound 12-C

Intermediate Compound 12-B (1.0 eq), Sn (3.0 eq), and HCl (5.5 eq) were dissolved in ethanol, and then stirred at 80° C. for 12 hours. The reaction mixture was cooled to room temperature, and then neutralized utilizing an NaOH solution. Then, an extraction process was performed thereon utilizing dichloromethane and water to obtain an organic layer, followed by filtration through celite/silica gel. Filtrate was dried utilizing anhydrous magnesium sulfate and concentrated, and column chromatography was utilized to obtain Intermediate Compound 12-C (yield: 88%).

Synthesis of Intermediate Compound 12-D

Intermediate Compound 12-C (1.2 eq), 2-(3-bromo-5-(tert-butyl)phenoxy)-9-(4-(tert-butyl)pyridin-2-yl)-9H-carbazole (1.0 eq), Pd$_2$(dba)$_3$ (5 mol %), Sphos (7 mol %), and sodium tert-butoxide (2.0 eq) were dissolved in toluene (0.1 M), and then stirred at 110° C. for 3 hours. The reaction mixture was cooled to room temperature, and then subjected to an extraction process three times utilizing dichloromethane and water to thereby obtain an organic layer. The obtained organic layer was dried utilizing anhydrous magnesium sulfate and concentrated, and column chromatography was utilized to obtain Intermediate Compound 12-D (yield: 73%).

Synthesis of Intermediate Compound 12-E

Intermediate Compound 12-D (1.0 eq) was dissolved in triethyl orthoformate (30 eq) at 80° C., and then 37% HCl (1.5 eq) was added thereto and stirred at 80° C. for 12 hours. The reaction mixture was cooled to room temperature, and then a reaction solvent was concentrated, followed by an extraction process utilizing dichloromethane and water to thereby obtain an organic layer. The obtained organic layer was dried utilizing anhydrous magnesium sulfate and concentrated, and column chromatography was utilized to obtain Intermediate Compound 12-E (yield: 87%).

Synthesis of Intermediate Compound 12-F

Intermediate Compound 12-E (1.0 eq) and ammonium hexafluorophosphate (3.0 eq) were dissolved in methanol (0.5 M), and then distilled water was added thereto and stirred at room temperature for 12 hours. The reaction mixture was washed with distilled water and filtered to obtain a solid, and then subjected to an extraction process utilizing dichloromethane and water to thereby obtain an organic layer. The obtained organic layer was dried utilizing anhydrous magnesium sulfate and concentrated to thereby obtain Intermediate Compound 12-F (yield: 94%).

Synthesis of Compound 12

Intermediate Compound 12-F (1.0 eq), dichloro(1,5-cyclooctadiene)platinum(II) (1.1 eq), and sodium acetate (3.0 eq) were dissolved in anhydrous 1,4-dioxane, and then stirred at 120° C. under a nitrogen condition for 4 days. The reaction mixture was cooled to room temperature, and then subjected to an extraction process three times utilizing dichloromethane and water to thereby obtain an organic layer. The obtained organic layer was dried utilizing anhydrous magnesium sulfate and concentrated, and column chromatography was utilized to obtain Compound 12.

Evaluation Example 1

With respect to each compound utilized in Synthesis Examples 1 to 12 and the following Comparative Example 1, $^3$MLCT (%), a simulated maximum emission wavelength ($\lambda_{max}^{sim}$), an actual maximum emission wavelength ($\lambda_{max}^{exp}$), and $^3$MC energy were measured utilizing quantum simulation, and results thereof are shown in Table 1.

In more detail, characteristics of Compounds 1 to 12 and Compound A as a comparative compound were evaluated, and the highest occupied molecular orbital (HOMO) energy and LUMO energy were measured by differential pulse voltammetry. Values of energy levels of $^3$MC states were evaluated utilizing B3LYP functional. Values of $^3$MLCT (%) were measured by structural optimization at the level of B3LYP/6-31G(d,p) utilizing a density functional theory (DFT) calculation method of a Gaussian program.

TABLE 1

|  | Compound | HOMO (eV) | LUMO (eV) | $\lambda_{max}^{sim}$ (nm) | $\lambda_{max}^{exp}$ (nm) | $^3$MC (Kcal/mol) | $^3$MLCT (%) |
| --- | --- | --- | --- | --- | --- | --- | --- |
| Example 1 | 1 | −4.87 | −1.55 | 469.36 | 459 | 0.56 | 10.40 |
| Example 2 | 2 | −4.87 | −1.60 | 480.35 | 467 | 0.54 | 11.50 |
| Example 3 | 3 | −4.83 | −1.48 | 463.24 | 460 | 0.64 | 13.92 |
| Example 4 | 4 | −4.82 | −1.48 | 511.94 | 479 | 0.41 | 15.95 |
| Example 5 | 5 | −4.82 | −1.46 | 462.68 | 453 | 0.41 | 13.92 |
| Example 6 | 6 | −4.84 | −1.48 | 483.80 | 465 | 0.31 | 11.87 |
| Example 7 | 7 | −5.05 | −1.90 | 505.91 | 480 | 0.41 | 12.64 |
| Example 8 | 8 | −5.07 | −1.81 | 479.06 | 462 | 0.28 | 11.77 |
| Example 9 | 9 | −4.83 | −1.46 | 459.62 | 453 | 0.43 | 12.64 |
| Example 10 | 10 | −4.84 | −1.45 | 455.54 | 454 | 0.42 | 13.70 |

TABLE 1-continued

| | Compound | HOMO (eV) | LUMO (eV) | $\lambda_{max}^{sim}$ (nm) | $\lambda_{max}^{exp}$ (nm) | $^3$MC (Kcal/mol) | $^3$MLCT (%) |
|---|---|---|---|---|---|---|---|
| Example 11 | 11 | −4.82 | −1.46 | 463.74 | 453 | 0.26 | 10.11 |
| Example 12 | 12 | −4.83 | −1.47 | 474.44 | 463 | 0.27 | 10.56 |
| Comparative Example 1 | A | −4.87 | −1.54 | 471 | 460 | 0.25 | 9.83 |

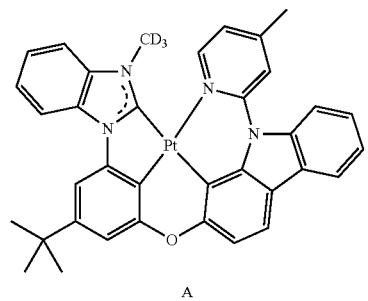

A

From table 1, the values of $^3$MC of Compounds 1 to 12 were remarkably greater than the value of $^3$MC of Compound A. Therefore, in each of the cases of Compounds 1 to 12, a transition probability from a $^3$MCLT state to a $^3$MC state, which is a non-emission state, decreases such that stability in an excited state may be excellent, and efficiency and lifespan of an organic light-emitting device including the organometallic compound may increase.

EXAMPLE

Example 1

As a substrate and an anode, a glass substrate with 15 Ω/cm² (1,200 Å) ITO thereon, which was manufactured by Corning Inc., was cut to a size of 50 mm×50 mm×0.7 mm, sonicated by utilizing isopropyl alcohol and pure water each for 5 minutes, and then cleaned by irradiation of ultraviolet rays and exposure of ozone thereto for 30 minutes. Then, the glass substrate was loaded onto a vacuum deposition apparatus.

2-TNATA was vaccum-deposited on the ITO anode formed on the glass substrate to form a hole injection layer having a thickness of 600 Å, and NPB was vacuum-deposited on the hole injection layer to form a hole transport layer having a thickness of 300 Å.

bis(4-(9H-carbazol-9-yl)phenyl)diphenylsilane (BCPDS) and (4-(1-(4-(diphenylamino)phenyl)cyclohexyl)phenyl)diphenyl-phosphine oxide (POPCPA) (here, a weight ratio of BCPDS to POPCPA was 1:1) as co-hosts and Compound 1 as a dopant were co-deposited at a weight ratio of 90:10 on the hole transport layer to form an emission layer having a thickness of 300 Å.

Diphenyl(4-(triphenylsilyl)phenyl)-phosphine oxide (TSPO1) was vaccum-deposited on the emission layer to form a hole blocking layer having a thickness of 50 Å, Alq₃ was vaccum-deposited on the hole blocking layer to form an electron transport layer having a thickness of 300 Å, LiF was vaccum-deposited on the electron transport layer to form an electron injection layer having a thickness of 10 Å, and then Al was vacuum-deposited on the electron injection layer to form a cathode having a thickness of 3,000 Å, thereby completing the manufacture of an organic light-emitting device.

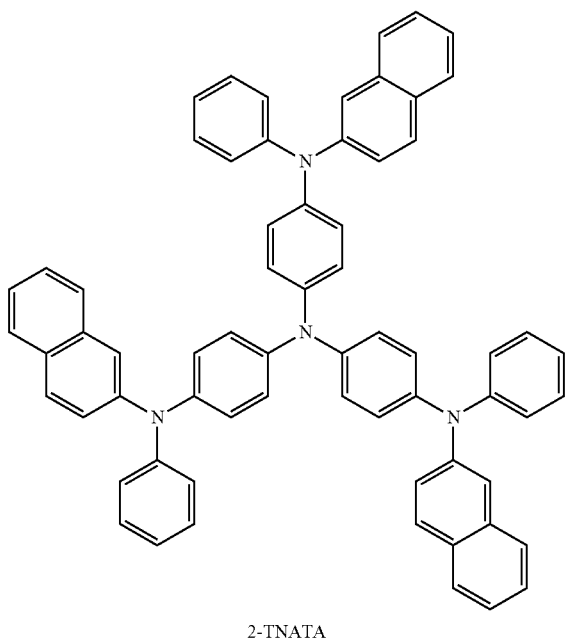

2-TNATA

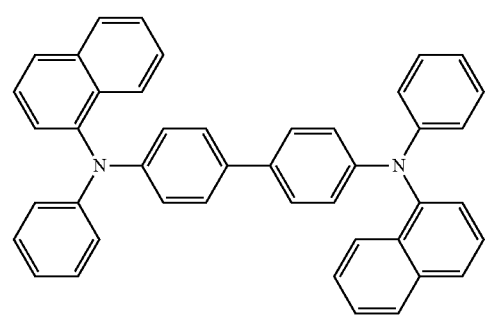

NPB

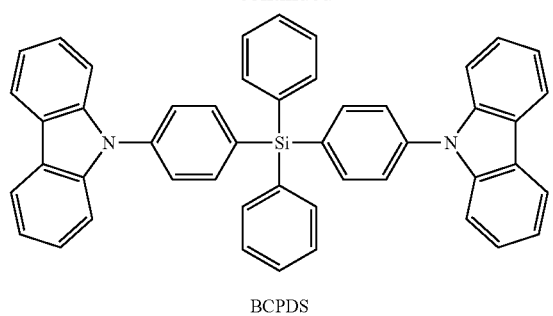

BCPDS

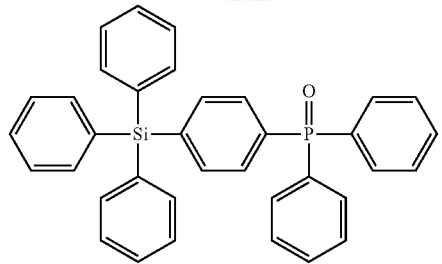

TSPO1

POPCPA

Examples 2 to 12 and Comparative Example 1

Organic light-emitting devices were each manufactured in the same manner as in Example 1, except that in forming an emission layer, for use as a dopant, corresponding compounds shown in Table 1 were utilized instead of Compound 1.

Evaluation Example 2

With respect to each of the organic light-emitting devices manufactured in Examples 1 to 12 and Comparative Example 1, driving voltage, current density, luminance, luminescence efficiency, emission color, and a maximum emission wavelength were measured utilizing Kethley SMU 236 and a luminance meter PR650, and results thereof are shown in Table 2.

TABLE 2

| | Dopant in emission layer | Driving voltage (V) | Current density (mA/cm$^2$) | Luminance (cd/m$^2$) | Luminance Efficiency (cd/A) | Emission color | Maximum Emission wavelength (nm) |
|---|---|---|---|---|---|---|---|
| Example 1 | 1 | 5.31 | 50 | 4100 | 8.21 | Blue | 459 |
| Example 2 | 2 | 5.37 | 49 | 3950 | 7.92 | Blue | 467 |
| Example 3 | 3 | 5.20 | 50 | 4260 | 8.40 | Blue | 460 |
| Example 4 | 4 | 5.29 | 50 | 4160 | 8.29 | Blue | 479 |
| Example 5 | 5 | 5.35 | 50 | 4110 | 8.22 | Blue | 453 |
| Example 6 | 6 | 5.11 | 48 | 4220 | 8.40 | Blue | 465 |
| Example 7 | 7 | 5.28 | 50 | 3950 | 7.92 | Blue | 480 |
| Example 8 | 8 | 5.28 | 50 | 3990 | 7.93 | Blue | 462 |
| Example 9 | 9 | 5.30 | 52 | 4137 | 8.28 | Blue | 453 |
| Example 10 | 10 | 5.33 | 50 | 4200 | 8.40 | Blue | 454 |
| Example 11 | 11 | 5.36 | 48 | 3840 | 7.63 | Blue | 453 |
| Example 12 | 12 | 5.24 | 49 | 3720 | 7.41 | Blue | 463 |
| Comparative Example 1 | A | 5.32 | 50 | 3810 | 7.51 | Blue | 460 |

TABLE 2-continued

| Dopant in emission layer | Driving voltage (V) | Current density (mA/cm$^2$) | Luminance (cd/m$^2$) | Luminance Efficiency (cd/A) | Emission color | Maximum Emission wavelength (nm) |
|---|---|---|---|---|---|---|

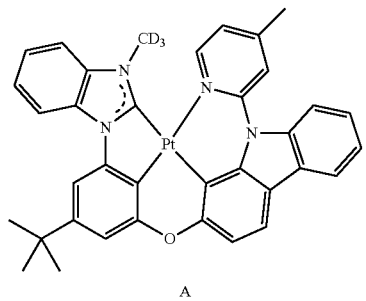

A

Referring to Table 2, it was confirmed that each of the organic light-emitting devices of Examples 1 to 12 has a lower driving voltage, a higher level of luminance, a higher luminescence efficiency, and/or a longer lifespan, compared to the organic light-emitting device of Comparative Example 1.

In view of the forgoing, ann organic light-emitting device including the above described organometallic compound may have high luminance, high efficiency, and long lifespan.

The use of "may" when describing embodiments of the present invention refers to "one or more embodiments of the present invention." It will be understood that when an element or layer is referred to as being "on", "connected to", "coupled to", or "adjacent to" another element or layer, it can be directly on, connected to, coupled to, or adjacent to the other element or layer, or one or more intervening elements or layers may be present. In contrast, when an element or layer is referred to as being "directly on," "directly connected to", "directly coupled to", or "immediately adjacent to" another element or layer, there are no intervening elements or layers present.

As used herein, the term "substantially," "about," and similar terms are used as terms of approximation and not as terms of degree, and are intended to account for the inherent deviations in measured or calculated values that would be recognized by those of ordinary skill in the art. Moreover, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a), and 35 U.S.C. § 132(a).

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and equivalents thereof.

What is claimed is:

1. An organic light-emitting device comprising:
   a first electrode;
   a second electrode;
   an organic layer between the first electrode and the second electrode, the organic layer comprising an emission layer; and
   at least one organometallic compound represented by Formula 1:

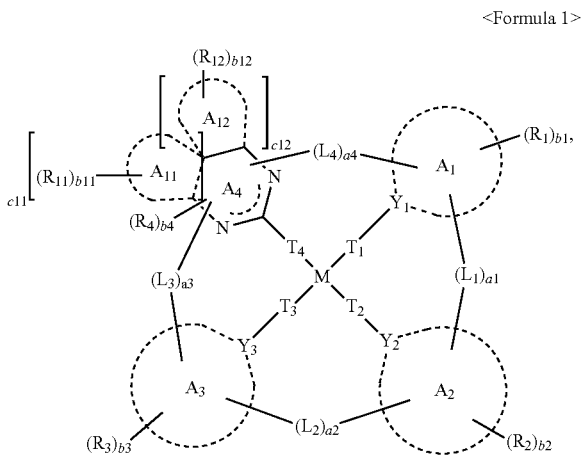

<Formula 1> wherein, in Formula 1,

M is selected from platinum (Pt), palladium (Pd), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), and thulium (Tm), $Y_1$ to $Y_3$ are each independently N or C, $T_1$ to $T_4$ are each independently a chemical bond, O, S, B(R'), N(R'), P(R'), C(R')(R''), Si(R')(R''), Ge(R')(R''), C(=O), B(R')(R''), N(R')(R''), or P(R')(R''), wherein when $T_1$ is the chemical bond, $Y_1$ and M are directly bonded, when $T_2$ is the chemical bond, $Y_2$ and M are directly bonded, when $T_3$ is the chemical bond, $Y_3$ and M are directly bonded, and when $T_4$ is the chemical bond, $A_4$ and M are directly bonded, from among a bond between M and $Y_1$ or $T_1$, a bond between M and $Y_2$ or $T_2$, a bond between M and $Y_3$ or $T_3$, and a bond between M and $A_4$ or $T_4$, two bonds are coordinate bonds, and an other two bonds are covalent bonds, $A_1$ to $A_3$ and $A_{11}$ to $A_{12}$ are each independently selected from a $C_5$-$C_{60}$ carbocyclic group and a $C_1$-$C_{60}$ heterocyclic group, c11 is 0 or 1, and when c11 is 0, $A_{11}$ is absent, c12 is 0 or 1, and when c12 is 0, $A_{12}$ is absent, $L_1$ to $L_4$ are each independently selected from a single bond, a double bond, *—N($R_5$)—*', *—B($R_5$)—*', *—P($R_5$)—*', *—C($R_5$)($R_6$)—*', *—Si($R_5$)($R_6$)—*', *—Ge($R_5$)($R_6$)—*', *—S—*', *—Se—*', *—O—*', *—C(=O)—*', *—S(=O)—*', *—S(=O)$_2$—*', *—C($R_5$)=*', *=C($R_5$)—*', *—C($R_5$)=C($R_6$)—*', *—C(=S)—*', and *—C≡C—*', a1 to a4 are each independently an integer from 0 to 3, wherein when a1 is 0, $A_1$ and $A_2$ are not linked to each other, when a2 is 0, $A_2$ and $A_3$ are not linked to each other, when a3 is 0, $A_3$ and $A_4$ are not linked to each other, and when a4 is 0, $A_4$ and $A_1$ are not linked to each other, R', R'', $R_1$ to $R_6$, $R_{11}$, and $R_{12}$ are each independently selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), —P(=S)($Q_1$)($Q_2$), =O, =S, =N($Q_1$), and =C($Q_1$)($Q_2$), b1 to b3, b11, and b12 are each independently an integer from 0 to 20, b4 is an integer from 0 to 7, from among R', R'', $R_1$(s) in a number of b1, $R_2$(s) in a number of b2, $R_3$(s) in a number of b3, $R_4$(s) in a number of b4, $R_5$, $R_6$, $R_{11}$(s) in a number of b11, and $R_{12}$(s) in a number of b12, neighboring groups are each optionally linked to each other to form a substituted or unsubstituted $C_5$-$C_{60}$ carbocyclic group or a substituted or unsubstituted $C_1$-$C_{60}$ heterocyclic group, and *' each indicate a binding site to a neighboring atom, and at least one substituent of the substituted $C_5$-$C_{60}$ carbocyclic group, the substituted $C_1$-$C_{60}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group is selected from:

deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), and —P(=O)($Q_{21}$)($Q_{22}$); and —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), and wherein $Q_1$ to $Q_3$, $Q_{11}$ to $Q_{13}$, $Q_{21}$ to $Q_{23}$, and $Q_{31}$ to $Q_{33}$ are each independently selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a $C_1$-$C_{60}$ alkyl group substituted with at least one selected from deuterium, —F, and a cyano group, a $C_6$-$C_{60}$ aryl group substituted with at least one selected from deuterium, —F, and a cyano group, a biphenyl group, and a terphenyl group.

2. The organic light-emitting device of claim 1, wherein an energy level ($E_{3MC}$) of a triplet metal-centered ($^3$MC) state of the at least one organometallic compound is about 0.26 kcal/mol or more.

3. The organic light-emitting device of claim 1, wherein the emission layer comprises the at least one organometallic compound.

4. The organic light-emitting device of claim 3, wherein the emission layer further comprises a host, and an amount of the at least one organometallic compound is about 0.1 parts by weight to about 50 parts by weight based on 100 parts by weight of the emission layer.

5. The organic light-emitting device of claim 3, wherein the emission layer is to emit blue light having a maximum emission wavelength of about 450 nm to about 510 nm.

6. The organic light-emitting device of claim 1, wherein the first electrode is an anode,
the second electrode is a cathode,
the organic layer comprises the at least one organometallic compound,
the organic layer further comprises a hole transport region between the first electrode and the emission layer and an electron transport region between the emission layer and the second electrode,
the hole transport region comprises at least one selected from a hole injection layer, a hole transport layer, a buffer layer, an emission auxiliary layer, and an electron blocking layer, and
the electron transport region comprises at least one selected from a hole blocking layer, an electron transport layer, and an electron injection layer.

7. The organic light-emitting device of claim 6, wherein the hole transport region comprises a p-dopant having a lowest unoccupied molecular orbital (LUMO) energy level of less than about −3.5 eV.

8. An organometallic compound represented by Formula 1:

<Formula 1>

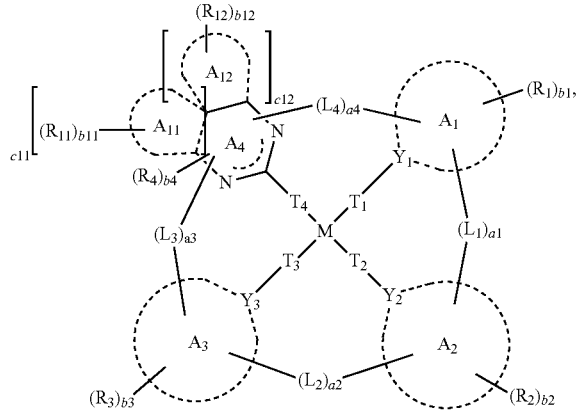

wherein, in Formula 1,

M is selected from platinum (Pt), palladium (Pd), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), and thulium (Tm), $Y_1$ to $Y_3$ are each independently N or C, $T_1$ to $T_4$ are each independently a chemical bond, O, S, B(R'), N(R'), P(R'), C(R')(R''), Si(R')(R''), Ge(R')(R''), C(=O), B(R')(R''), N(R')(R''), or P(R')(R''), wherein when $T_1$ is the chemical bond, $Y_1$ and M are directly bonded, when $T_2$ is the chemical bond, $Y_2$ and M are directly bonded, when $T_3$ is the chemical bond, $Y_3$ and M are directly bonded, and when $T_4$ is the chemical bond, $A_4$ and M are directly bonded, from among a bond between M and $Y_1$ or $T_1$, a bond between M and $Y_2$ or $T_2$, a bond between M and $Y_3$ or $T_3$, and a bond between M and $A_4$ or $T_4$, two bonds are coordinate bonds, and an other two bonds are covalent bonds, $A_1$ to $A_3$ and $A_{11}$ to $A_{12}$ are each independently selected from a $C_5$-$C_{60}$ carbocyclic group and a $C_1$-$C_{60}$ heterocyclic group, c11 is 0 or 1, and when c11 is 0, $A_{11}$ is absent,
c12 is 0 or 1, and when c12 is 0, $A_{12}$ is absent,
$L_1$ to $L_4$ are each independently selected from a single bond, a double bond, *—N($R_5$)—*', *—B($R_5$)—', *—P($R_5$)—', *—C($R_5$)($R_6$)—', *—Si($R_5$)($R_6$)—', *—Ge($R_5$)($R_6$)—', *—S—*', *—Se—*', *—O—', *—C(=O)—', *—S(=O)—', *—S(=O)$_2$—', *—C($R_5$)=', *=C($R_5$)—', *—C($R_5$)=C($R_6$)—*', *—C(=S)—', and *—C≡C—', a1 to a4 are each independently an integer from 0 to 3, wherein when a1 is 0, $A_1$ and $A_2$ are not linked to each other, when a2 is 0, $A_2$ and $A_3$ are not linked to each other, when a3 is 0, $A_3$ and $A_4$ are not linked to each other, and when a4 is 0, $A_4$ and $A_1$ are not linked to each other, R', R'', $R_1$ to $R_6$, $R_{11}$, and $R_{12}$ are each independently selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), —P(=S)($Q_1$)($Q_2$), =O, =S, =N($Q_1$), and =C($Q_1$)($Q_2$), b1 to b3, b11, and b12 are each independently an integer from 0 to 20, b4 is an integer from 0 to 7, from among R', R", $R_1$(s) in a number of b1, $R_2$(s) in a number of b2, $R_3$(s) in a number of b3, $R_4$(s) in a number of b4, $R_5$, $R_6$, $R_{11}$(s) in a number of b11, and $R_{12}$(s) in a number of b12, neighboring groups are each optionally linked to each other to form a substituted or unsubstituted $C_5$-$C_{60}$ carbocyclic group or a substituted or unsubstituted $C_1$-$C_{60}$ heterocyclic group, and *' each indicate a binding site to a neighboring atom, and at least one substituent of the substituted $C_5$-$C_{60}$ carbocyclic group, the substituted $C_1$-$C_{60}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group is selected from:

deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), and —P(=O)($Q_{21}$)($Q_{22}$); and —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), and wherein $Q_1$ to $Q_3$, $Q_{11}$ to $Q_{13}$, $Q_{21}$ to $Q_{23}$, and $Q_{31}$ to $Q_{33}$ are each independently selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a $C_1$-$C_{60}$ alkyl group substituted with at least one selected from deuterium, —F, and a cyano group, a $C_6$-$C_{60}$ aryl group substituted with at least one selected from deuterium, —F, and a cyano group, a biphenyl group, and a terphenyl group.

9. The organometallic compound of claim 8, wherein M is selected from Pt, Pd, Cu, Ag, Au, Rh, Ir, Ru, and Os.

10. The organometallic compound of claim 8, wherein $T_1$ to $T_4$ are each a chemical bond, at least one of a bond between $Y_1$ and M and a bond between $Y_2$ and M is a coordinate bond, $Y_1$ is N, and $Y_2$ is C.

11. The organometallic compound of claim 8, wherein $A_1$ to $A_3$ and $A_{11}$ to $A_{12}$ are each independently selected from a benzene group, a naphthalene group, an anthracene group, a phenanthrene group, a triphenylene group, a pyrene group, a chrysene group, a cyclopentane group, a cyclopentadiene group, a cyclohexane group, a cyclohexene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an indenopyridine group, an indolopyridine group, a benzofuropyridine group, a benzothienopyridine group, a benzosilolopyridine group, an indenopyrimidine group, an indolopyrimidine group, a benzofuropyrimidine group, a benzothienopyrimidine group, a benzosilolopyrimidine group, a dihydropyridine group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a 2,3-dihydroimidazole group, a triazole group, a 1,2,4-triazole group, a tetrazole group, a 2,3-dihydrotriazole group, an azasilole group, a diazasilole group, a triazasilole group, an oxazole group, an isoxazole group, a thiazole group, an isothiazole group, an oxadiazole group, a thiadiazole group, a benzopyrazole group, a benzimidazole group, a 2,3-dihydrobenzimidazole group, an imidazopyridine group, a 2,3-dihydroimidazopyridine group, an imidazopyrimidine group, a 2,3-dihydroimidazopyrimidine group, an imidazopyrazine group, a 2,3-dihydroimidazopyrazine group, a benzoxazole group, a benzothiazole group, a benzoxadiazole group, a benzothiadiazole group, a 5,6,7,8-tetrahydroisoquinoline group, and a 5,6,7,8-tetrahydroquinoline group.

12. The organometallic compound of claim 8, wherein
i) $A_1$ is selected from a pyridine group, a pyrimidine group, a pyrazine group, a pyridazine group, and a triazine group,
ii) $A_2$ is selected from an indole group, a carbazole group, an indolopyridine group, and an indolopyrimidine group,
iii) $A_3$ is selected from a benzene group, a naphthalene group, an anthracene group, and a phenanthrene group, or
any combination of i), ii), and iii) is satisfied.

13. The organometallic compound of claim 8, wherein
ia) $A_1$ is a group represented by any one of Formulae 2A-1 to 2A-5,
iia) $A_2$ is a group represented by any one of Formulae 2B-1 to 2B-3,
iiia) $A_3$ is a group represented by Formula 2C-1, or
any combination of ia), iia), and iiia) is satisfied:

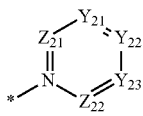
2A-1

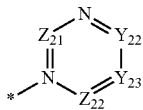
2A-2

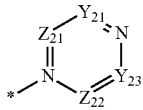
2A-3

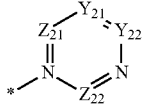
2A-4

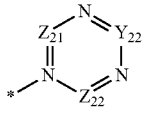
2A-5

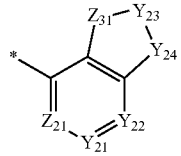
2B-1

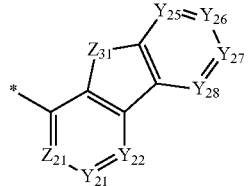
2B-2

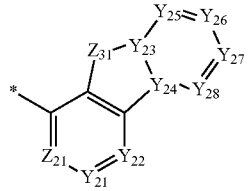
2B-3

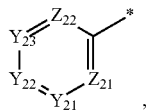
2C-1 and
wherein, in Formulae 2A-1 to 2A-5, Formulae 2B-1 to 2B-3, and Formula 2C-1,
$Y_{21}$ is N or $C(R_{11a})$, $Y_{22}$ is N or $C(R_{12a})$, $Y_{23}$ is N or $C(R_{13a})$, $Y_{24}$ is N or $C(R_{14a})$, $Y_{25}$ is N or $C(R_{15a})$, $Y_{26}$ is N or $C(R_{16a})$, $Y_{27}$ is N or $C(R_{17a})$, and $Y_{28}$ is N or $C(R_{18a})$,
$Z_{21}$ is *'—C, $C(R_{21a})$, or N, and $Z_{22}$ is *'—C, $C(R_{22a})$, or N,
$Z_{31}$ is *'—N or $N(R_{31a})$,
$R_{11a}$ to $R_{18a}$, $R_{21a}$ to $R_{22a}$, and $R_{31a}$ are each independently the same as described in connection with $R_1$ of Formula 1, and
\* indicates a binding site to neighboring $T_1$, $T_2$, or $T_3$, and
*' indicates a binding site to neighboring $L_1$, $L_2$, $L_3$, or $L_4$.

14. The organometallic compound of claim 13, wherein, in Formulae 2A-1 to 2A-5 and 2C, $Y_{22}$ is $C(R_{12a})$, and Rita is not hydrogen.

15. The organometallic compound of claim 8, wherein a sum of c11 and c12 is 1 or 2.

16. The organometallic compound of claim 8, wherein a1 to a3 are each 1, a4 is 0, $L_1$ and $L_3$ are each a single bond, and $L_2$ is *—O—*'.

17. The organometallic compound of claim 8, wherein R', R", $R_1$ to $R_6$, $R_{11}$, and $R_{12}$ are each independently selected from:
hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, and a $C_1$-$C_{20}$ alkoxy group;
a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, and a $C_1$-$C_{20}$ alkoxy group;

a cyclopentyl group, a cyclohexyl group, a phenyl group, a naphthyl group, a pyridinyl group, a pyrimidinyl group, a pyrazinyl group, a pyridazinyl group, a pyrrolyl group, an indolyl group, an isoindolyl group, an indazolyl group, a quinolinyl group, an isoquinolinyl group, a quinoxalinyl group, a quinazolinyl group, a cinnolinyl group, and a triazinyl group;

a cyclopentyl group, a cyclohexyl group, a phenyl group, a naphthyl group, a pyridinyl group, a pyrimidinyl group, a pyrazinyl group, a pyridazinyl group, an indolyl group, an isoindolyl group, an indazolyl group, a quinolinyl group, an isoquinolinyl group, a quinoxalinyl group, a quinazolinyl group, a cinnolinyl group, and a triazinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a phenyl group, a naphthyl group, a pyridinyl group, a pyrimidinyl group, a pyrazinyl group, a pyridazinyl group, an indolyl group, an isoindolyl group, an indazolyl group, a quinolinyl group, an isoquinolinyl group, a quinoxalinyl group, a quinazolinyl group, a cinnolinyl group, a triazinyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), a cyclopentyl group, a cyclohexyl group, a phenyl group, a naphthyl group, a pyridinyl group, a pyrimidinyl group, a pyrazinyl group, a pyridazinyl group, an indolyl group, an isoindolyl group, an indazolyl group, a quinolinyl group, an isoquinolinyl group, a quinoxalinyl group, a quinazolinyl group, a cinnolinyl group, and a triazinyl group, each substituted with at least one selected from a $C_1$-$C_{20}$ alkyl group, a $C_1$-$C_{20}$ alkoxy group, a cyclopentyl group, a cyclohexyl group, a phenyl group, a naphthyl group, a pyridinyl group, a pyrimidinyl group, a pyrazinyl group, a pyridazinyl group, an indolyl group, an isoindolyl group, an indazolyl group, a quinolinyl group, an isoquinolinyl group, a quinoxalinyl group, a quinazolinyl group, a cinnolinyl group, and a triazinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a phenyl group, a naphthyl group, a pyridinyl group, a pyrimidinyl group, a pyrazinyl group, a pyridazinyl group, an indolyl group, an isoindolyl group, an indazolyl group, a quinolinyl group, an isoquinolinyl group, a quinoxalinyl group, a quinazolinyl group, a cinnolinyl group, a triazinyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), and —Si($Q_1$)($Q_2$)($Q_3$), —N($Q_1$)($Q_2$), —B($Q_1$)($Q_2$), —C(=O)($Q_1$), —S(=O)$_2$($Q_1$), —P(=O)($Q_1$)($Q_2$), —P(=S)($Q_1$)($Q_2$), =O, =S, =N($Q_1$), and =C($Q_1$)($Q_2$), and wherein $Q_1$ to $Q_3$ and $Q_{31}$ to $Q_{33}$ are each independently selected from hydrogen, deuterium, —F, —Cl, —Br, —I, a cyano group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{20}$ aryl group, a $C_1$-$C_{20}$ heteroaryl group, a monovalent non-aromatic condensed polycyclic group, and a monovalent non-aromatic condensed heteropolycyclic group.

18. The organometallic compound of claim 8, wherein the organometallic compound represented by Formula 1 is represented by one selected from Formulae 1-1 to 1-10:

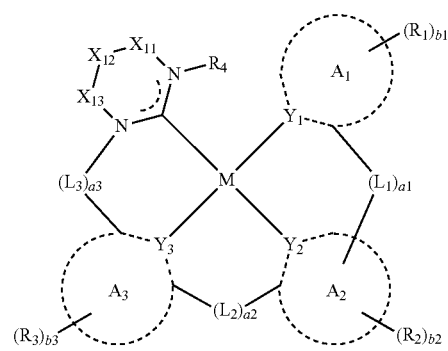

<Formula 1-1>

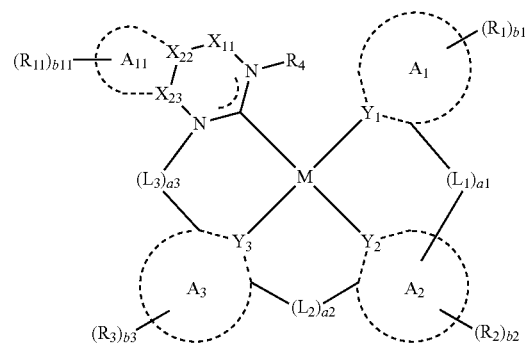

<Formula 1-2>

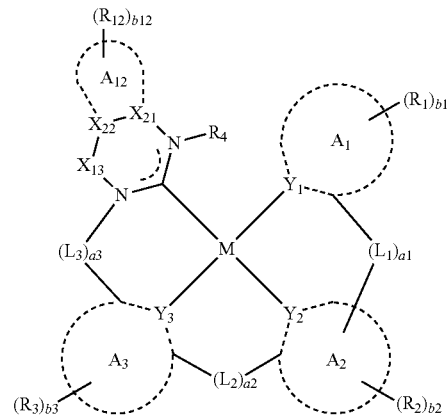

<Formula 1-3>

-continued

<Formula 1-4>
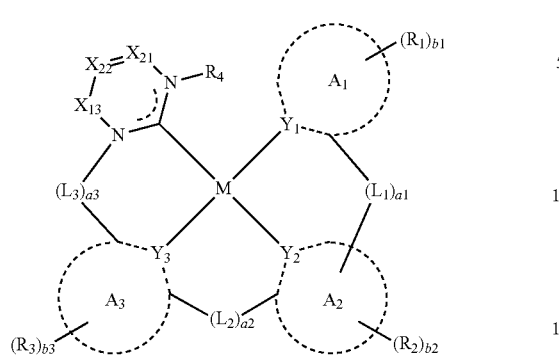

<Formula 1-5>
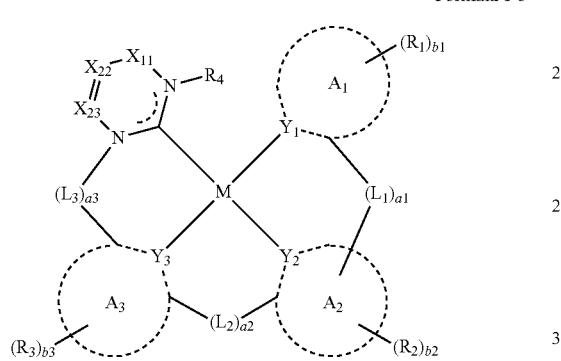

<Formula 1-6>
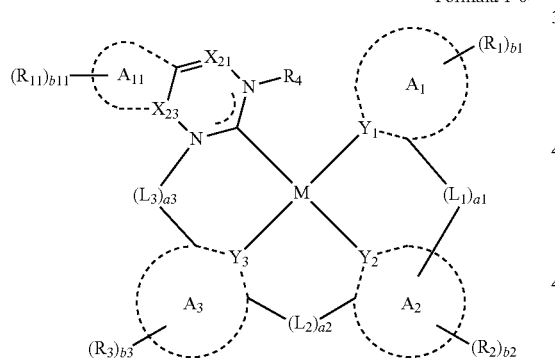

<Formula 1-7>
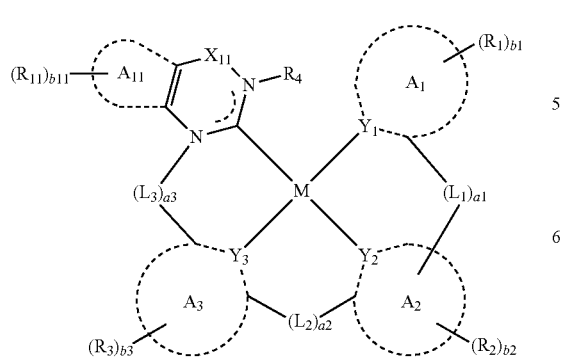

-continued

<Formula 1-8>
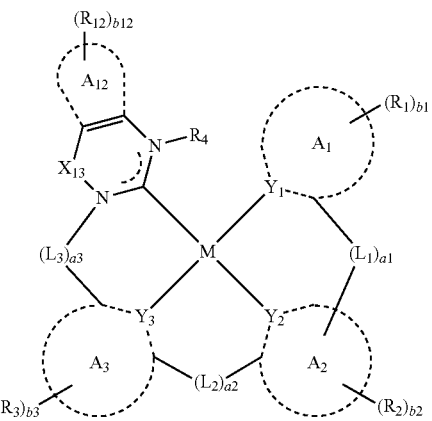

<Formula 1-9>
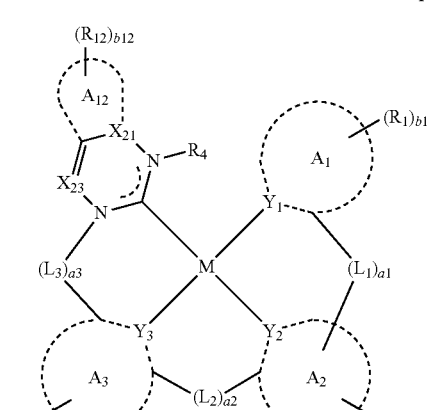

<Formula 1-10>
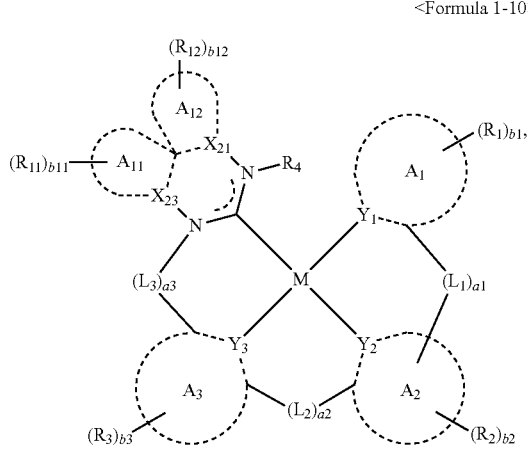

and wherein, in Formulae 1-1 to 1-10,

M, $A_1$ to $A_3$, $A_{11}$ to $A_{12}$, $Y_1$ to $Y_3$, $L_1$ to $L_3$, a1 to a3, $R_1$ to $R_4$, $R_{11}$, $R_{12}$, b1 to b3, b11, and b12 are each independently the same as respectively described in connection with Formula 1, $X_{11}$ to $X_{13}$ are each independently selected from O, S, $N(R_{21})$, $C(R_{21})(R_{22})$, $C(=O)$, $C(=S)$, $C(=NR_{21})$, and $C(=C(R_{21})(R_{22}))$, $X_{21}$ to $X_{23}$ are each independently N or $C(R_{21})$, and $R_{21}$ and $R_{22}$ are each independently the same as described in connection with $R_1$ of Formula 1.

19. The organometallic compound of claim 8, wherein the organometallic compound represented by Formula 1 is represented by Formula 1A:

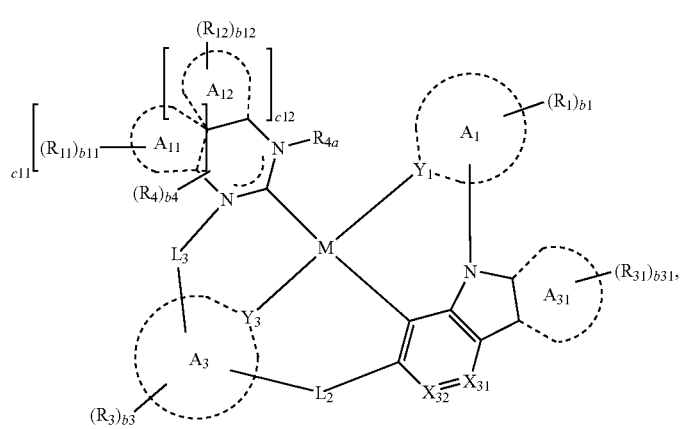

<Formula 1A> and wherein, in Formula 1A,

M, $A_1$, $A_3$, $A_{11}$ to $A_{12}$, $Y_1$, $Y_3$, $L_2$ to $L_3$, $R_1$, $R_3$, $R_4$, $R_{11}$, $R_{12}$, b1, b3, b4, b11, b12, c11, and c12 are each independently the same as described in connection with Formula 1, $X_{31}$ to $X_{32}$ are each independently N or $C(R_{32})$, $A_{31}$ is the same as described in connection with $A_1$ of Formula 1, b31 is the same as described in connection with b2 of Formula 1, and $R_{4a}$, $R_{31}$, and $R_{32}$ are each independently the same as described in connection with $R_1$ of Formula 1.

20. The organometallic compound of claim 8, wherein the organometallic compound represented by Formula 1 is selected from Compounds 1 to 12:

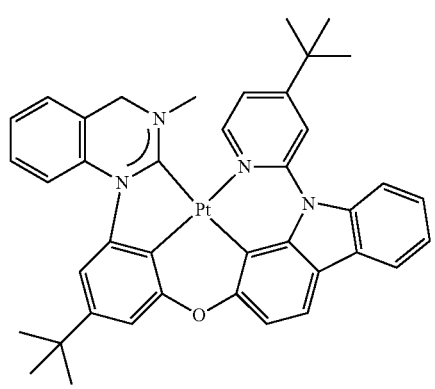

1

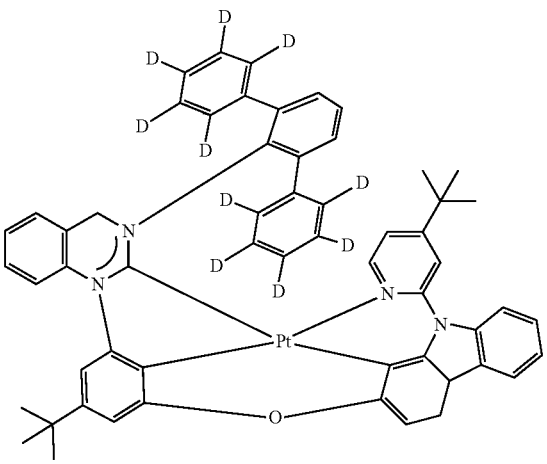

2

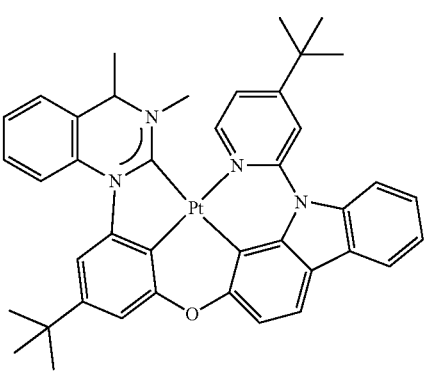

3

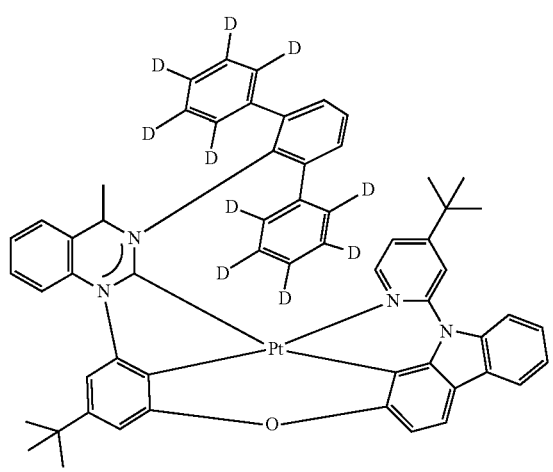
4
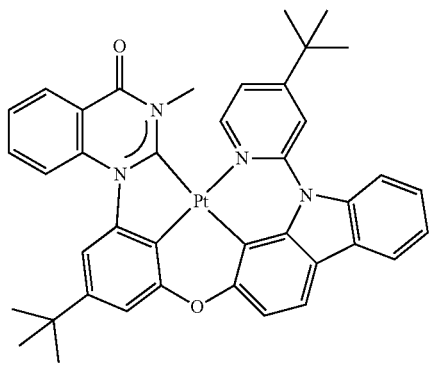
7
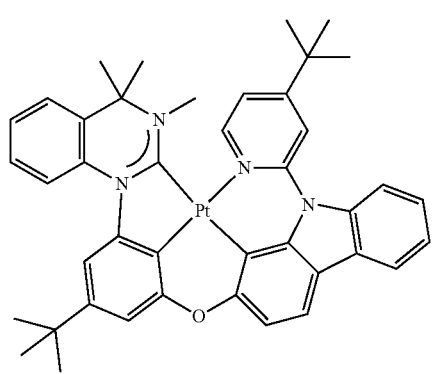
5
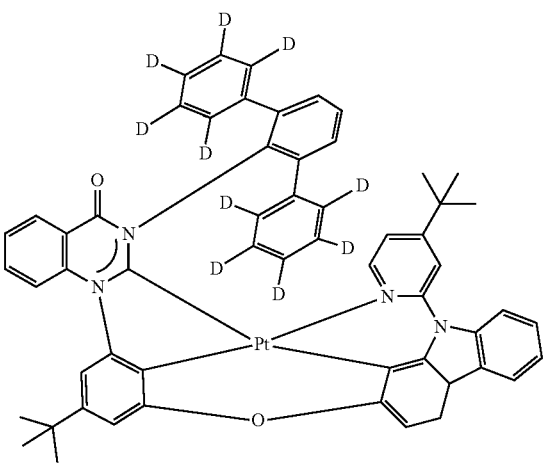
8
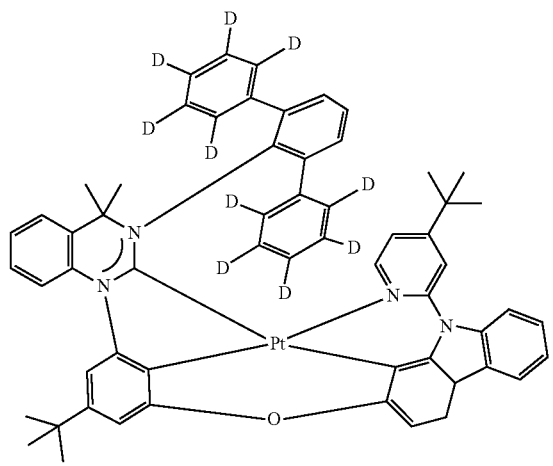
6
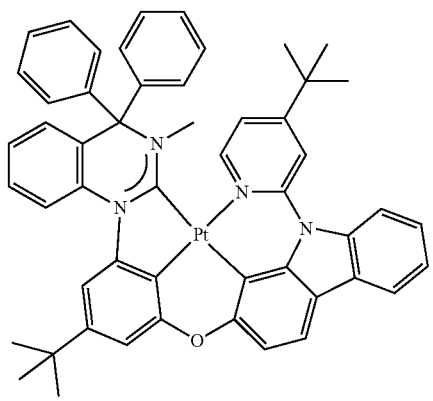
9

173
-continued
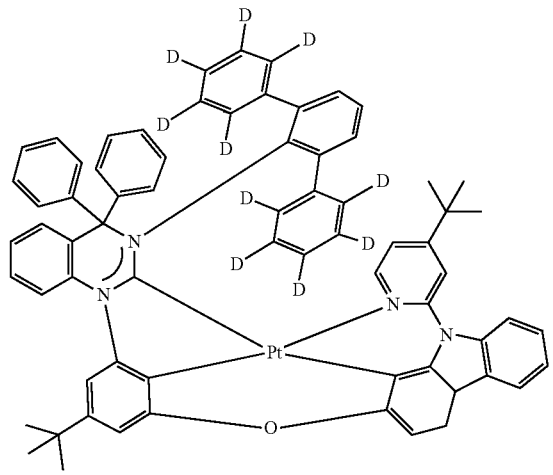
10
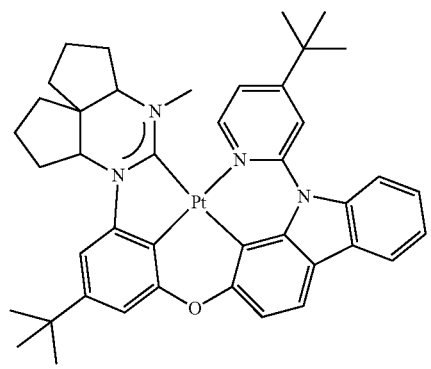
11
174
-continued
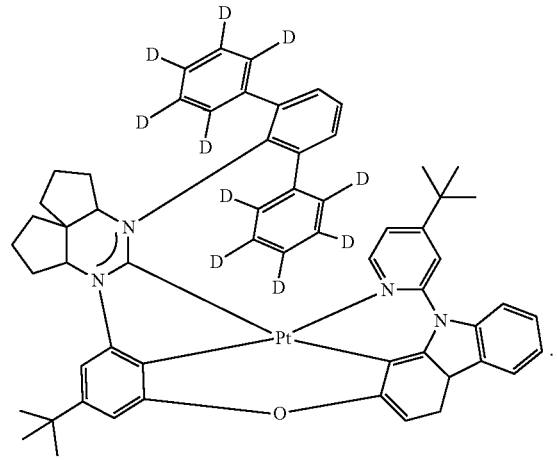
12
* * * * *